(12) United States Patent
Xie et al.

(10) Patent No.: US 11,101,348 B2
(45) Date of Patent: Aug. 24, 2021

(54) NANOSHEET FIELD EFFECT TRANSISTOR WITH SPACERS BETWEEN SHEETS

(71) Applicant: GLOBALFOUNDRIES U.S. Inc., Malta, NY (US)

(72) Inventors: Ruilong Xie, Schenectady, NY (US); Julien Frougier, Albany, NY (US); Nigel G. Cave, Saratoga Springs, NY (US); Steven R. Soss, Cornwall, NY (US); Daniel Chanemougame, Niskayuna, NY (US); Steven Bentley, Menands, NY (US); Rohit Galatage, Renesslaer, NY (US); Bum Ki Moon, Niskayuna, NY (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 0 days.

(21) Appl. No.: 16/044,544

(22) Filed: Jul. 25, 2018

(65) Prior Publication Data

US 2020/0035786 A1   Jan. 30, 2020

(51) Int. Cl.
*H01L 29/06* (2006.01)
*H01L 29/66* (2006.01)
(Continued)

(52) U.S. Cl.
CPC .... *H01L 29/0669* (2013.01); *H01L 21/02603* (2013.01); *H01L 21/76829* (2013.01);
(Continued)

(58) Field of Classification Search
CPC . H01L 29/0669–0676; H01L 29/66439; H01L 29/42392; H01L 29/78696;
(Continued)

(56) References Cited

U.S. PATENT DOCUMENTS 6,404,670 B2   6/2002   Shau
7,799,592 B2   9/2010   Lochtefeld
(Continued)

FOREIGN PATENT DOCUMENTS

CN   2040757 U   7/1989

OTHER PUBLICATIONS

TW Application No. 108122133, Notice of Allowance dated Apr. 23, 2020, pp. 1-3.

(Continued)

*Primary Examiner* — Matthew C Landau
*Assistant Examiner* — Eric K Ashbahian
(74) *Attorney, Agent, or Firm* — Gibb & Riley, LLC; Anthony J. Canale

(57) ABSTRACT

Methods form devices by creating openings in sacrificial gates between nanosheet stacks (alternating layers of a first material and channel structures), forming spacers in the openings, and removing the sacrificial gates to leave the spacers. The first material is then removed from between the channel structures. A first work function metal is formed around and between the channel structures. Next, first stacks (of the stacks) are protected with a mask to leave second stacks (of the stacks) exposed. Then, the first work function metal is removed from the second stacks while the first stacks are protected by the mask and the spacers. Subsequently, a second work function metal is formed around and between the channel structures of the second stacks. A gate material is then formed over the first work function metal and the second work function metal.

15 Claims, 40 Drawing Sheets

(51) Int. Cl.
*H01L 21/02* (2006.01)
*H01L 21/8234* (2006.01)
*H01L 29/08* (2006.01)
*H01L 21/768* (2006.01)
*H01L 27/088* (2006.01)
*B82Y 40/00* (2011.01)
*B82Y 30/00* (2011.01)

(52) U.S. Cl.
CPC .. *H01L 21/823468* (2013.01); *H01L 29/0649* (2013.01); *H01L 29/0847* (2013.01); *H01L 29/6656* (2013.01); *B82Y 30/00* (2013.01); *B82Y 40/00* (2013.01); *H01L 27/088* (2013.01)

(58) Field of Classification Search
CPC ............... H01L 29/0673; H01L 29/775; H01L 29/0649; H01L 21/823842; H01L 21/823878; H01L 21/76224; H01L 21/02603; H01L 29/66545; H01L 29/66553; H01L 21/823828; H01L 29/6656

See application file for complete search history.

(56) References Cited

U.S. PATENT DOCUMENTS

| | | | |
|---|---|---|---|
| 9,437,501 B1* | 9/2016 | Cheng | H01L 29/78654 |
| 9,437,502 B1* | 9/2016 | Cheng | H01L 21/823842 |
| 9,490,323 B2 | 11/2016 | Rodder et al. | |
| 9,608,059 B2 | 3/2017 | Cappellani et al. | |
| 9,653,537 B1 | 5/2017 | Jagannathan et al. | |
| 9,847,390 B1 | 12/2017 | Xie et al. | |
| 9,947,804 B1 | 4/2018 | Frougier et al. | |
| 2012/0313170 A1* | 12/2012 | Chang | H01L 29/66545 257/347 |
| 2015/0349708 A1 | 12/2015 | Moslehi | |
| 2016/0351700 A1* | 12/2016 | Chang | H01L 27/0922 |
| 2017/0294358 A1* | 10/2017 | Cheng | H01L 27/0924 |
| 2017/0330801 A1* | 11/2017 | Ragnarsson | H01L 21/0214 |
| 2018/0190544 A1 | 7/2018 | Bi et al. | |
| 2020/0006478 A1* | 1/2020 | Hsu | H01L 27/088 |

OTHER PUBLICATIONS

Taiwanese Application No. 108122133, Office Action and Search Report dated dated Jan. 20, 2020, pp. 1-8.

* cited by examiner

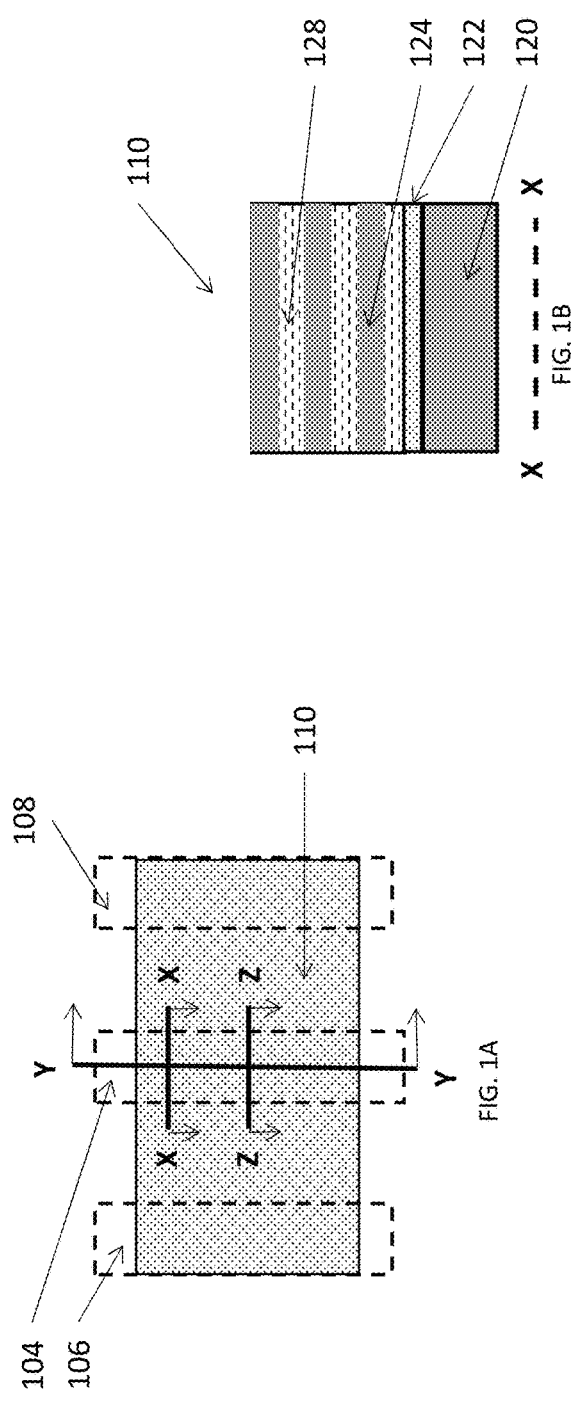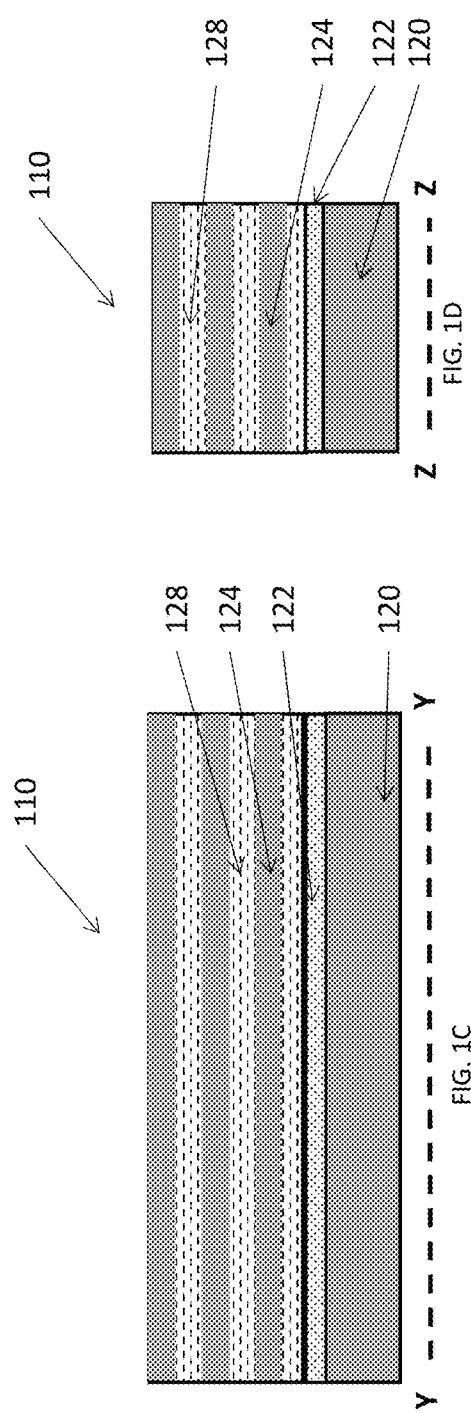

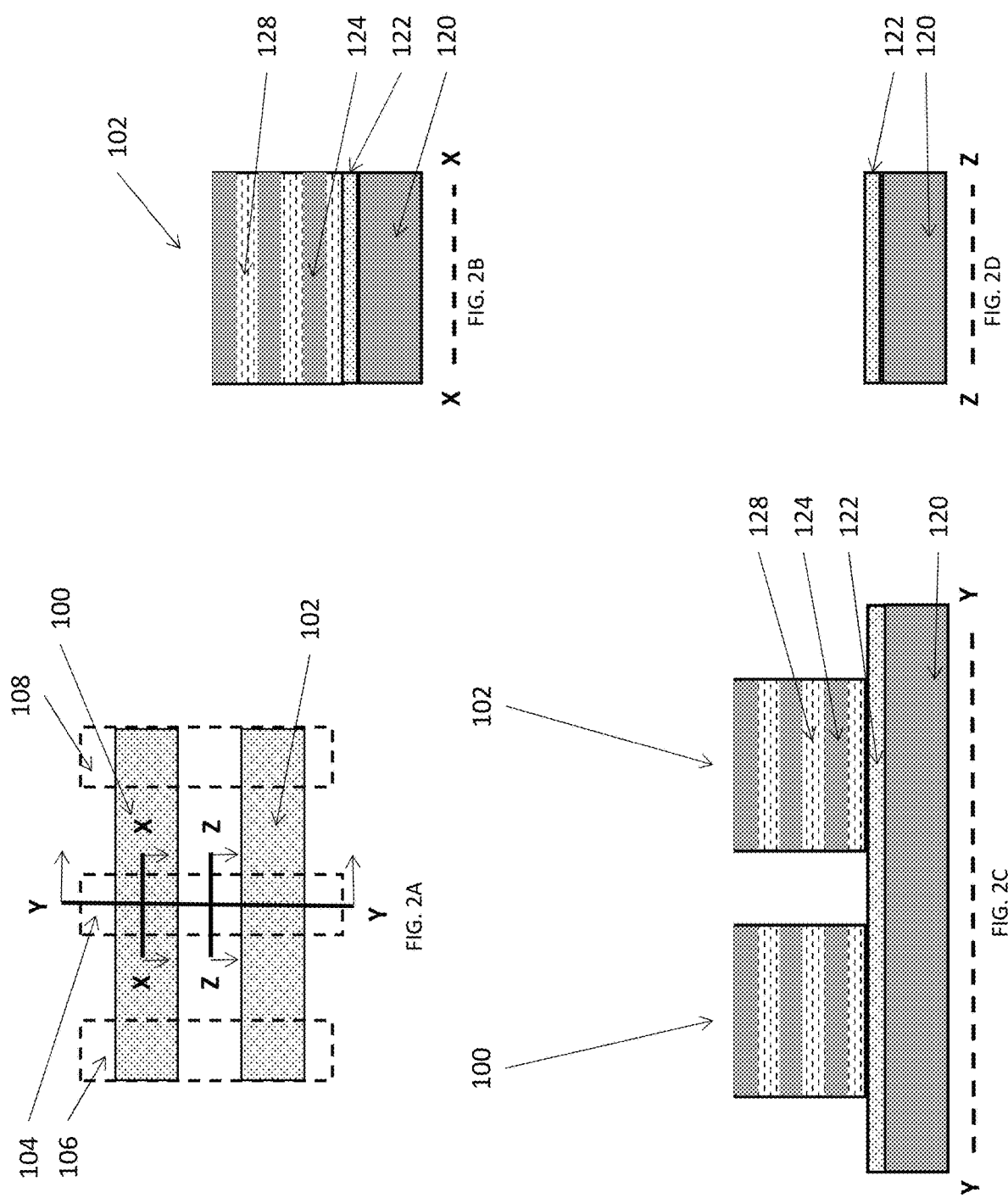

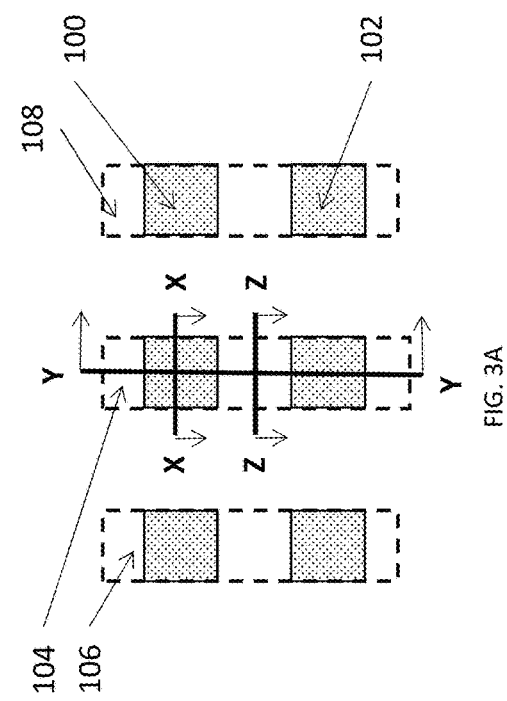
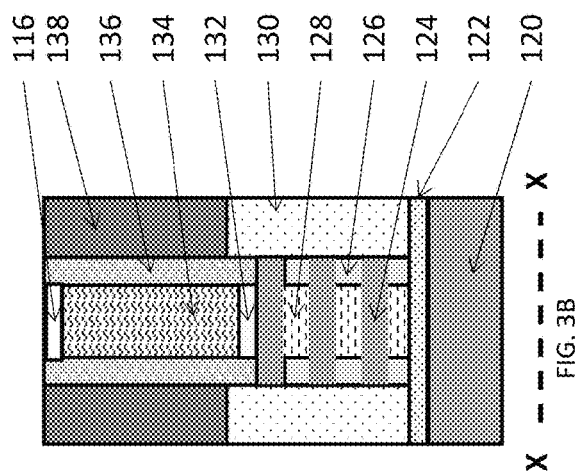
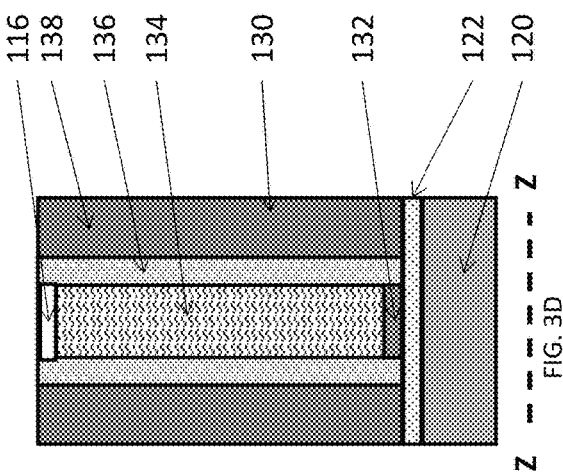
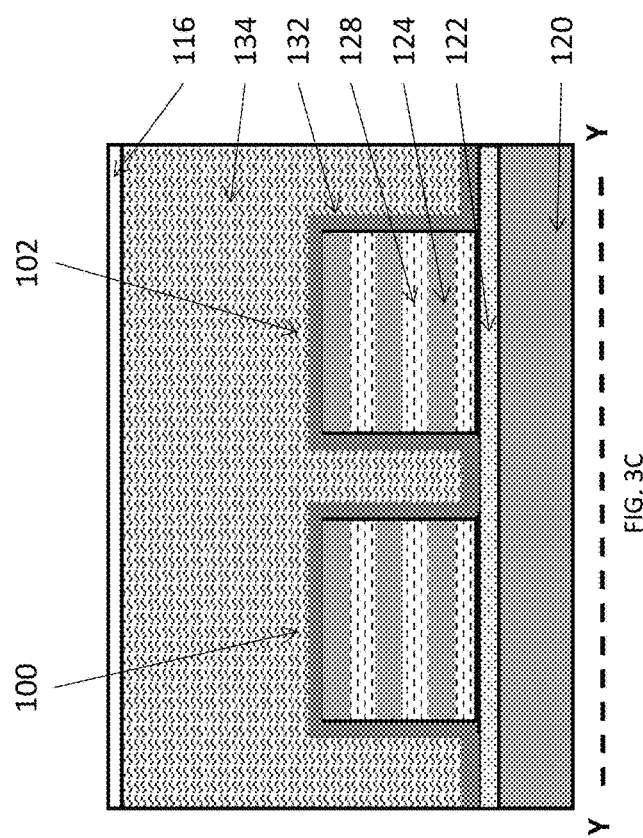

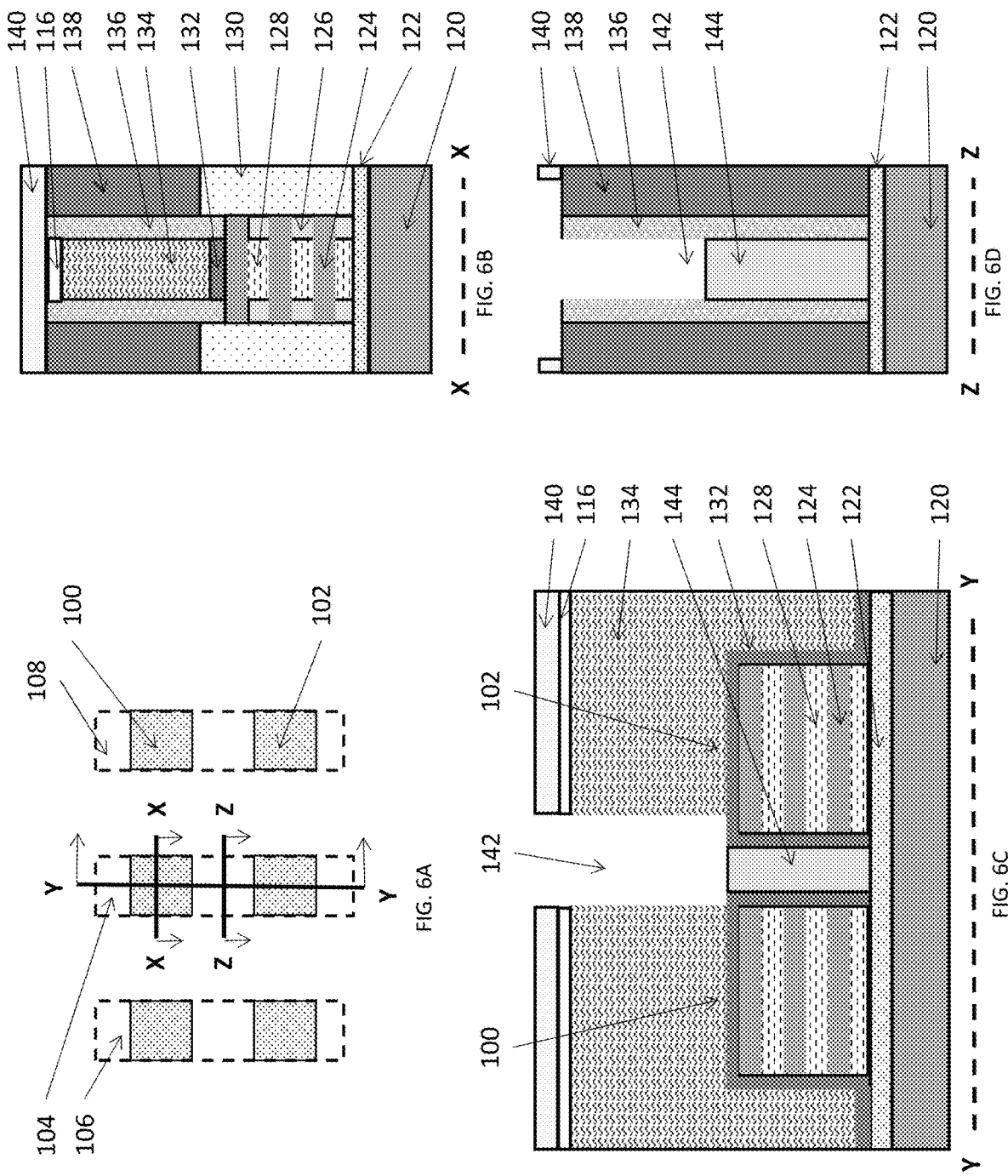

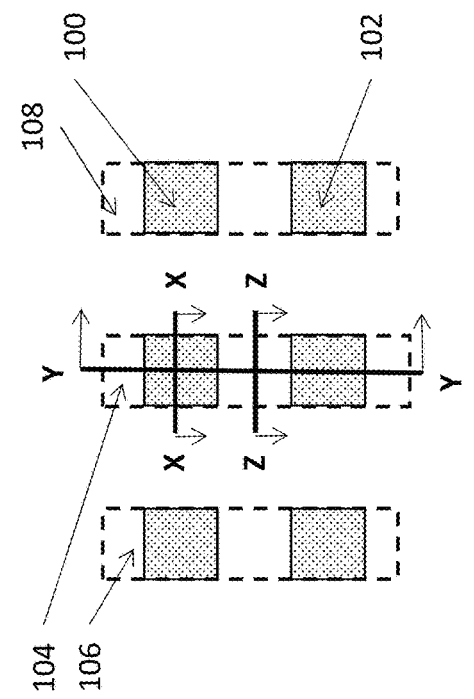
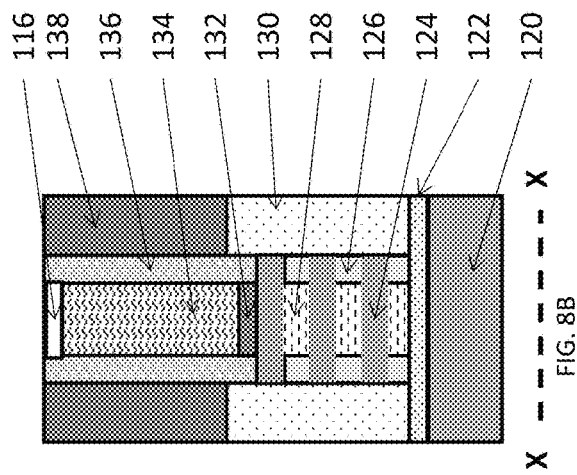
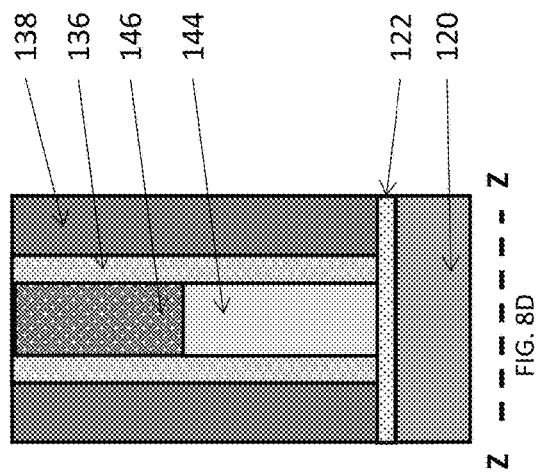
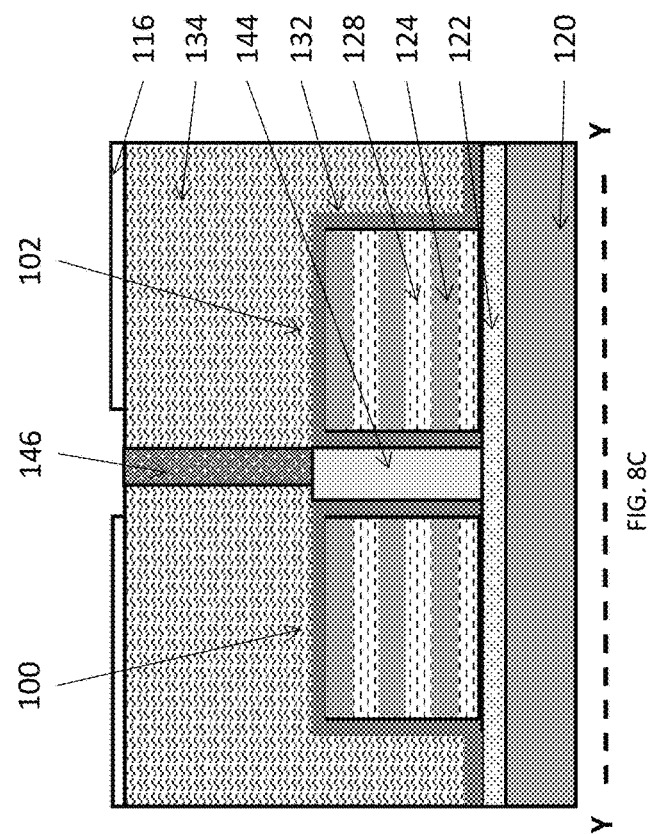

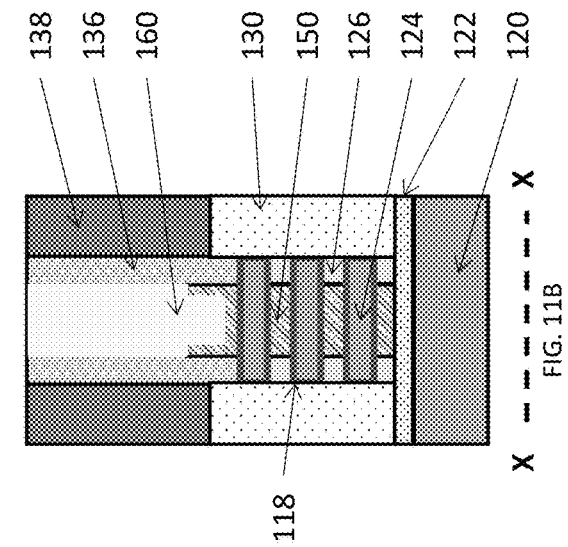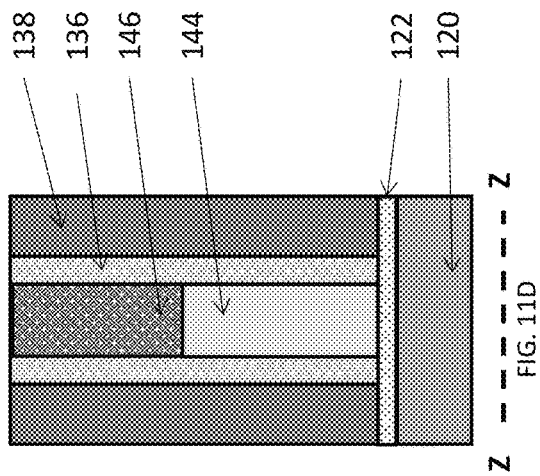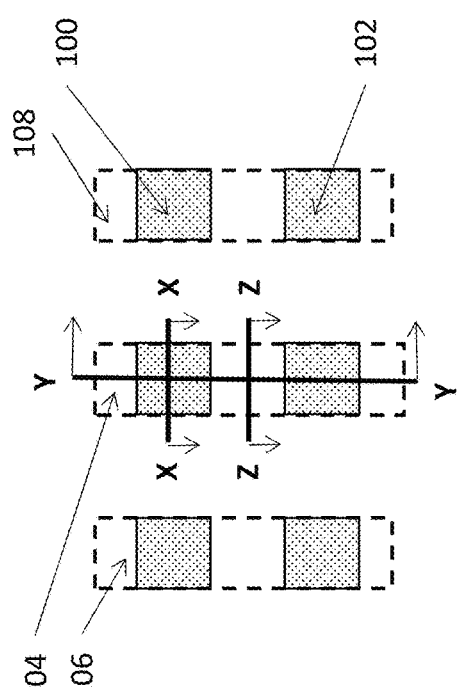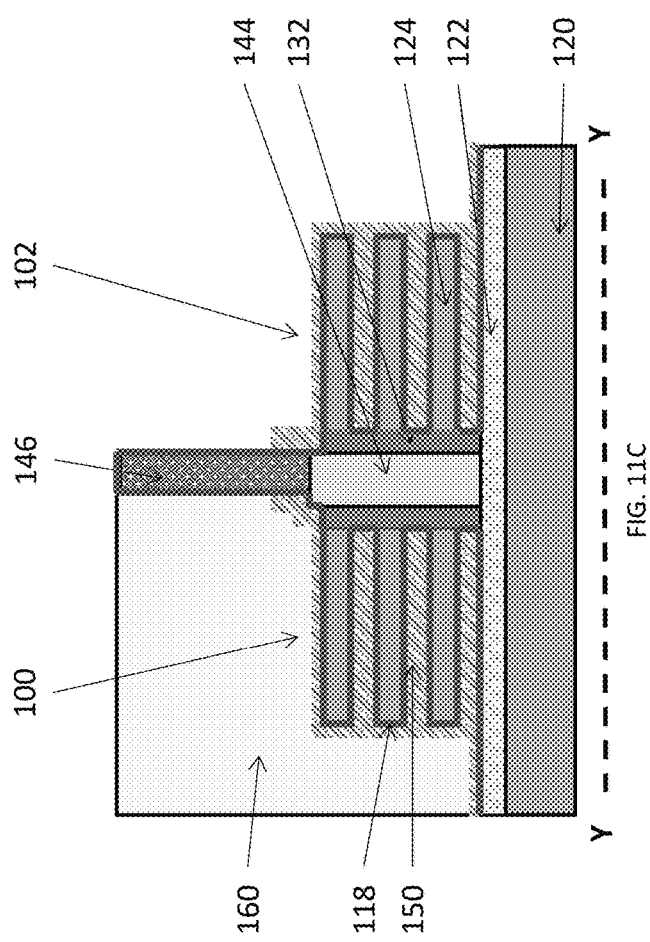

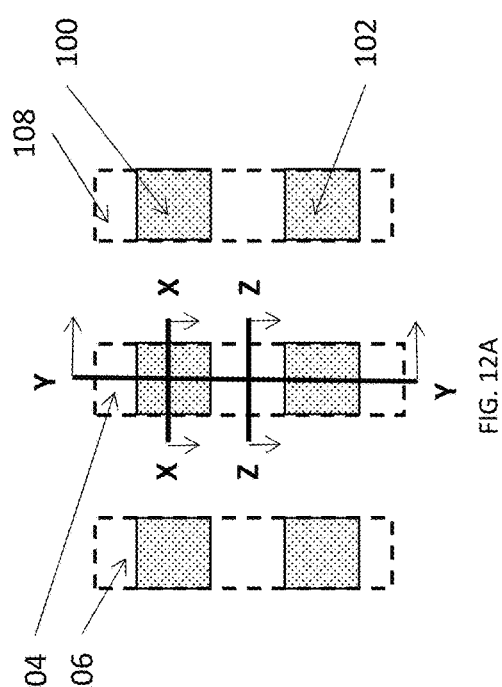
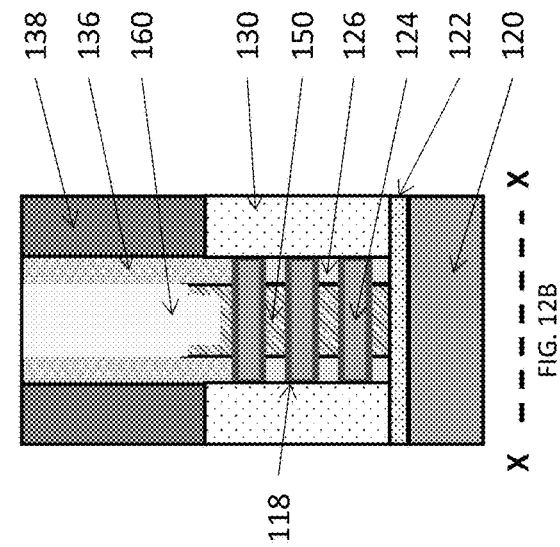
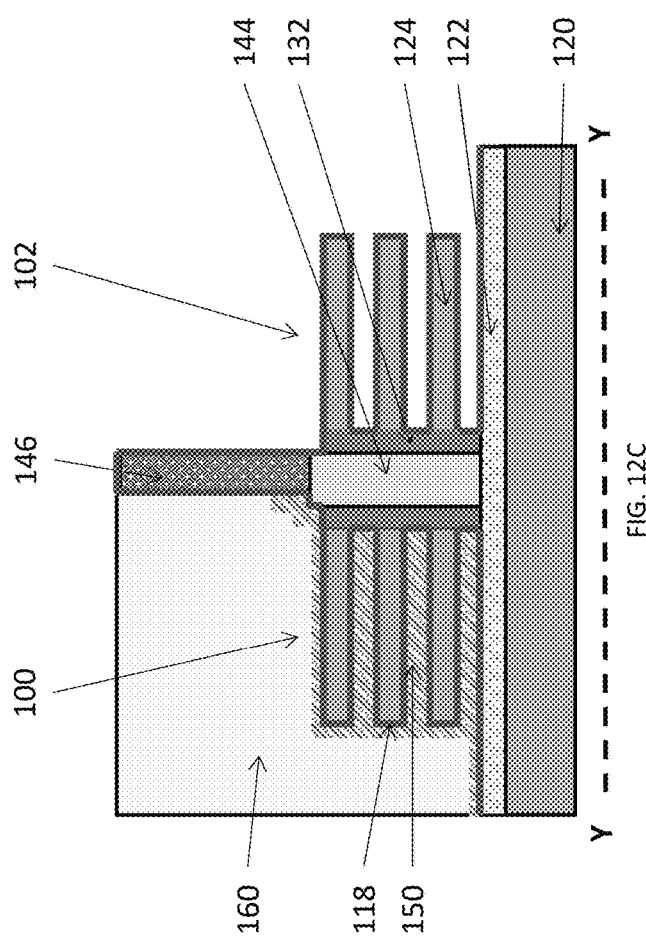
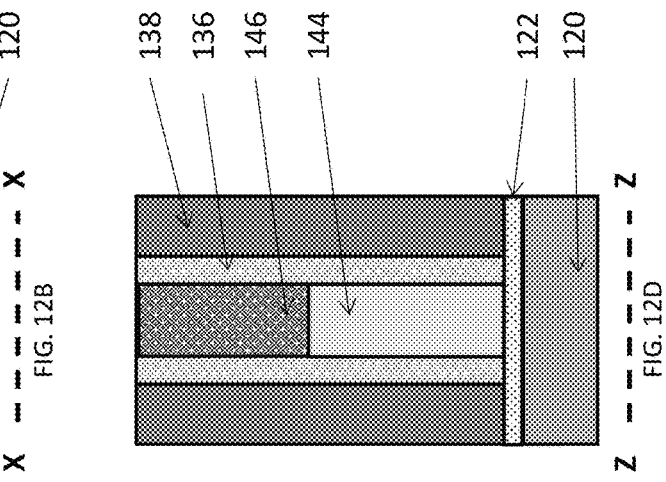

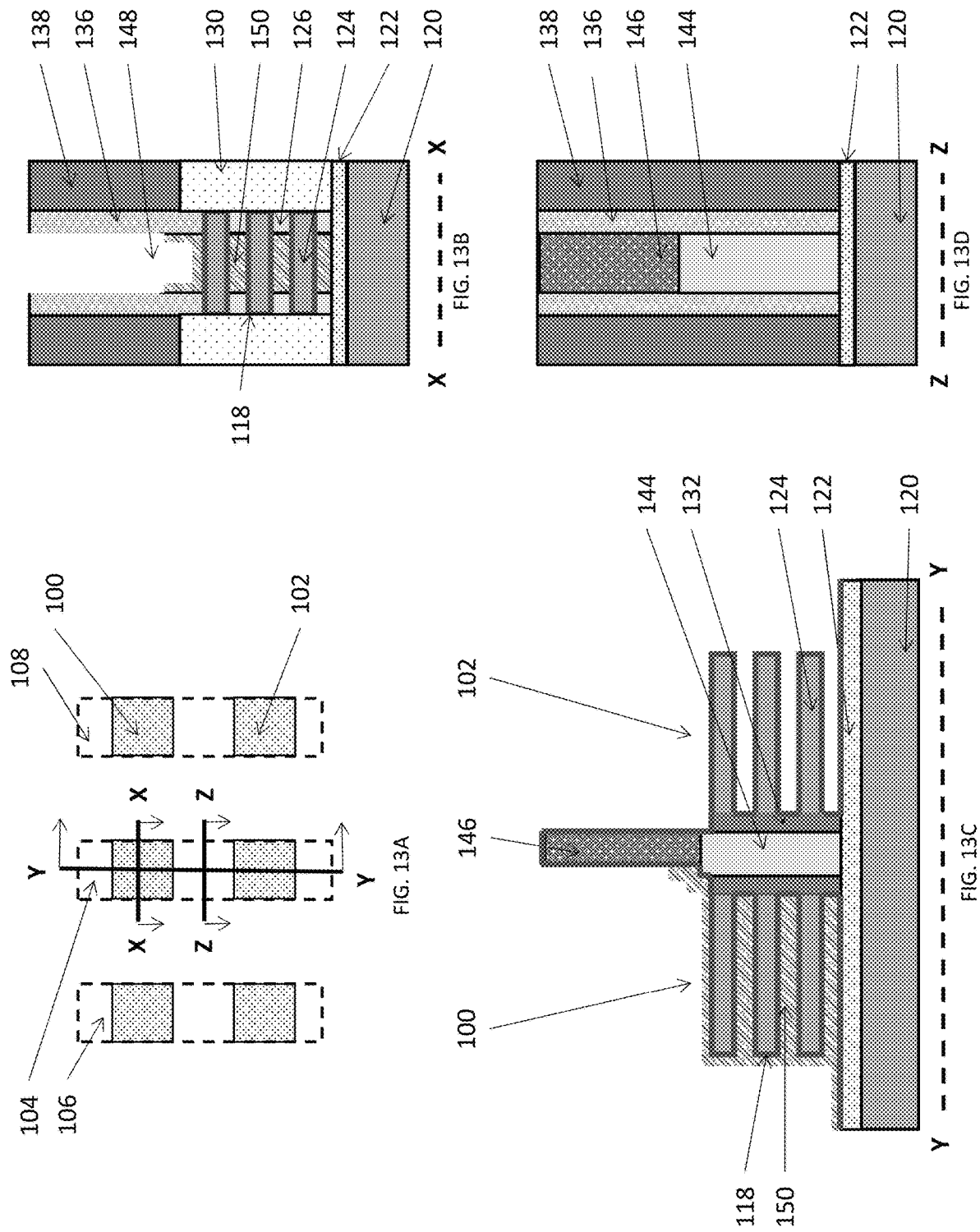

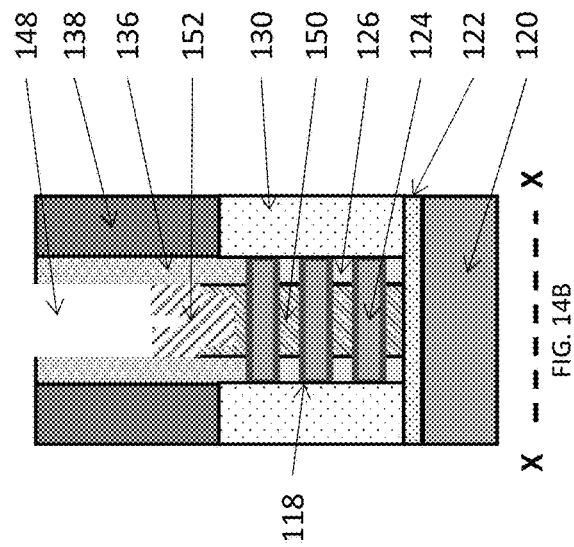
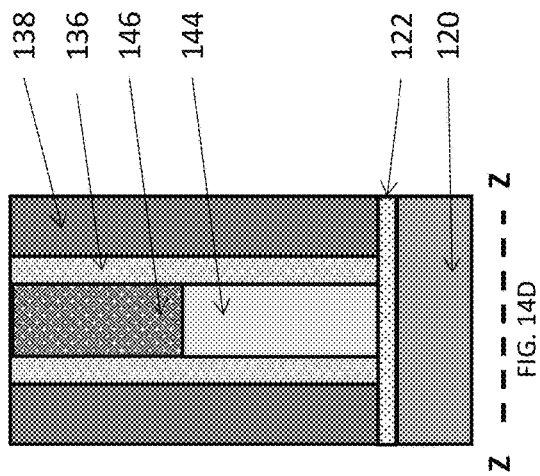
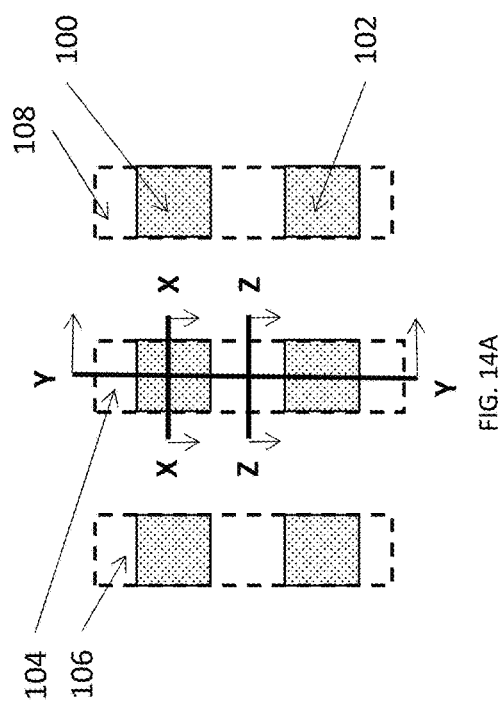
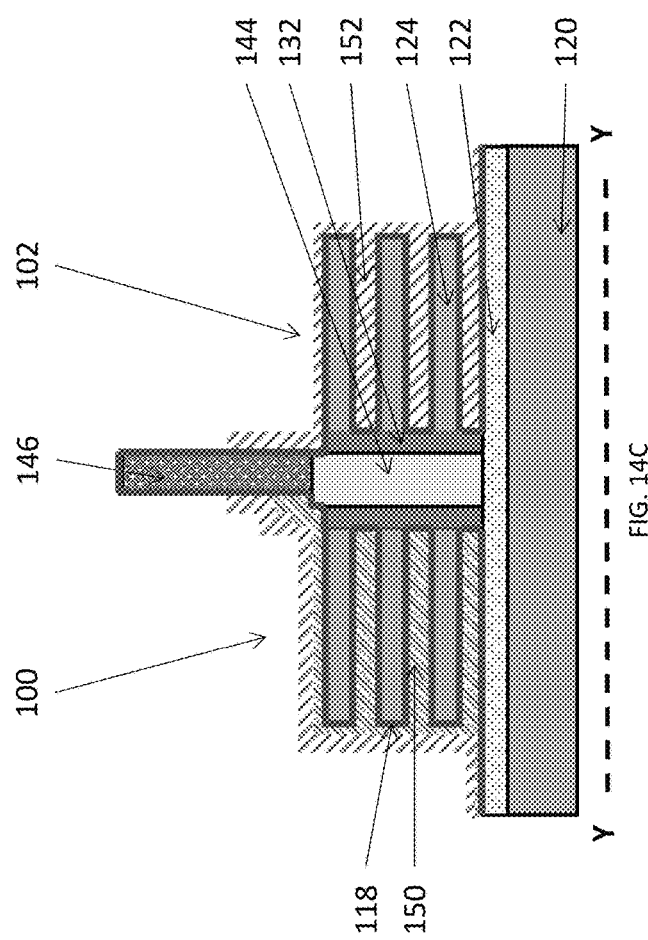

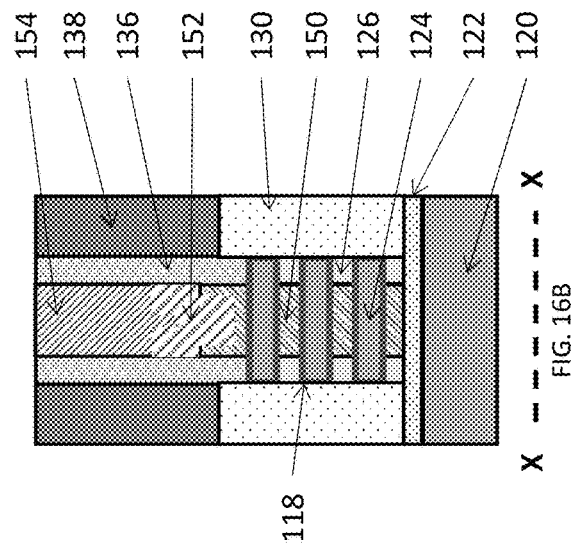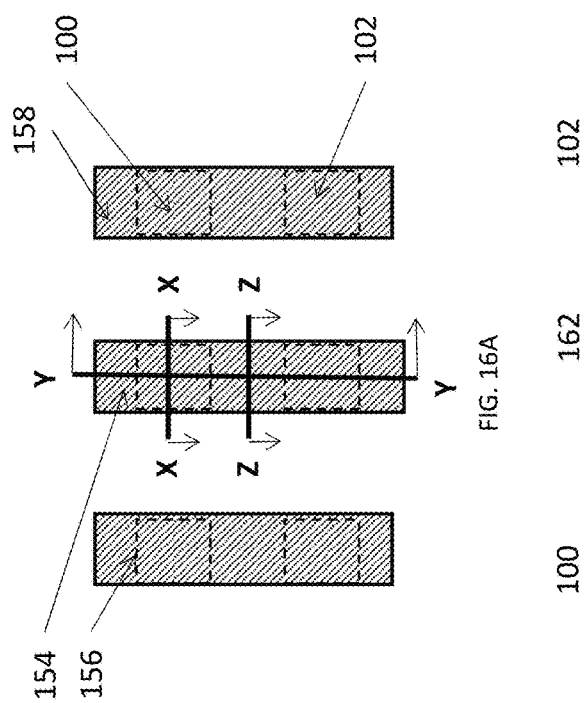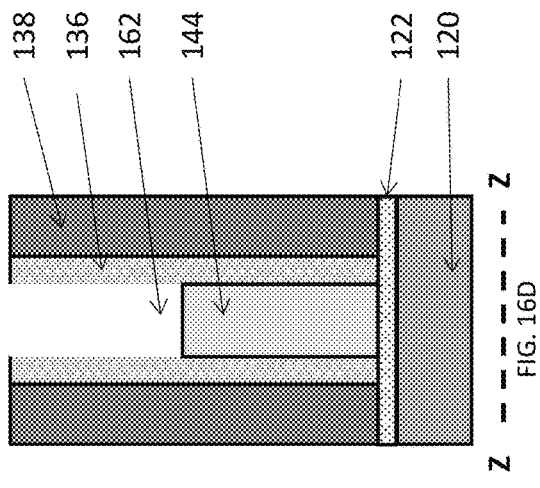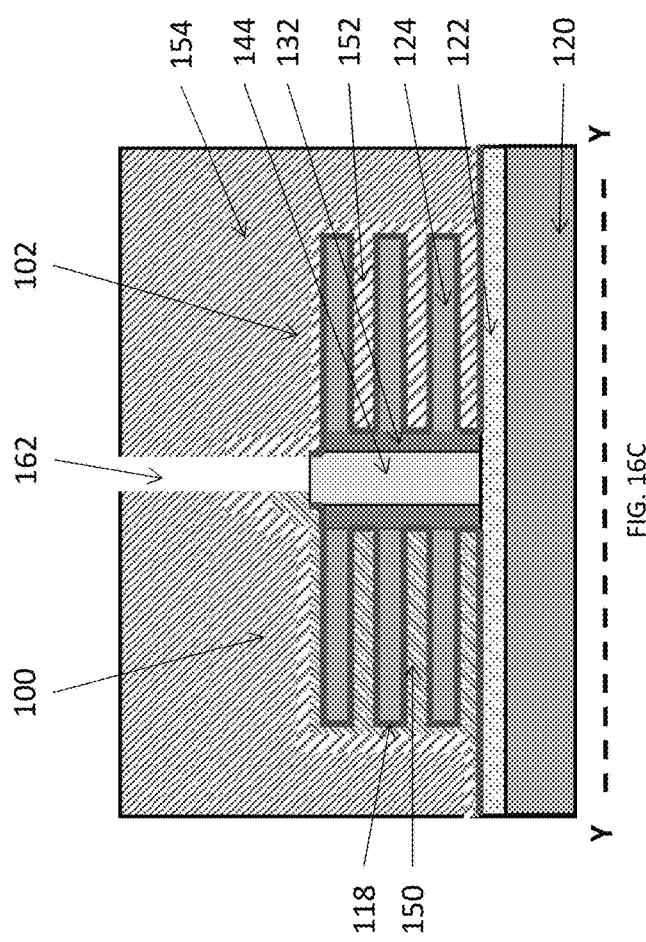

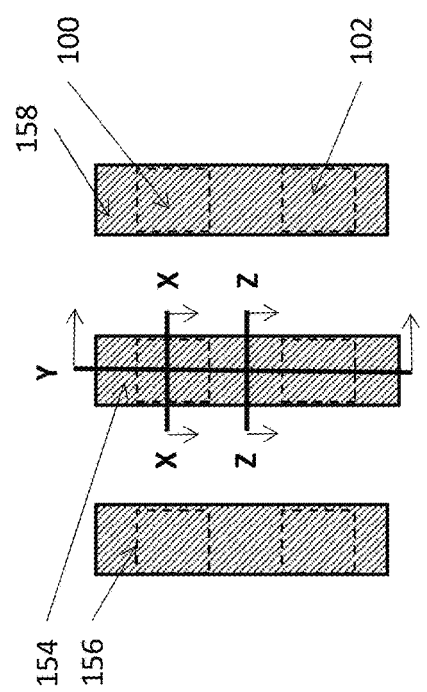
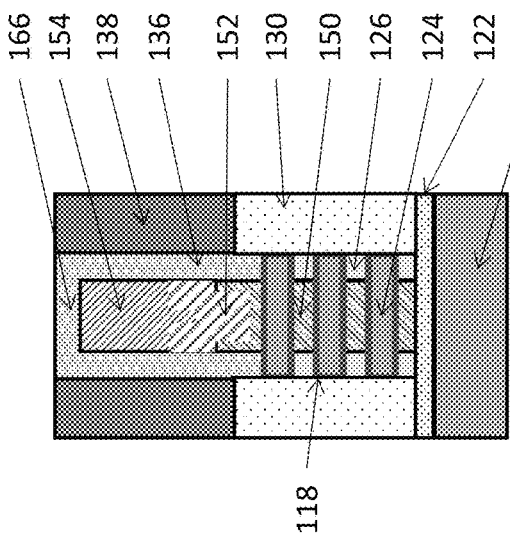
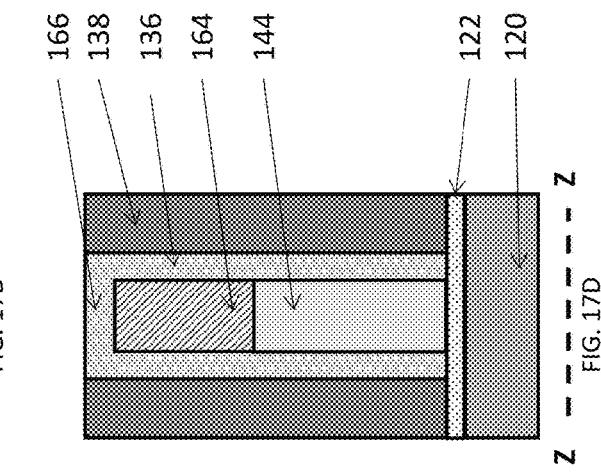
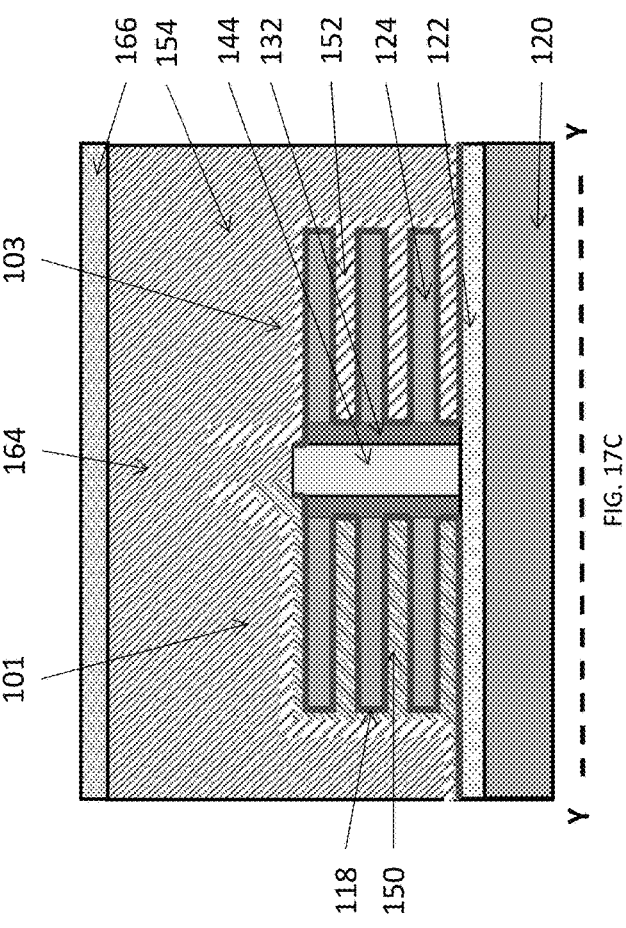
FIG. 17A
FIG. 17B
FIG. 17C
FIG. 17D

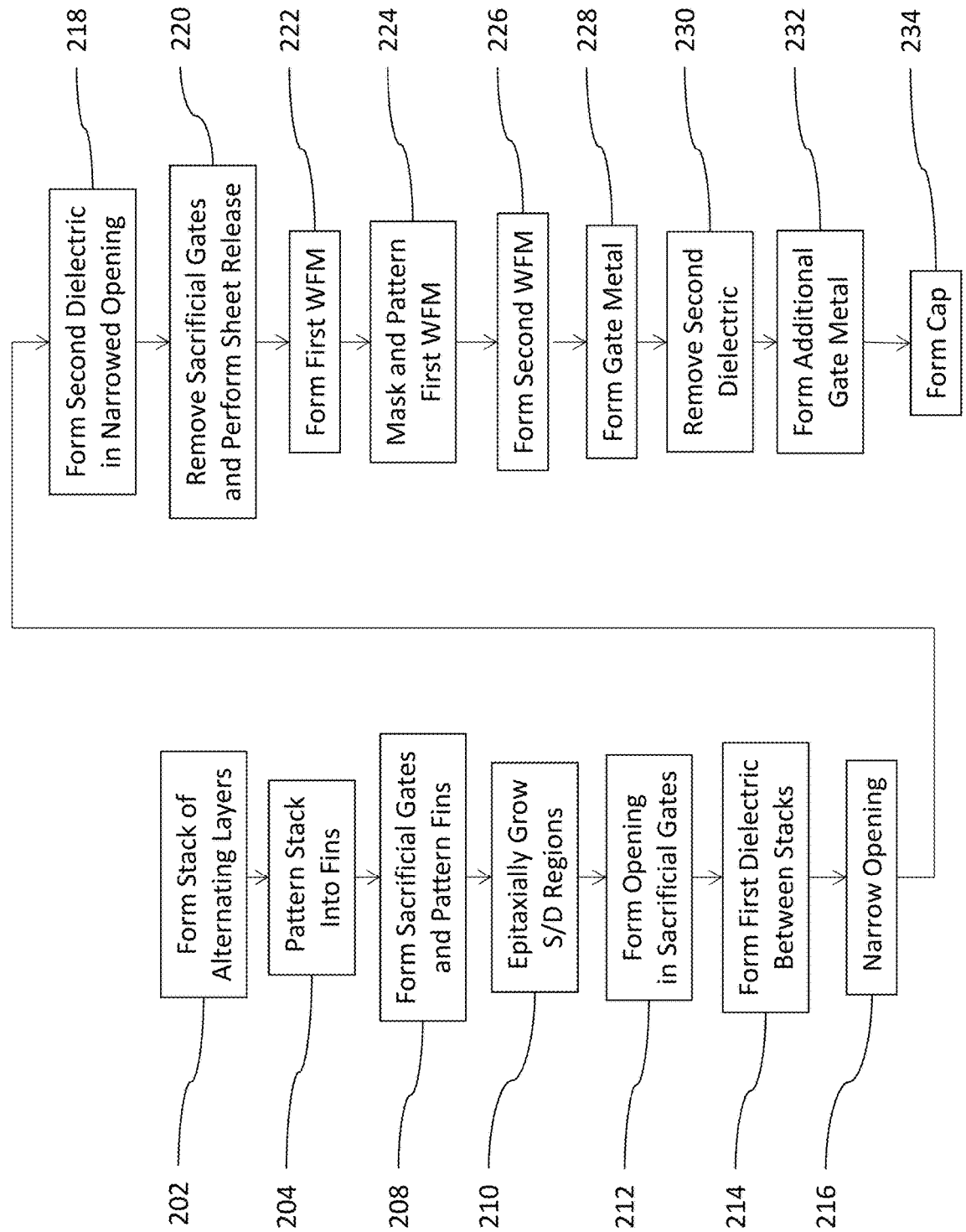

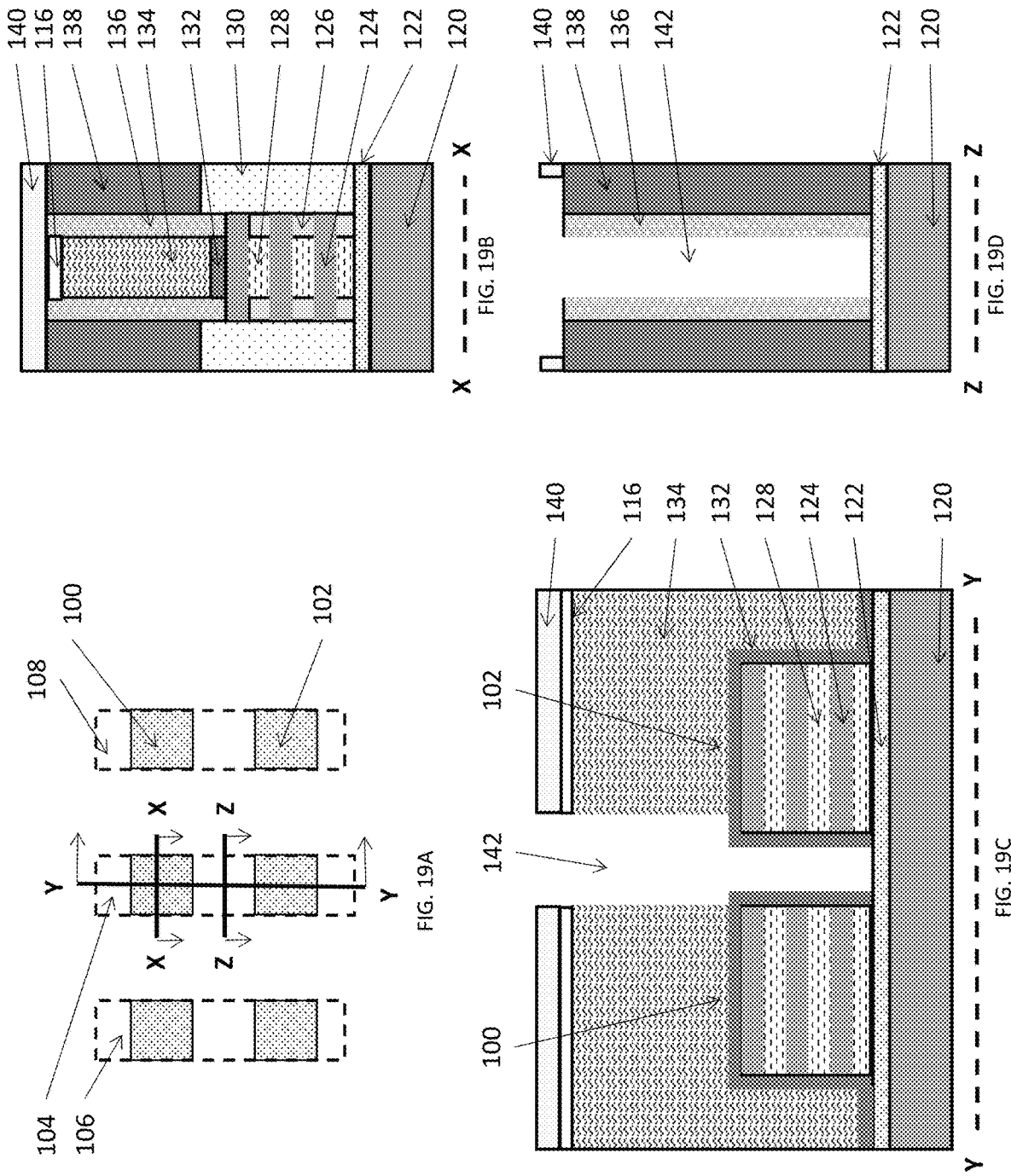

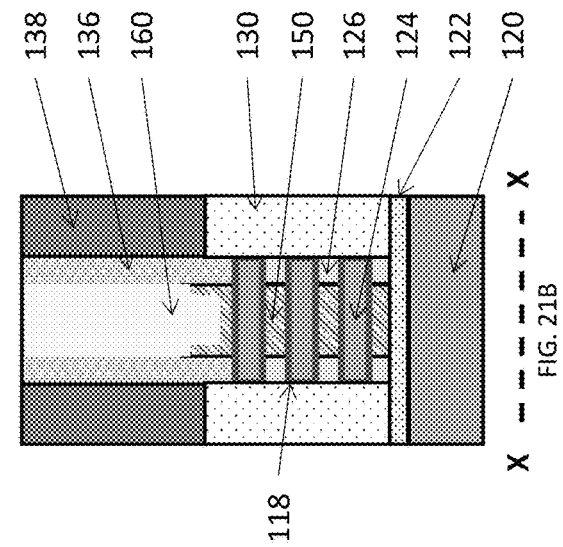
FIG. 21A
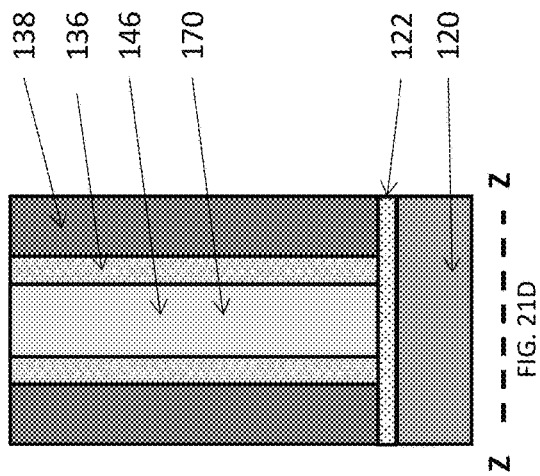
FIG. 21B
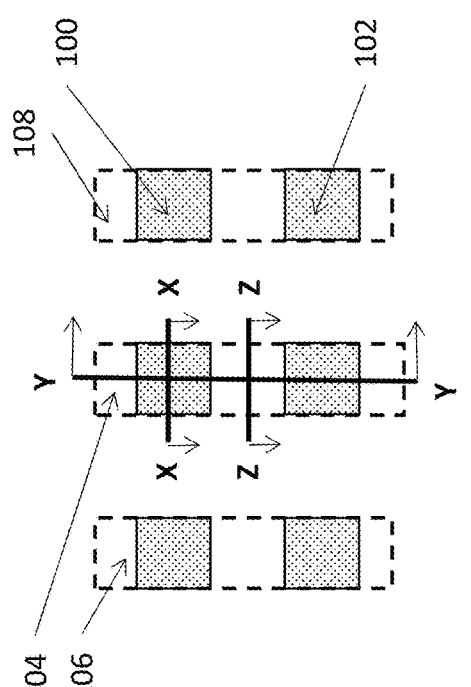
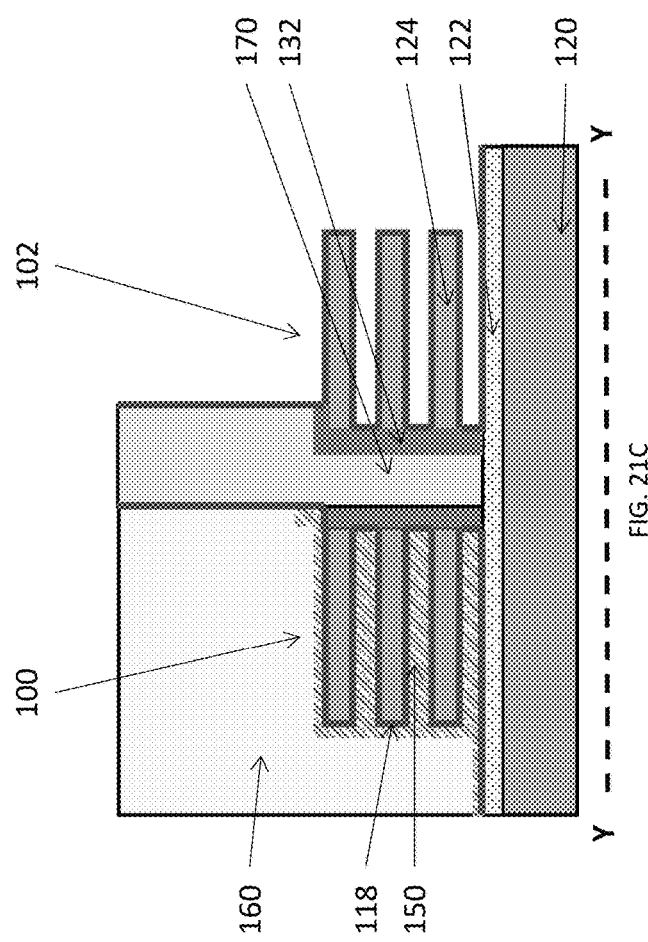
FIG. 21C
FIG. 21D

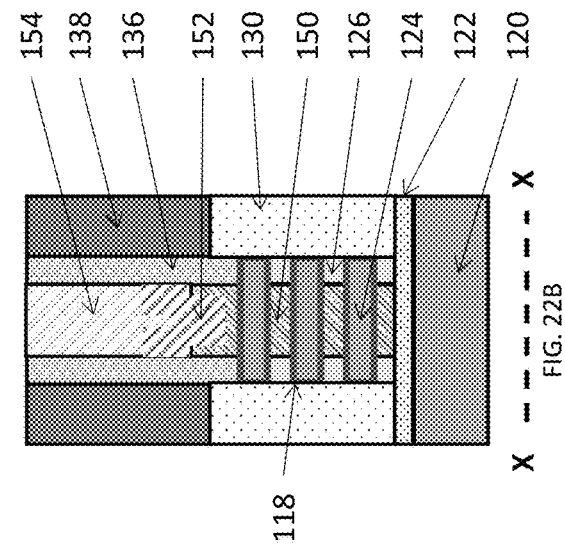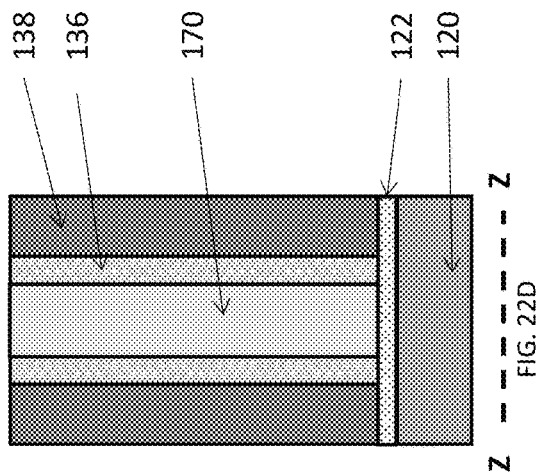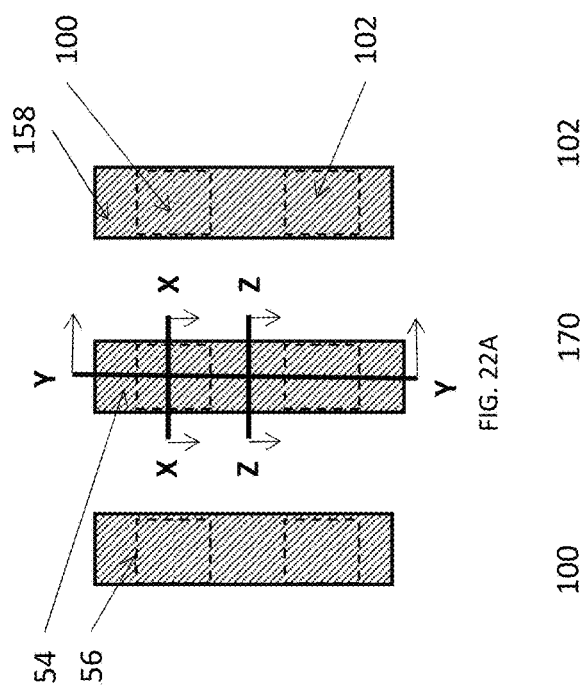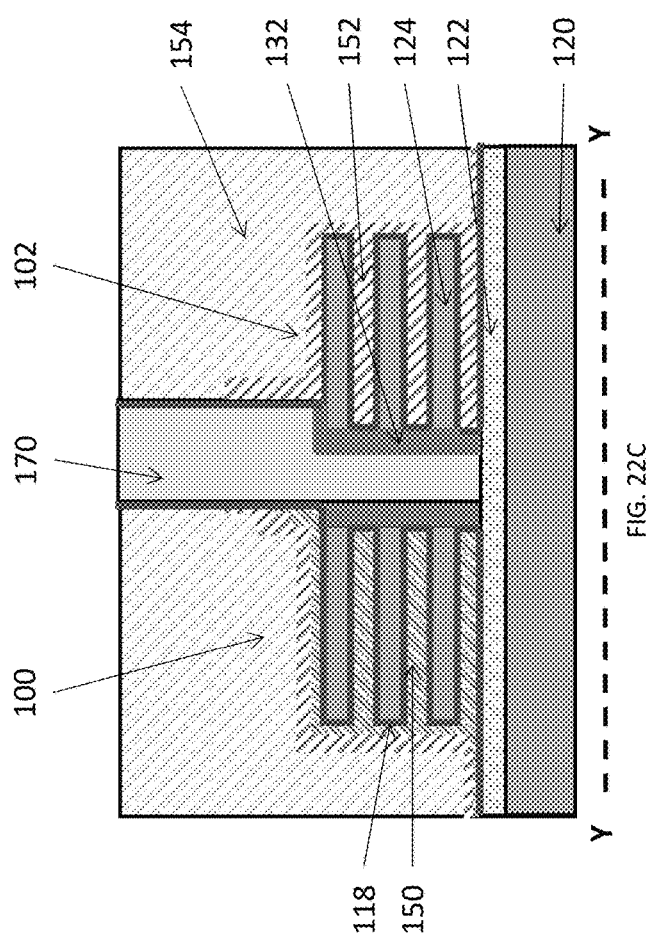

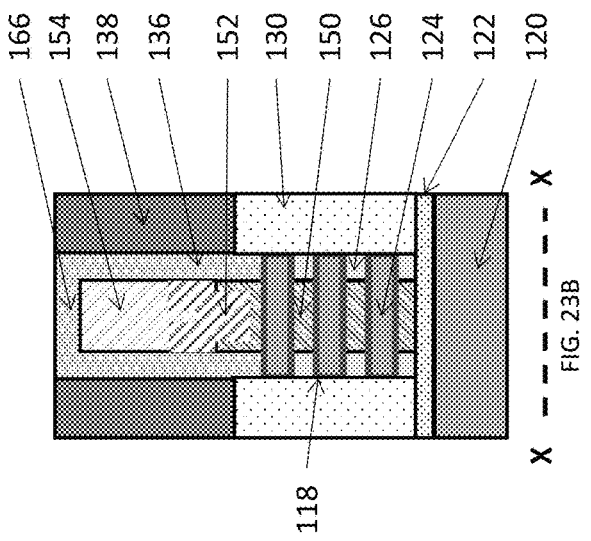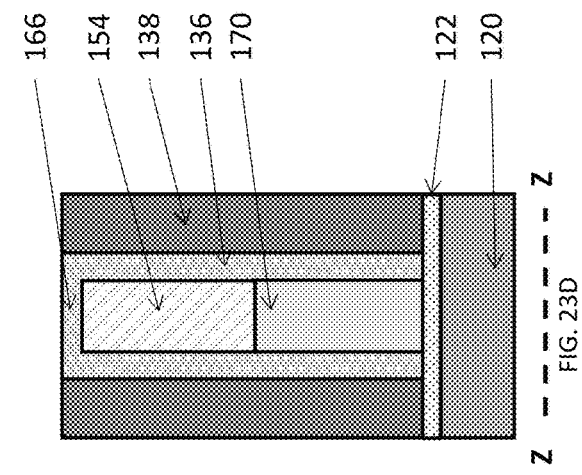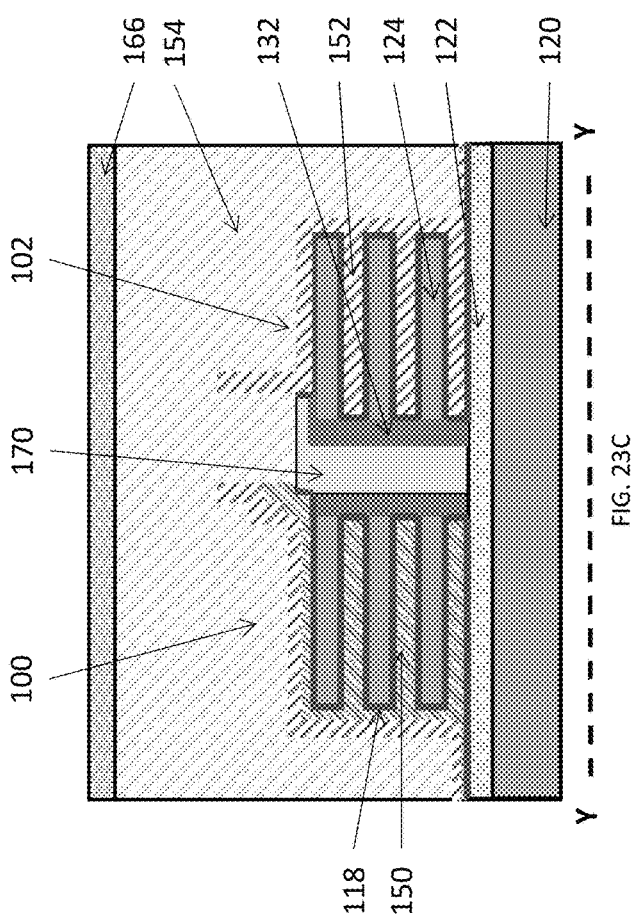

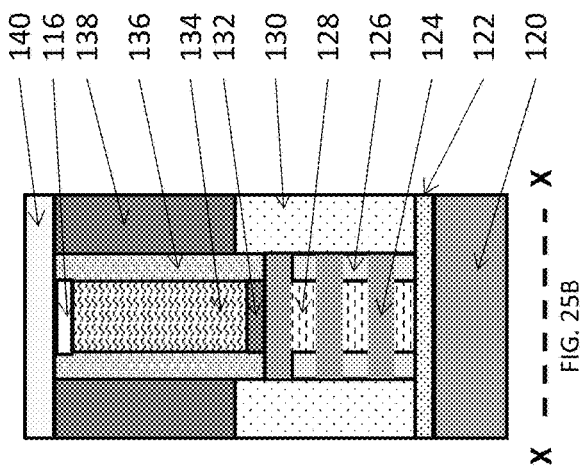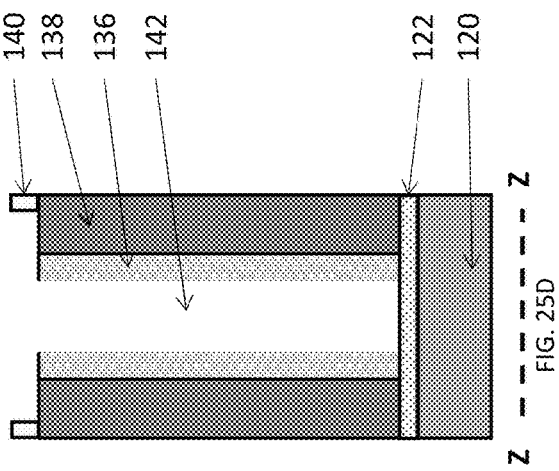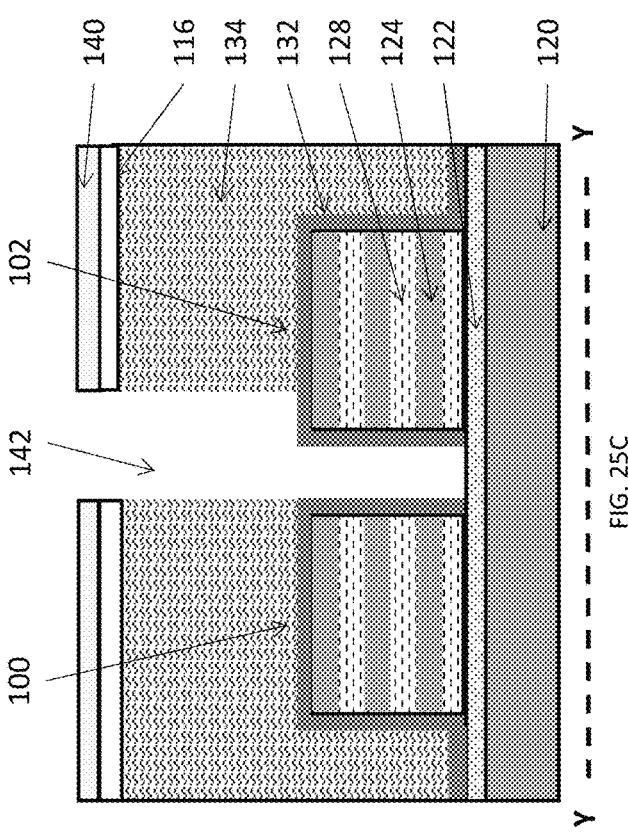

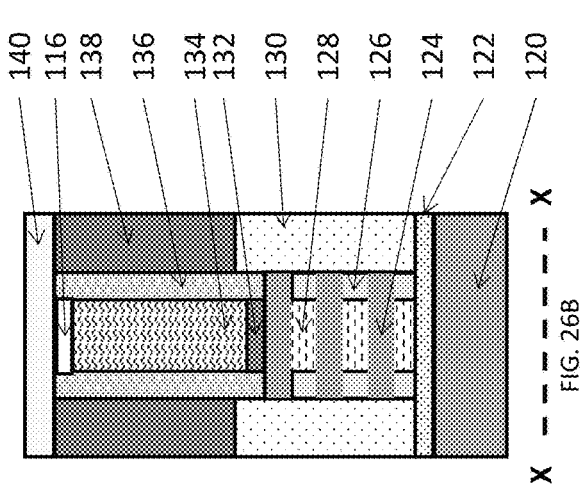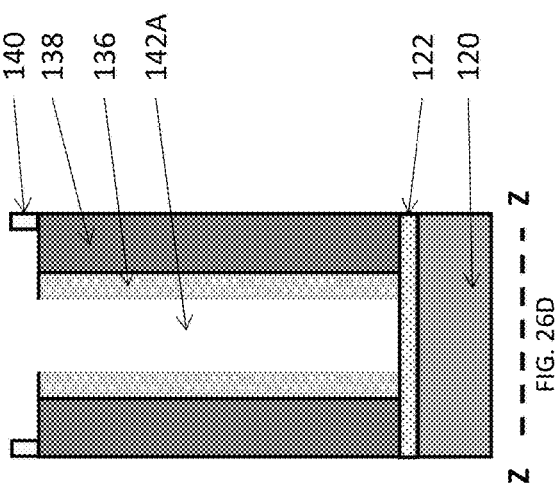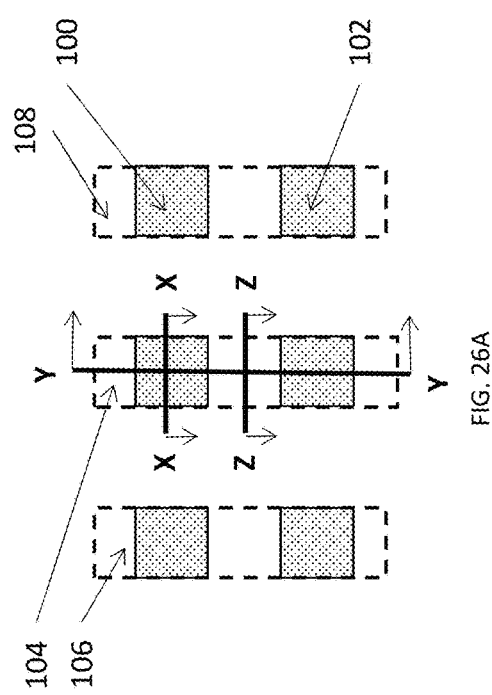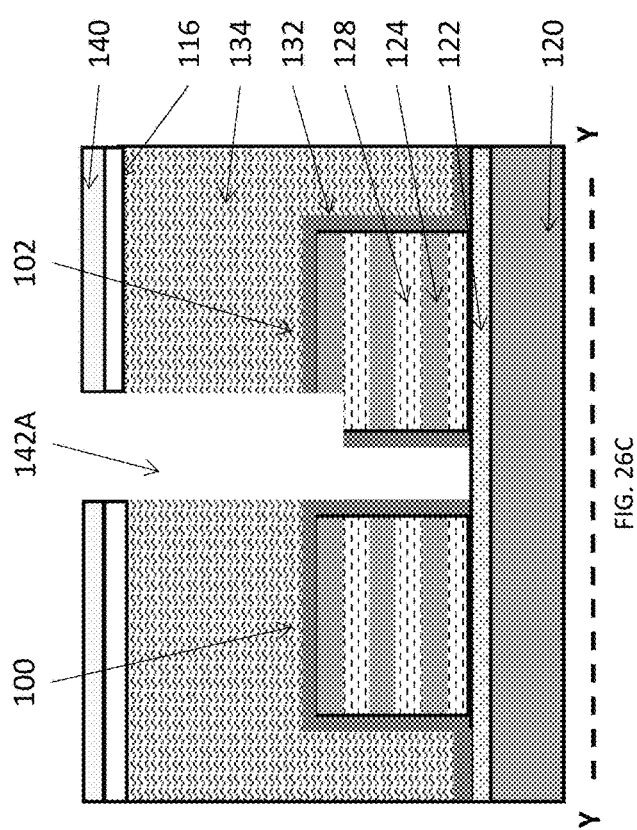

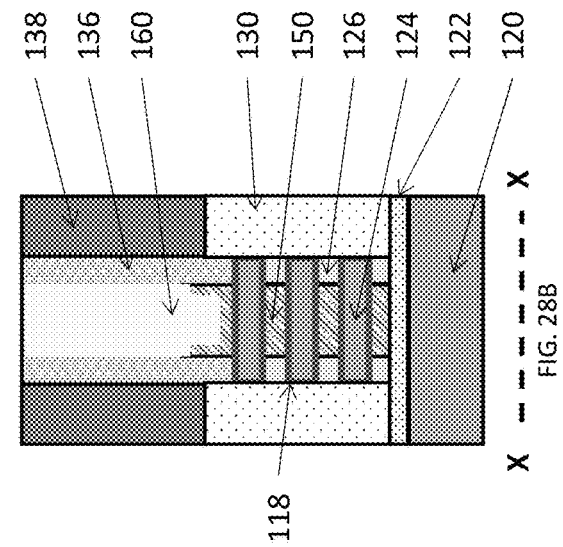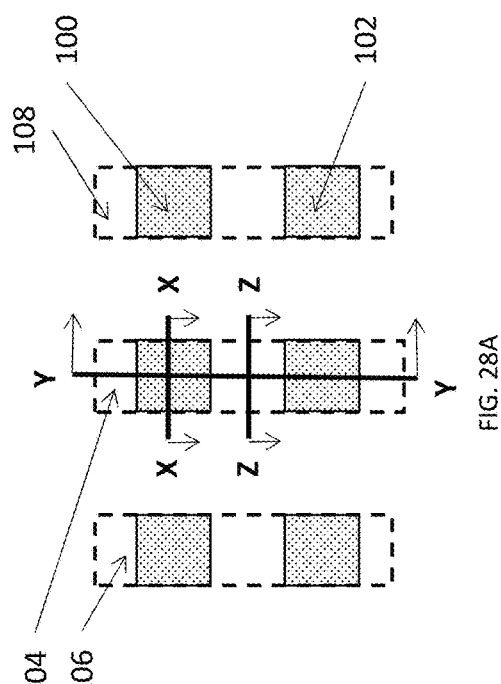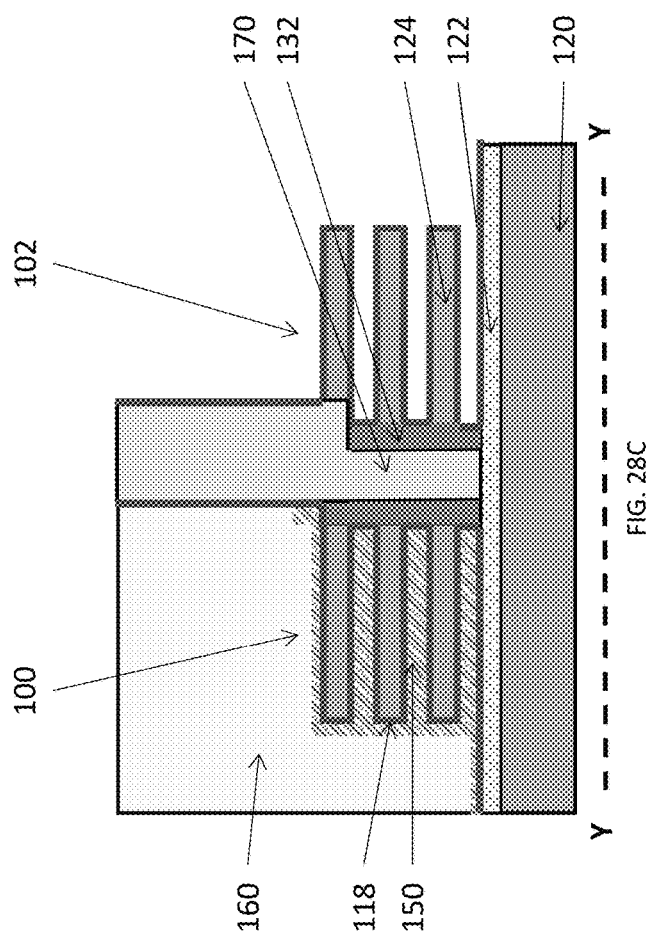

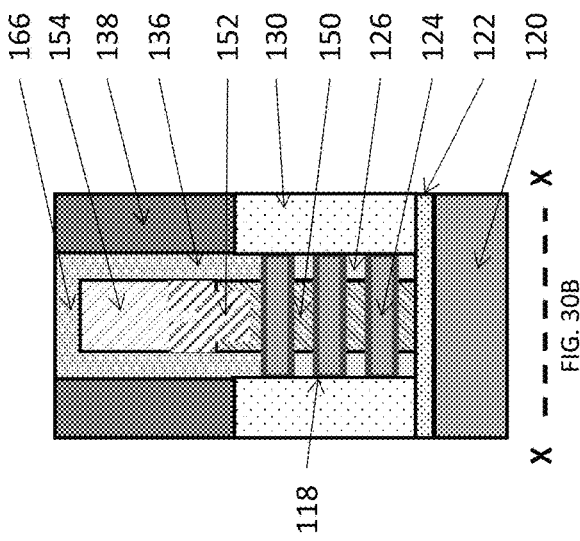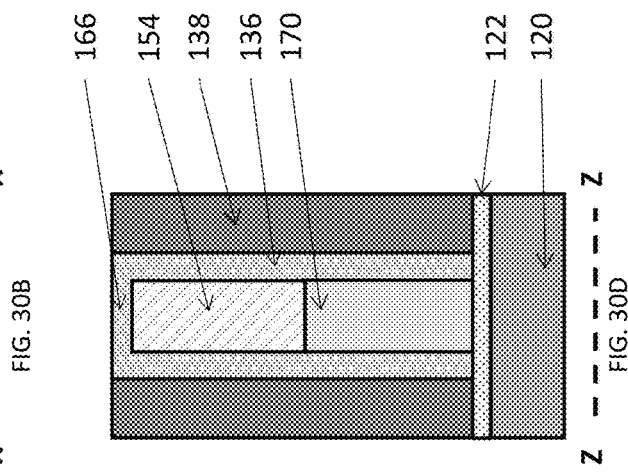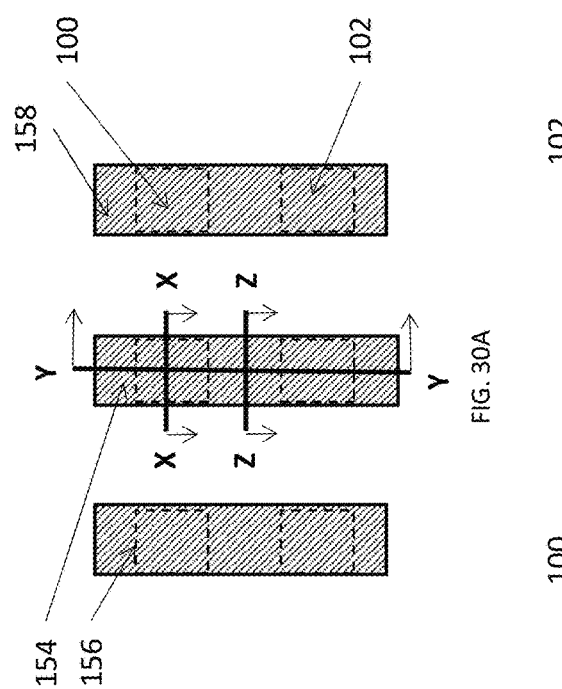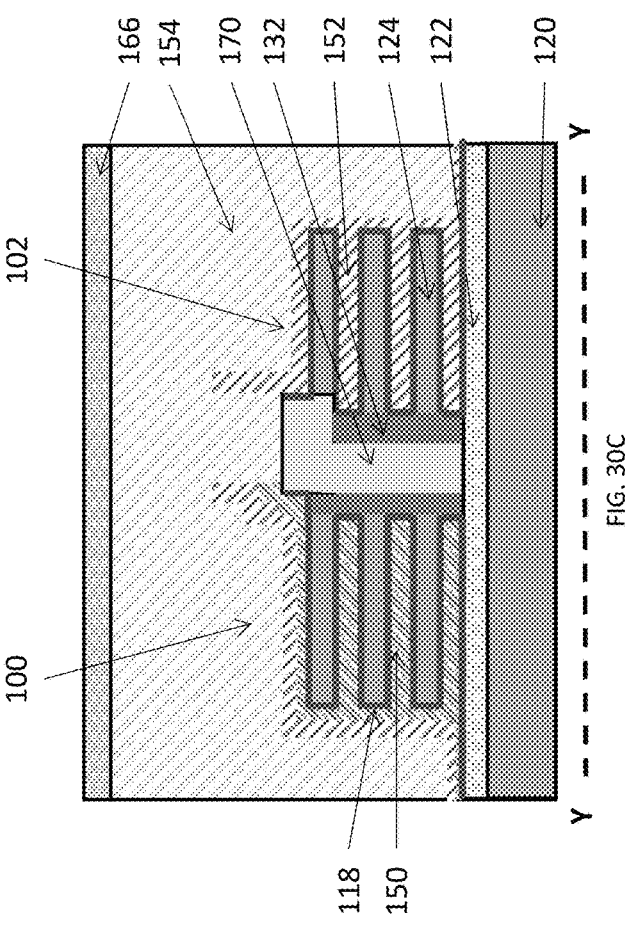

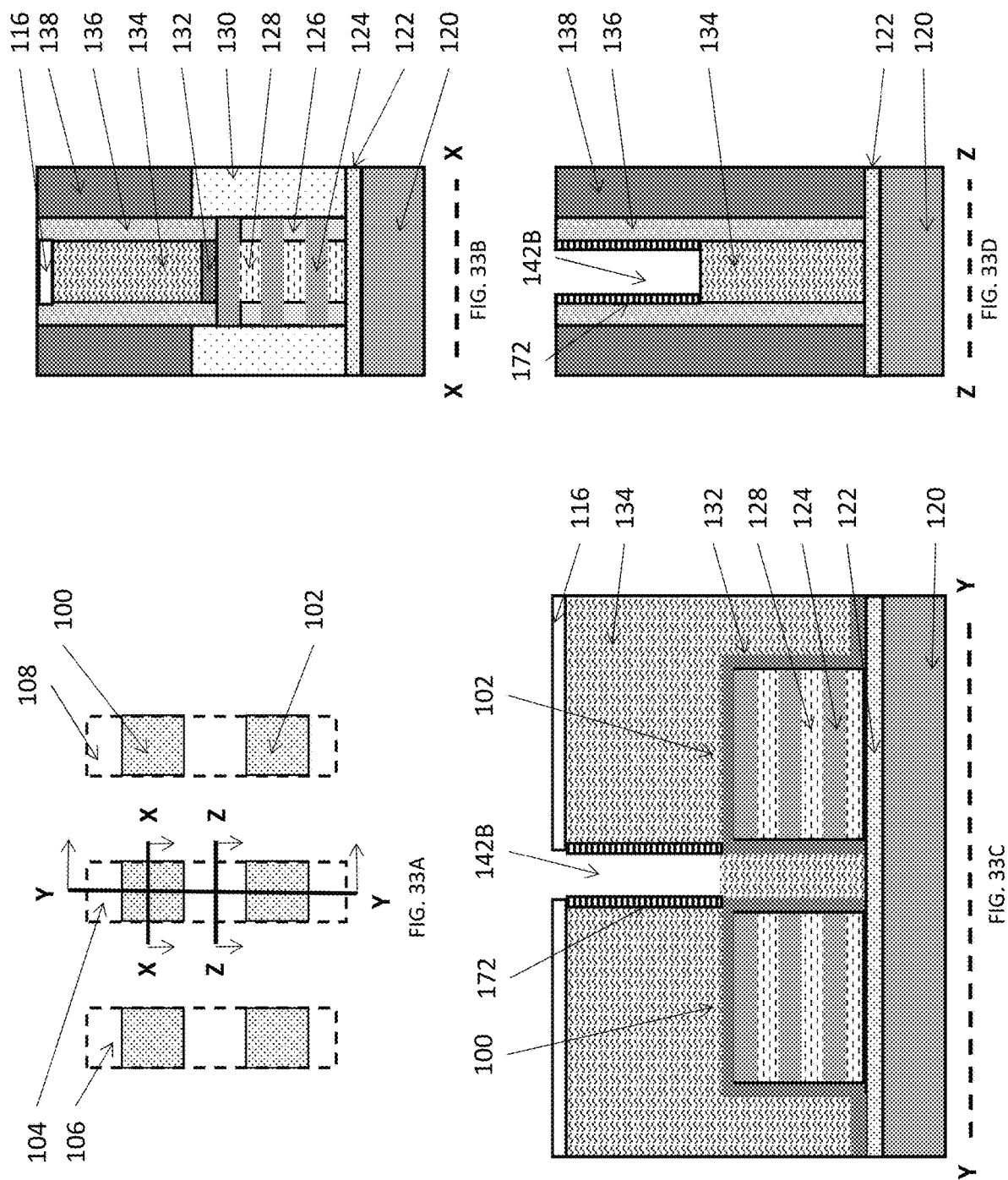

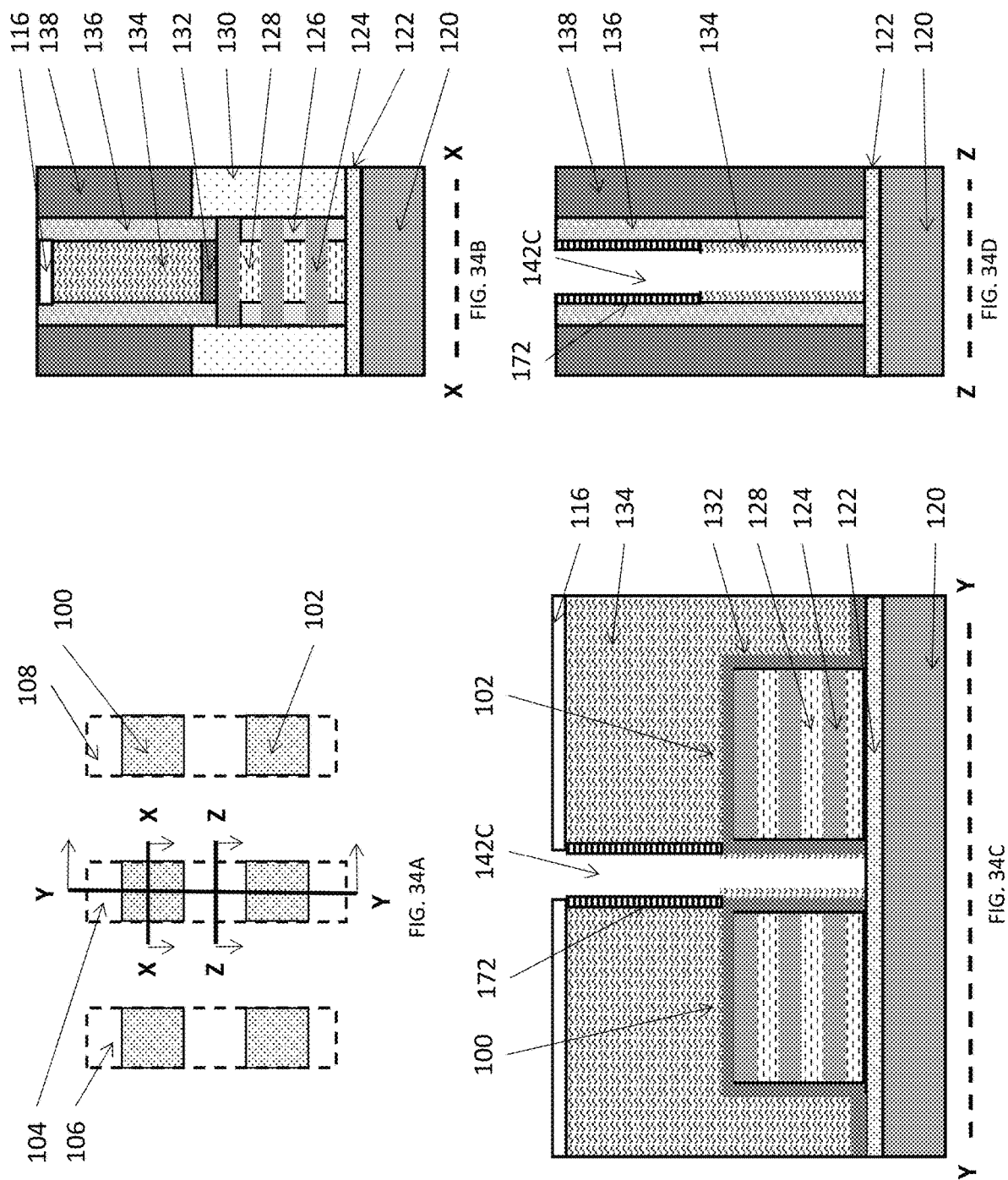

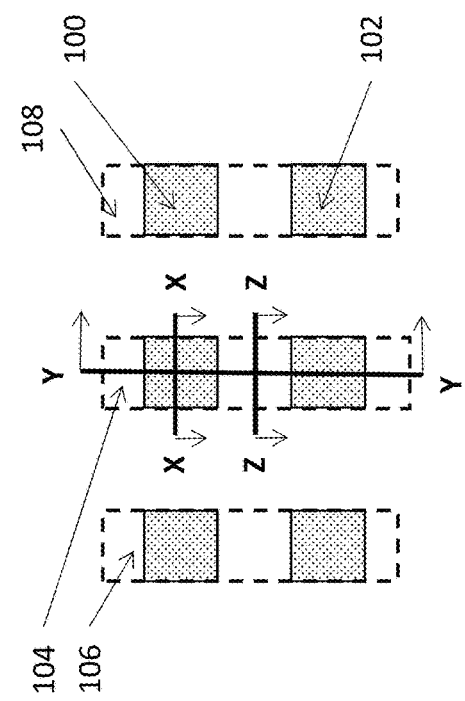
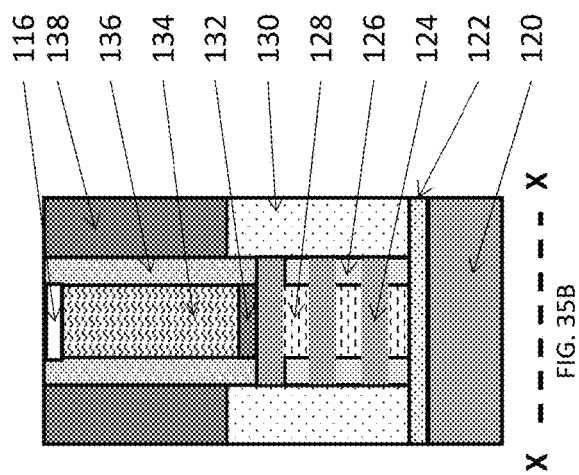
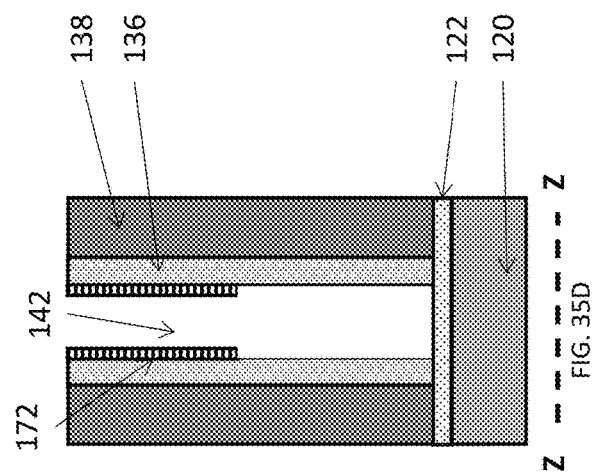
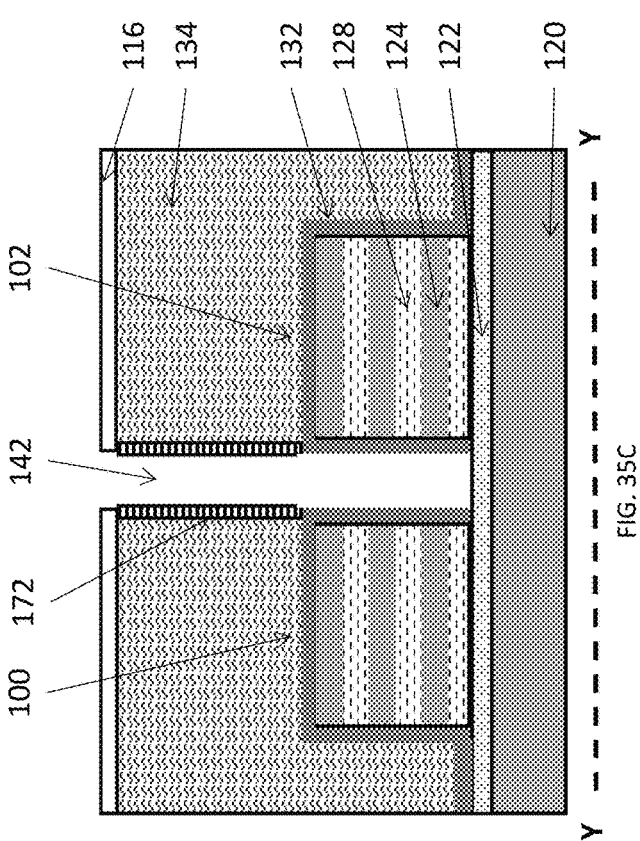

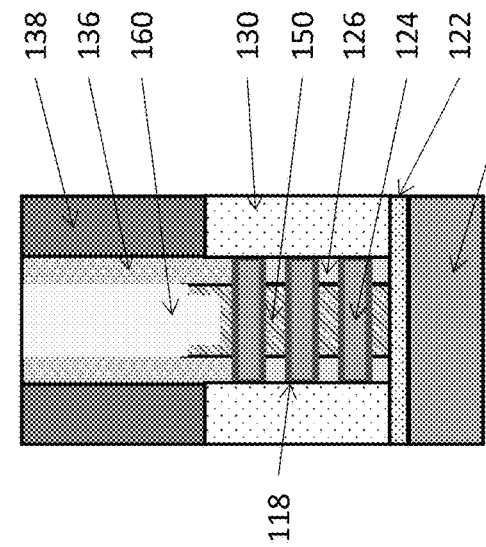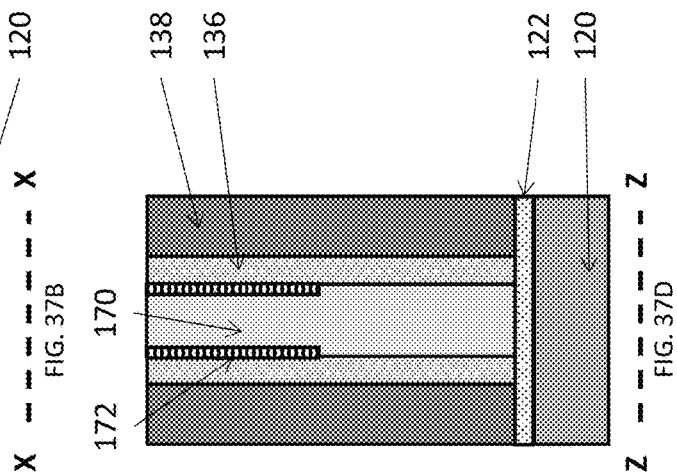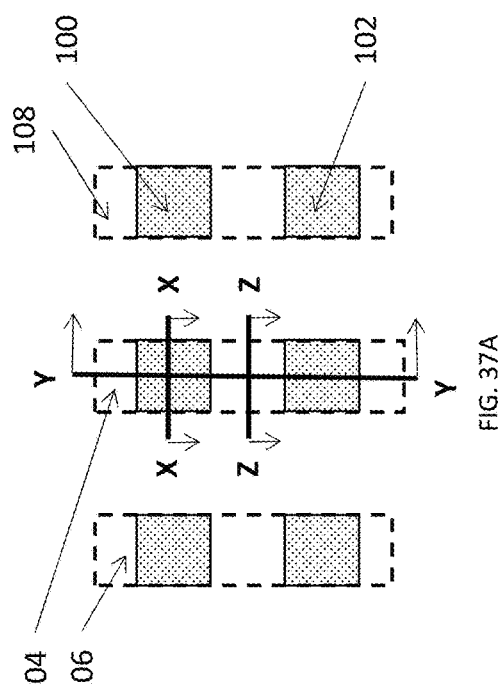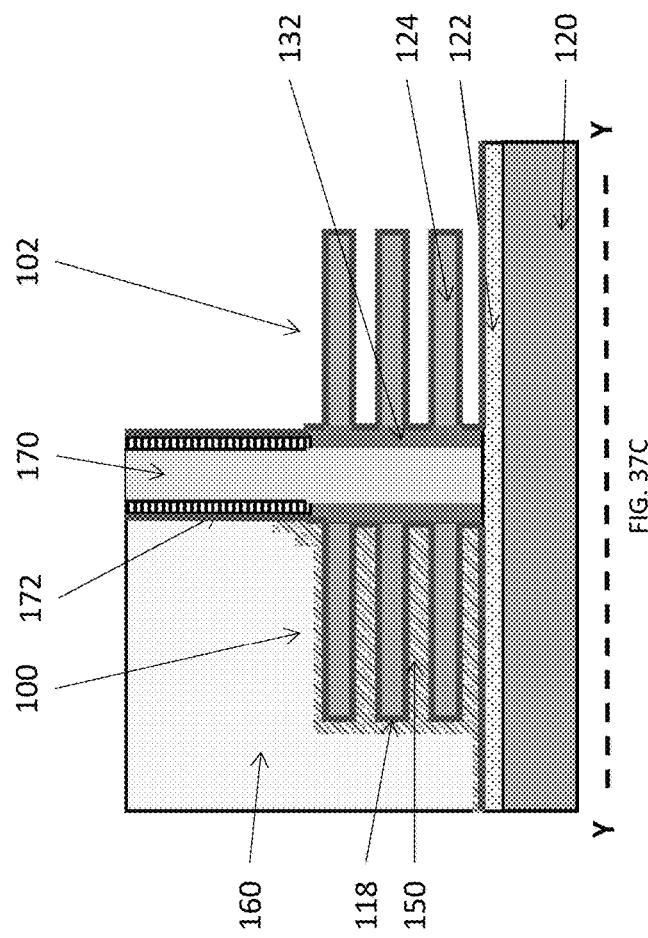

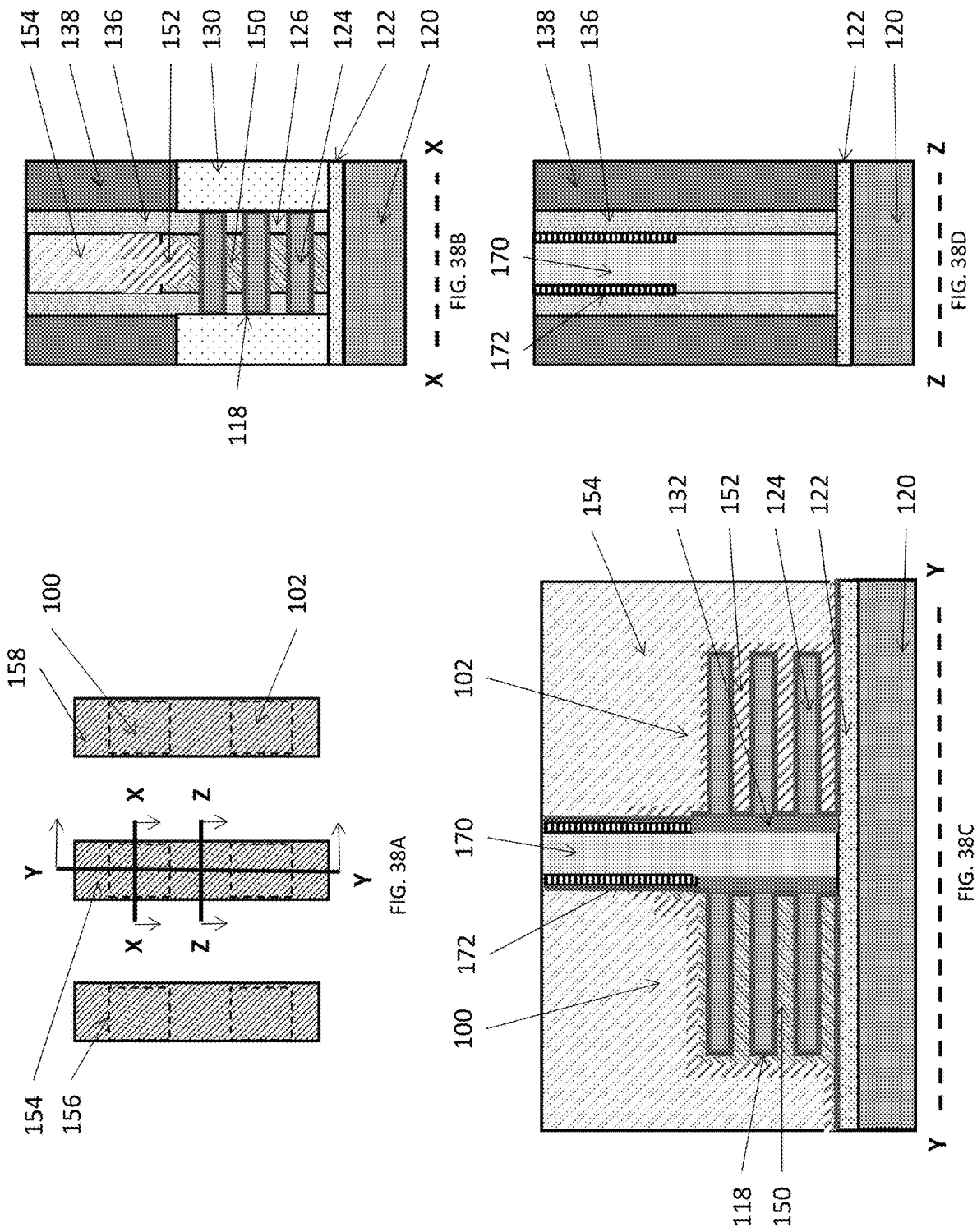

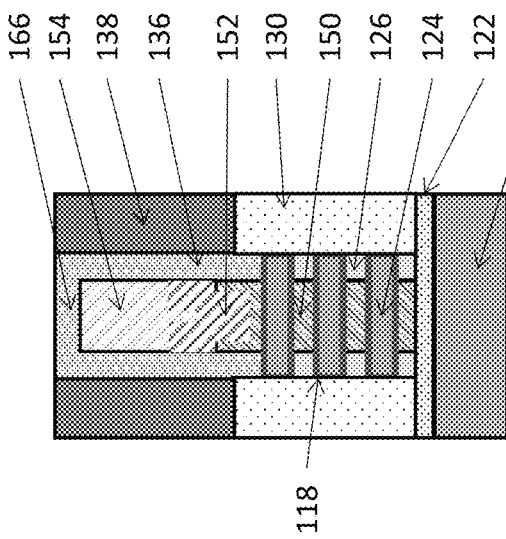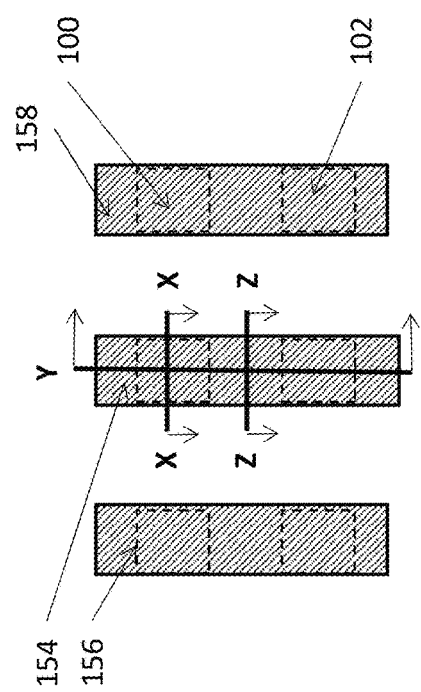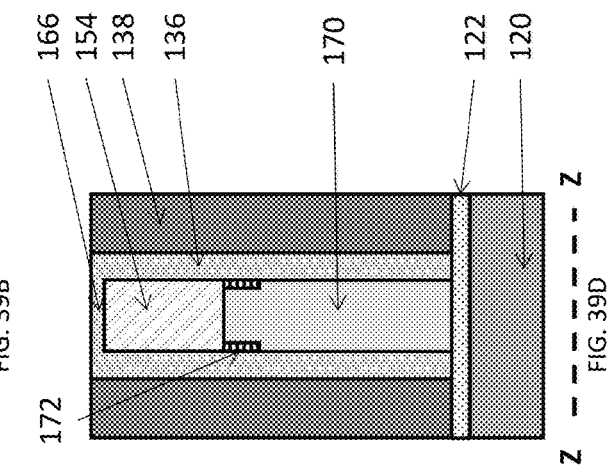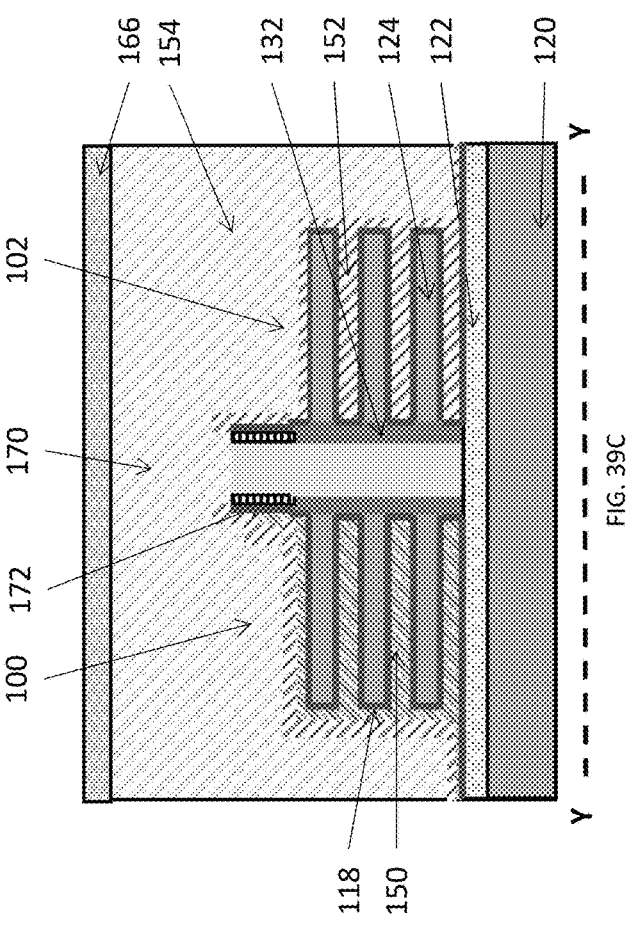

NANOSHEET FIELD EFFECT TRANSISTOR WITH SPACERS BETWEEN SHEETS

BACKGROUND

Field of the Invention

The present invention relates to integrated circuits (IC) and, more particularly, to methods for forming an IC that includes at least one nanosheet field effect transistor, and to IC structures formed according to such methods.

Description of Related Art

Integrated circuit (IC) design is constantly improving. For example, recently to improve device drive current and electrostatics and to allow for further device size scaling multi-gate field effect transistors (FETs) (e.g., nanowire-type FETs or nanosheet-type FETs) were developed. A multi-gate FET includes elongated nanoshape(s) (e.g., nanowires or nanosheets), which extend laterally between source/drain regions, and a gate structure, which wraps around the nanoshape(s) (i.e., which is adjacent to the top, bottom and two opposing sides of the each nanoshape) such that the nanoshape(s) function as channel region(s).

SUMMARY

Various methods herein alternately grow layers of a first material and channel structures into a multi-layer structure. The multi-layer structure is then patterned into sheets. Further, these methods form sacrificial gates intersecting the sheets. Such methods pattern the sheets using the sacrificial gates to create stacks of alternating layers of the first material and the channel structures.

Also, these methods form openings in the sacrificial gates between the stacks, form spacers in the openings, and removing the sacrificial gates to leave the spacers. The first material is then removed from between the channel structures. Such methods also form a first work function metal around and between the channel structures. Next, first stacks (of the stacks) are protected with a mask to leave second stacks (of the stacks) exposed. Then, these methods remove the first work function metal from the second stacks while the first stacks are protected by the mask and the spacers. Subsequently, the methods herein form a second work function metal around and between the channel structures of the second stacks. A gate material is then formed over the first work function metal and the second work function metal.

When forming the spacers in the openings, some methods herein form first spacers in the lower portion of the openings, narrow the upper portion of the openings, and then form second spacers in the upper portion of the openings. In such embodiments, the second spacers are removed before the gate material is formed.

In some methods herein, the gate material is formed laterally adjacent to the spacers with the spacers in place. Also, some methods herein form the openings over a portion of second stacks such that the spacers are subsequently formed over a portion of the second stacks. These methods can alternatively form the openings into a portion of second stacks, such that the spacers are subsequently formed to extend into a portion of the second stacks. Thus, for example, methods herein can form the openings into a portion of at least one of the channel structures such that the spacers are subsequently formed to extend into at least one of the channel structures.

Such methods produce various devices, such as ones that include first and second transistors on a substrate. The first transistor includes (among other components) first source/drain structures extending in a first direction (e.g., vertically) from the substrate, first planar channel structures extending in a second direction (e.g., horizontally) between the first source/drain structures, and first gate structures between and wrapped around each of the first planar channel structures, where the first gate structures is a first work function metal. The second transistor similarly includes (among other components) second source/drain structures extending in the first direction from the substrate, second planar channel structures extending in the second direction between the second source/drain structures, and second gate structures between and wrapped around the second planar channel structures, wherein the second gate structures have a second work function metal that is different from the first work function metal.

Further, a spacer is between the first planar channel structures and the second planar channel structures and liners extend from the substrate in the first direction on opposite sides of the spacer. The liners separate the first planar channel structures and the second planar channel structures from the spacer. The first planar channel structures and the second planar channel structures extend a first distance from the substrate, and the spacer can extend the same first distance from the substrate, or can extend more than that first distance from the substrate. Some structures herein can include sidewall spacers lining a portion of the spacer that extends more than the first distance from the substrate. In some structures herein, the spacer extends over a portion of the first transistor in the second direction, in other structures herein the spacer extends into a portion of the first transistor where, for example, the spacer extends into a portion of at least one of the planar channel structures.

BRIEF DESCRIPTION OF THE DRAWINGS

The embodiments herein will be better understood from the following detailed description with reference to the drawings, which are not necessarily drawn to scale and in which:

FIG. 1A is a top (plan) view conceptual schematic diagram of an integrated circuit structure according to embodiments herein;

FIG. 1B is a cross-sectional view conceptual schematic diagram along line X-X in FIG. 1A of an integrated circuit structure according to embodiments herein;

FIG. 1C is a cross-sectional view conceptual schematic diagram along line Y-Y in FIG. 1A of an integrated circuit structure according to embodiments herein;

FIG. 1D is a cross-sectional view conceptual schematic diagram along line Z-Z in FIG. 1A of an integrated circuit structure according to embodiments herein;

FIGS. 2A-2D are conceptual schematic diagrams of manufacturing stages of integrated circuit structures corresponding the views shown in FIG. 1A-1D, respectively;

FIGS. 3A-3D are conceptual schematic diagrams of manufacturing stages of integrated circuit structures corresponding the views shown in FIG. 1A-1D, respectively;

FIGS. 6A-6D are conceptual schematic diagrams of manufacturing stages of integrated circuit structures corresponding the views shown in FIG. 1A-1D, respectively;

FIGS. 8A-8D are conceptual schematic diagrams of manufacturing stages of integrated circuit structures corresponding the views shown in FIG. 1A-1D, respectively;

FIGS. 11A-11D are conceptual schematic diagrams of manufacturing stages of integrated circuit structures corresponding the views shown in FIG. 1A-1D, respectively;

FIGS. 12A-12D are conceptual schematic diagrams of manufacturing stages of integrated circuit structures corresponding the views shown in FIG. 1A-1D, respectively;

FIGS. 13A-13D are conceptual schematic diagrams of manufacturing stages of integrated circuit structures corresponding the views shown in FIG. 1A-1D, respectively;

FIGS. 14A-14D are conceptual schematic diagrams of manufacturing stages of integrated circuit structures corresponding the views shown in FIG. 1A-1D, respectively;

FIGS. 16A-16D are conceptual schematic diagrams of manufacturing stages of integrated circuit structures corresponding the views shown in FIG. 1A-1D, respectively;

FIGS. 17A-17D are conceptual schematic diagrams of manufacturing stages of integrated circuit structures corresponding the views shown in FIG. 1A-1D, respectively;

FIG. 18 is a flow diagram illustrating embodiments herein;

FIGS. 19A-19D are conceptual schematic diagrams of manufacturing stages of integrated circuit structures corresponding the views shown in FIG. 1A-1D, respectively;

FIGS. 21A-21D are conceptual schematic diagrams of manufacturing stages of integrated circuit structures corresponding the views shown in FIG. 1A-1D, respectively;

FIGS. 22A-22D are conceptual schematic diagrams of manufacturing stages of integrated circuit structures corresponding the views shown in FIG. 1A-1D, respectively;

FIGS. 23A-23D are conceptual schematic diagrams of manufacturing stages of integrated circuit structures corresponding the views shown in FIG. 1A-1D, respectively;

FIGS. 25A-25D are conceptual schematic diagrams of manufacturing stages of integrated circuit structures corresponding the views shown in FIG. 1A-1D, respectively;

FIGS. 26A-26D are conceptual schematic diagrams of manufacturing stages of integrated circuit structures corresponding the views shown in FIG. 1A-1D, respectively;

FIGS. 28A-28B are conceptual schematic diagrams of manufacturing stages of integrated circuit structures corresponding the views shown in FIG. 1A-1D, respectively;

FIGS. 30A-30D are conceptual schematic diagrams of manufacturing stages of integrated circuit structures corresponding the views shown in FIG. 1A-1D, respectively;

FIGS. 33A-33D are conceptual schematic diagrams of manufacturing stages of integrated circuit structures corresponding the views shown in FIG. 1A-1D, respectively;

FIGS. 34A-34D are conceptual schematic diagrams of manufacturing stages of integrated circuit structures corresponding the views shown in FIG. 1A-1D, respectively;

FIGS. 35A-35D are conceptual schematic diagrams of manufacturing stages of integrated circuit structures corresponding the views shown in FIG. 1A-1D, respectively;

FIGS. 37A-37D are conceptual schematic diagrams of manufacturing stages of integrated circuit structures corresponding the views shown in FIG. 1A-1D, respectively;

FIGS. 38A-38D are conceptual schematic diagrams of manufacturing stages of integrated circuit structures corresponding the views shown in FIG. 1A-1D, respectively;

FIGS. 39A-39D are conceptual schematic diagrams of manufacturing stages of integrated circuit structures corresponding the views shown in FIG. 1A-1D, respectively.

DETAILED DESCRIPTION

Figure 4B:
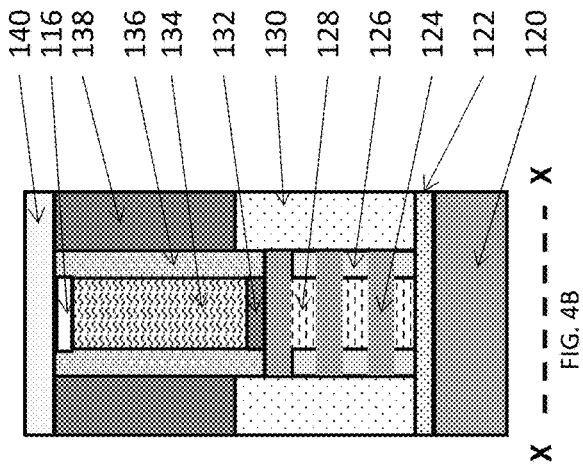
FIGS. 4A-4D are conceptual schematic diagrams of manufacturing stages of integrated circuit structures corresponding the views shown in FIG. 1A-1D, respectively.
Figure 4D:
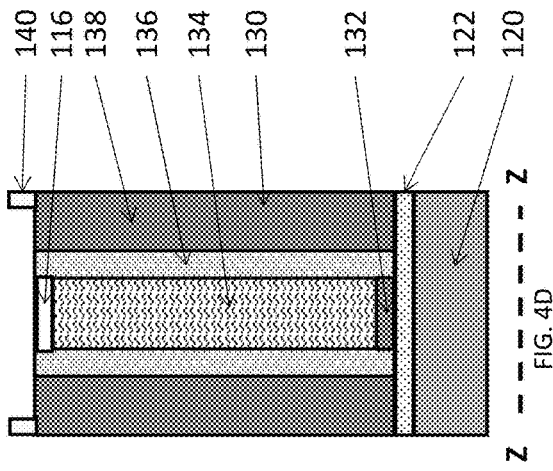
Figure 4A:
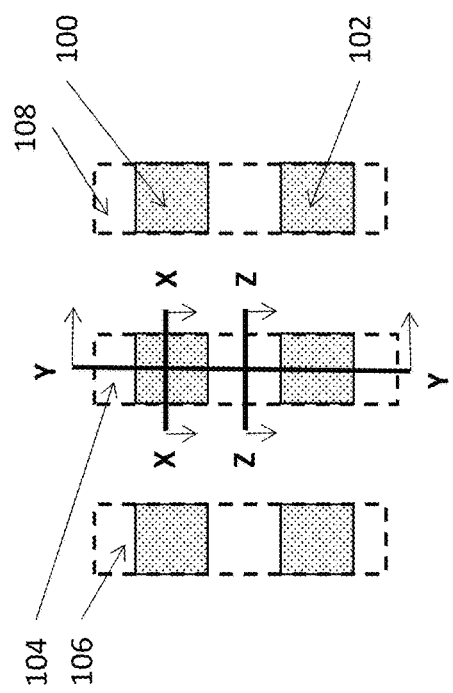
Figure 4C:
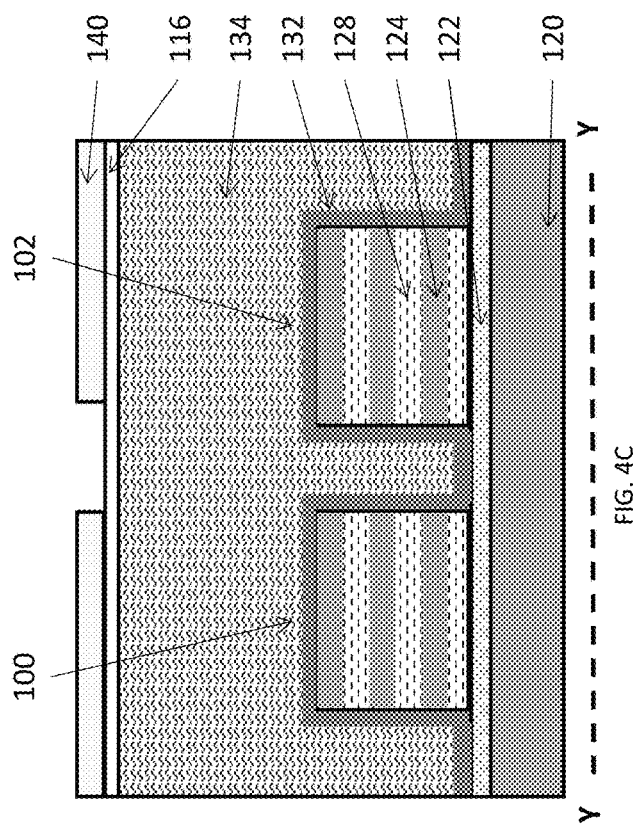
Figure 5B:
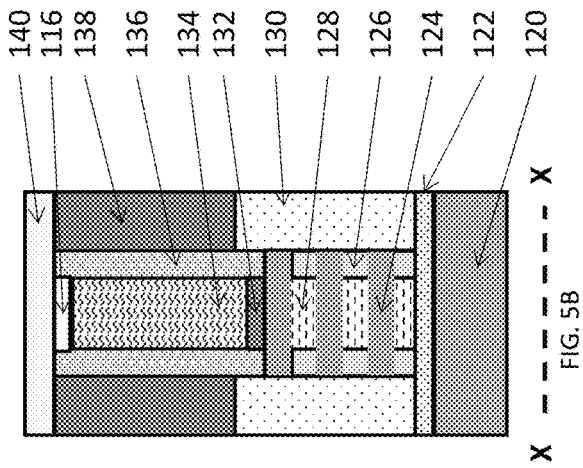
FIGS. 5A-5D are conceptual schematic diagrams of manufacturing stages of integrated circuit structures corresponding the views shown in FIG. 1A-1D, respectively.
Figure 5D:
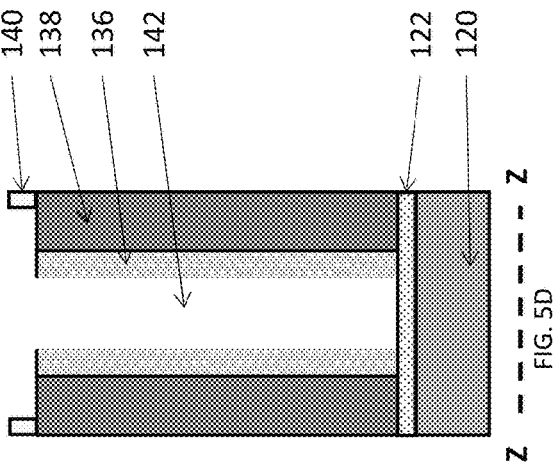
Figure 5A:
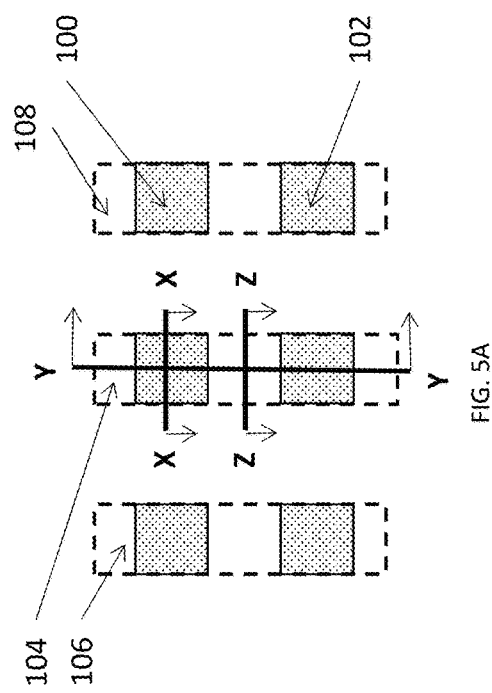
Figure 5C:
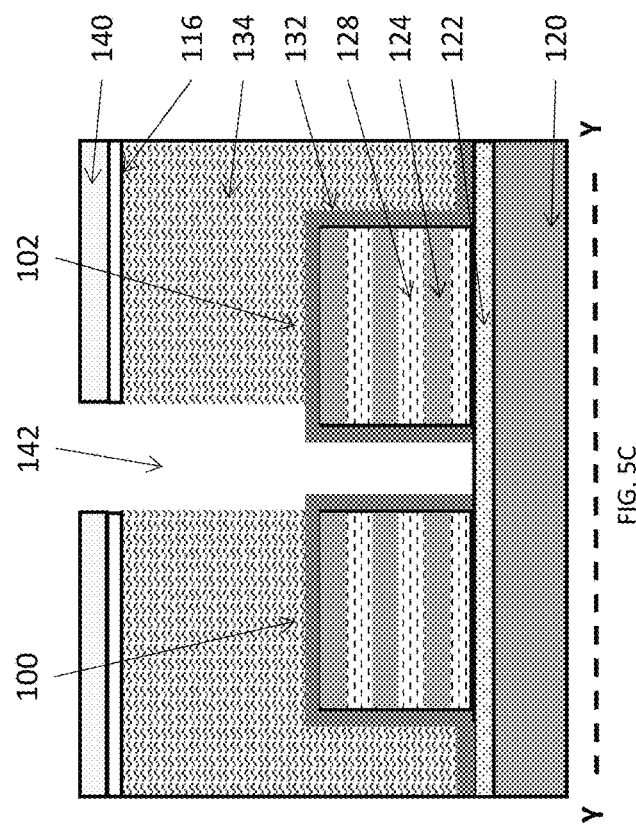
Figure 7A:
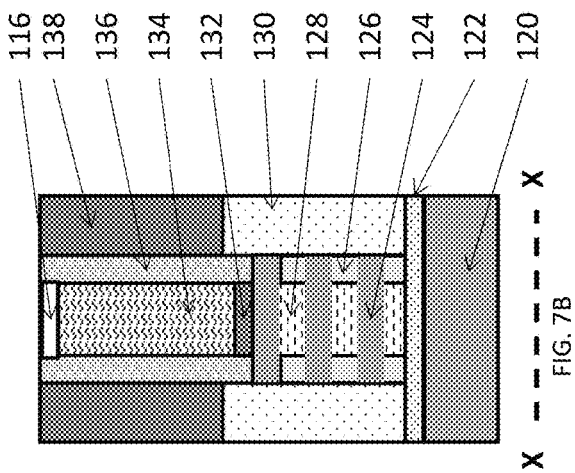
FIGS. 7A-7D are conceptual schematic diagrams of manufacturing stages of integrated circuit structures corresponding the views shown in FIG. 1A-1D, respectively.
Figure 7B:
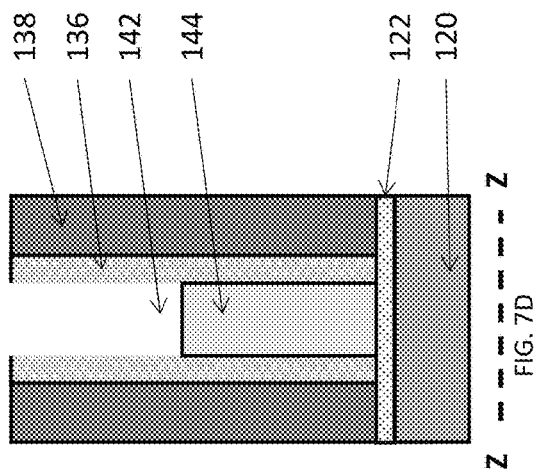
Figure 7D:
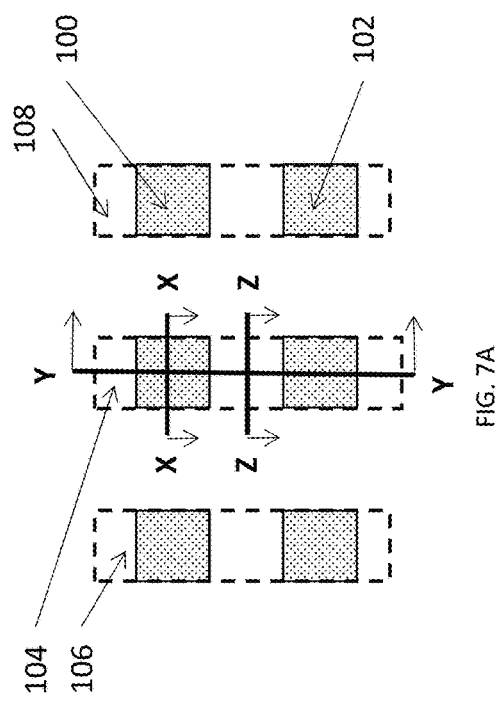
Figure 7C:
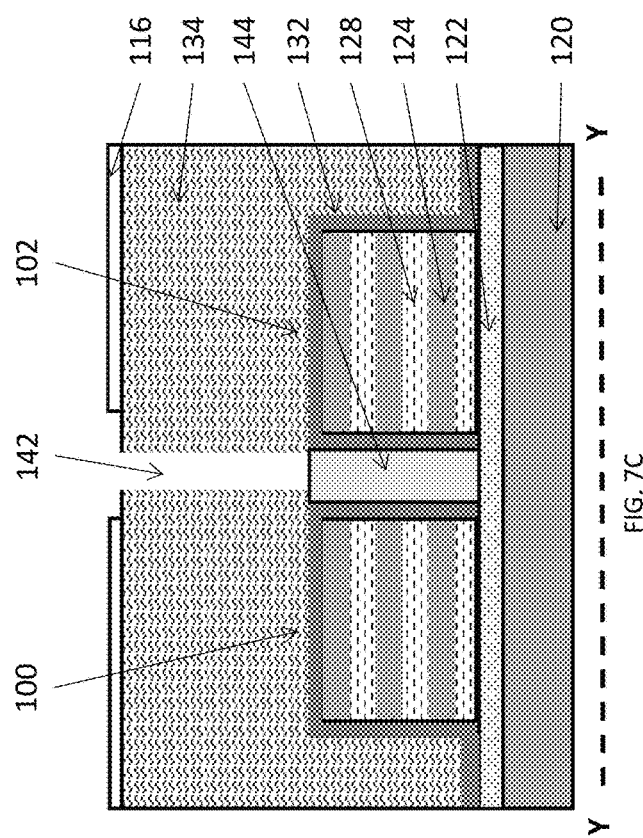
Figure 9B:
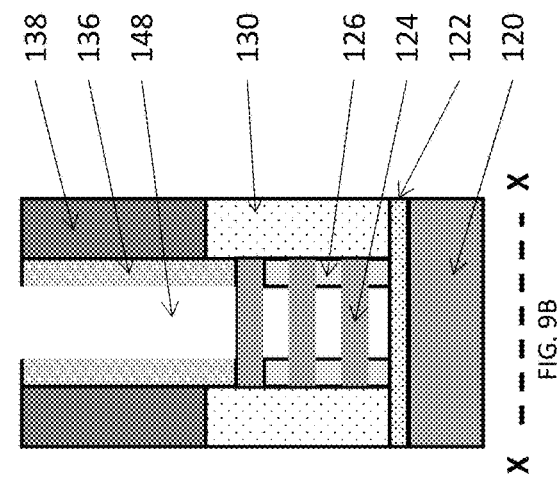
FIGS. 9A-9D are conceptual schematic diagrams of manufacturing stages of integrated circuit structures corresponding the views shown in FIG. 1A-1D, respectively.
Figure 9D:
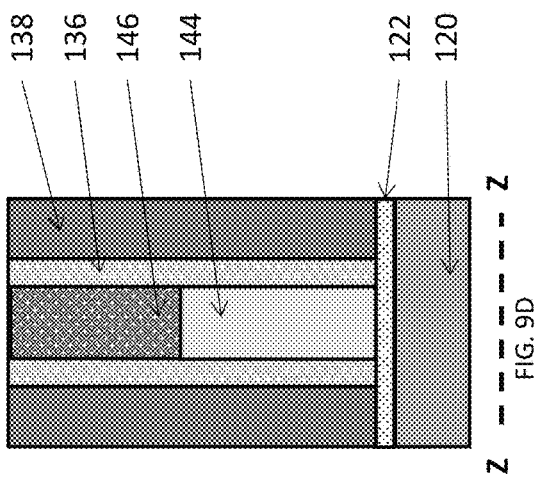
Figure 9A:
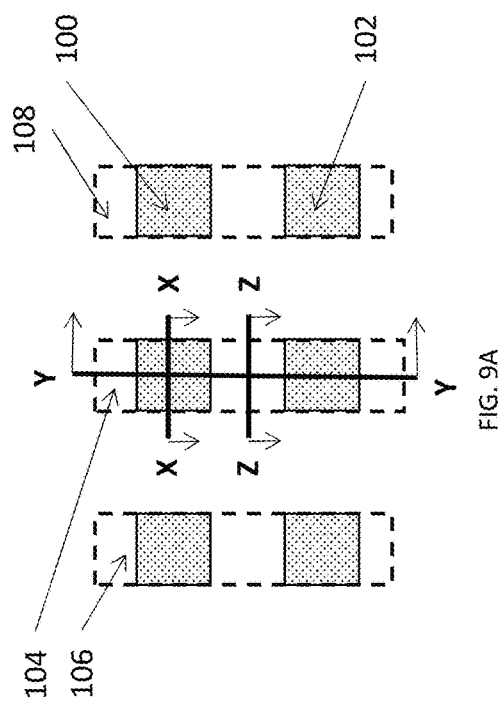
Figure 9C:
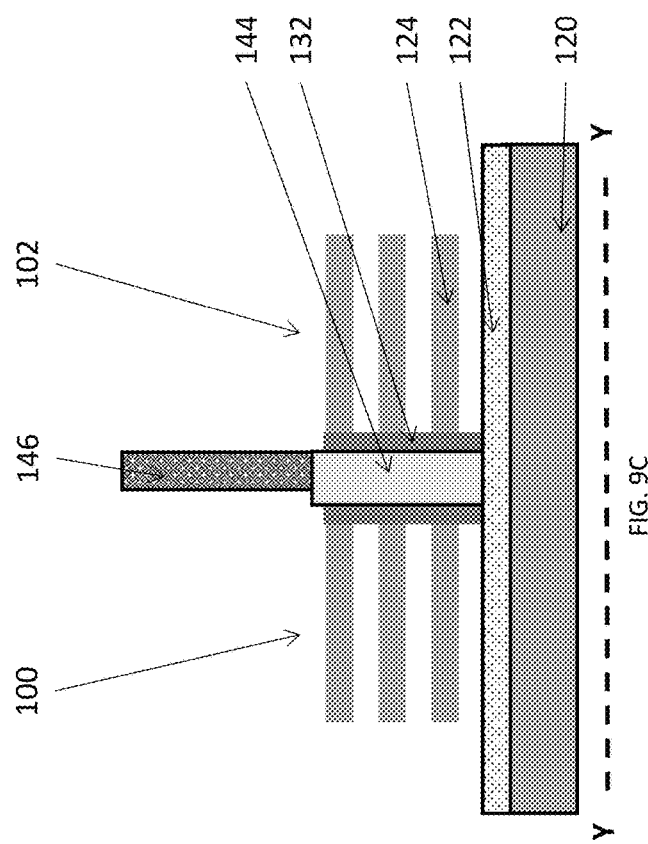
Figure 10A:
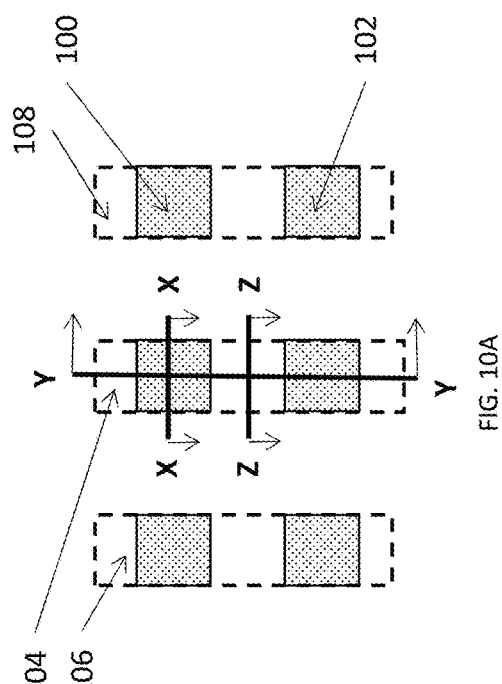
FIGS. 10A-10D are conceptual schematic diagrams of manufacturing stages of integrated circuit structures corresponding the views shown in FIG. 1A-1D, respectively.
Figure 10B:
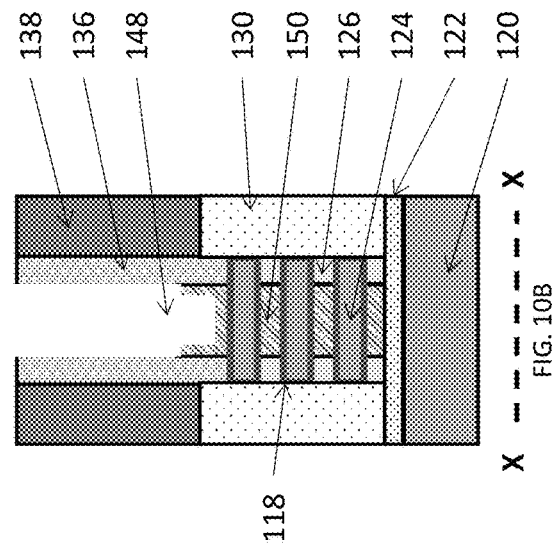
Figure 10C:
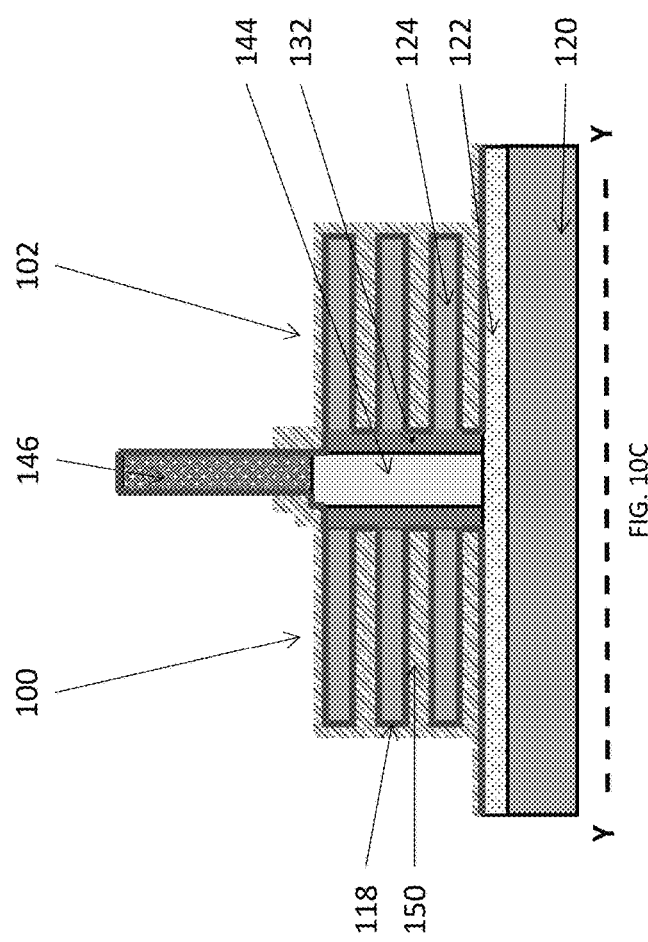
Figure 10D:
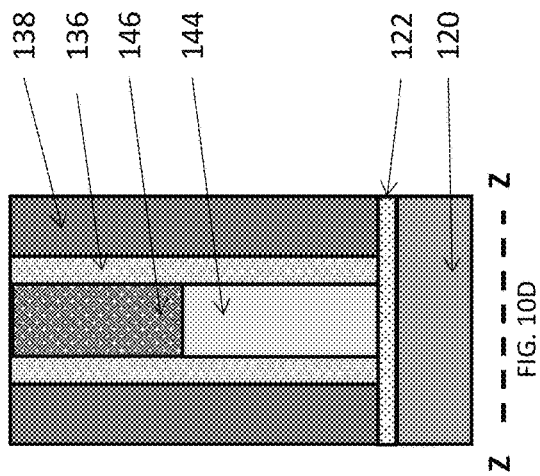

As mentioned above, to allow for further device size scaling, nanowire-type or nanosheet-type multi-gate transistors were developed. Specifically, some FET processing techniques begin with a semiconductor substrate of a first semiconductor material and form, on that substrate, a stack of alternating layers of different semiconductor materials. The stack is then patterned into a shape, such as a semiconductor fin. A sacrificial gate is formed on a first portion of the semiconductor fin with second portions of the semiconductor fin extending laterally beyond the sacrificial gate. A gate sidewall spacer can be formed on the sacrificial gate. Subsequently, the exposed portions of the semiconductor fin are selectively removed, and this exposes vertical surfaces of the second semiconductor material the semiconductor fin. The vertical surfaces are etched back, thereby forming shallow cavities. Isolation elements are formed in these cavities, for example, by conformally depositing a thin isolation layer and performing a selective isotropic etch process to remove any of the isolation layer material that is outside the cavities. Next, epitaxial source/drain regions are grown adjacent to exposed vertical surfaces of the first semiconductor material in the first portion of the semiconductor fin.

Note that the drawings illustrate, as one example, complementary multi-gate field effect transistors (FETs) that can include nanowire-type field effect transistors (NWFETs) and nanosheet-type field effect transistors (NSFETs). For purposes of this disclosure, an elongated semiconductor nanoshape (NS) refers to a feature having a length that is relatively long as compared to its thickness (also referred to herein as its height) and/or its width (also referred to herein as its depth) and further having its thickness and/or its width dimensions constrained to tens of nanometers or less (i.e., constrained to 100 nm or less, for example, to approximately 5-8 nm). Nanoshapes include nanowires, nanosheets and nanofins. Specifically, a nanowire (NW) refers to a nanoshape having both its thickness (or height) and its width (or depth) dimensions constrained to tens of nanometers or less (i.e., constrained to 100 nm or less, for example, to approximately 5-8 nm) and having the ratio of the thickness dimension to the width dimension being, for example, approximately 1 to 1. That is, a nanowire is relatively narrow and short. A multi-gate FET that includes NW(s) as channel region(s) is referred to herein as a nanowire-type FET (NWFET). A nanosheet (NS) refers to a nanoshape having only its thickness dimension (or height) constrained to tens of nanometers or less (i.e., constrained to 100 nm or less, for example, to approximately 5-8 nm) and having the ratio of the width (or depth) dimension to the thickness (or height) dimension being, for example, significantly over 1 to 1 (e.g., 2 to 1, 5 to 1, 10 to 1, 100 to 1, etc.). That is, a nanosheet is relatively wide and short. A multi-gate FET that includes NS(s) as channel region(s) is referred to herein as a nanosheet-type FET (NSFET). A nanofin refers to a nanoshape having only its width (or depth) dimension constrained to tens of nanometers or less (i.e., constrained to 100 nm or less, for example, to approximately 5-8 nm) and having the ratio of the width (or depth) dimension to the thickness (or height) dimensions being, for example, significantly less than 1 to 1 (e.g., 1 to 2, 1 to 5, 1 to 10, 1 to 100, etc.). That is, a nanofin is relatively narrow and tall. Fin-type FETs (FINFETs) can include one or more nanofins as channel region(s).

When different work function metals (WFMs) are used for complementary multi-gate FETs, the process of removing one of the work function metals (e.g., before forming another work function metal) can result in undesirable damage to the work function metal of one of the transistors. In view of the foregoing, disclosed herein are methods for forming an integrated circuit (IC) structure having at least one multi-gate field effect transistor and, for example, at least one nanowire-type field effect transistor (NWFET) with a spacer between sheets to protect the WFM.

For example, referring to the accompanying drawings, FIG. 1A is a top (plan) view conceptual schematic diagram of an integrated circuit structure according to embodiments herein, FIG. 1B is a cross-sectional view conceptual schematic diagram along line X-X in FIG. 1A, FIG. 1C is a cross-sectional view conceptual schematic diagram along line Y-Y in FIG. 1A, and FIG. 1D is a cross-sectional view conceptual schematic diagram along line Z-Z in FIG. 1A. The following A-D drawings of the remaining Figures show similar views. More specifically, FIGS. 1A-1D conceptually show a multi-layer structure 110, and the top view in FIG. 1A illustrates an unpatterned multi-layer structure 110 and locations 104, 106, 108 illustrate locations where sacrificial and metal gates will be formed over the structure 110. Note that the "A" Figures of FIGS. 1A-17A, 19A-23A, 25A-30A, and 32A-39A are simplified drawings that only illustrate the locations of sheets or sheet portions 100, 102, and locations of gates 104, 106, 108, and such "A" Figures are only utilized to show such positions, and not device components (which are instead shown in the corresponding "B-D" Figures in each set of Figures).

FIGS. 1A-1D also illustrate that methods herein provide a semiconductor substrate 120. The semiconductor substrate 120 can be, for example, a bulk semiconductor substrate made of a first semiconductor material. This first semiconductor material can be, for example, monocrystalline silicon. Alternatively, the semiconductor substrate 120 can be the semiconductor layer of a semiconductor-on-insulator structure. A dielectric isolation layer 122 can be formed on the substrate 120. Note that having the isolation layer 122 is just an option here. For example, it could be chosen not to have isolation layer 122, and instead to form shallow trench isolation regions in the substrate 120 on opposite sides of the sheet stacks, or an isolation layer can be formed in the later stage of the process flow.

Alternating layers of a second semiconductor material 128 and a first semiconductor material 124 can be formed on the dielectric isolation layer 122 or directly on the substrate 120 if a dielectric isolation layer 122 is not utilized. That is, an initial layer of the second semiconductor material 128 can be immediately adjacent to the top surface of the substrate 120 or dielectric isolation layer 122, an initial layer of the first semiconductor material 124 can be on the initial layer of the second semiconductor material 128, another layer of the second semiconductor material 128 can be on the initial layer of the first semiconductor material 124, and so on.

These alternating layers of different semiconductor materials can be formed by, for example, deposition or epitaxial growth. The first semiconductor material 124 can, as mentioned above, be monocrystalline silicon. The second semiconductor material 128 can be monocrystalline silicon germanium or any other suitable semiconductor material, which can be used to grow monocrystalline silicon, and which can be selectively etched away from monocrystalline silicon during subsequent processing.

For purposes of illustration, the multi-layer stack 110 is shown in FIGS. 1A-1D as having a specific number of layers; however, it should be understood that the figures are not intended to be limiting and that, alternatively, the multi-layer stack could include any number of layers necessary for a specific application. Additionally, it should be noted that the thickness of all of the layers in the multi-layer stack 110 should be equal to the desired height of the elongated nanoshape(s), which will form the channel region(s) of multi-gate FETs. Furthermore, the thickness of each of the layers of the second semiconductor material 128 should be equal to the desired substrate to channel region or channel region to channel region spacing.

For purposes herein, a "semiconductor" is a material or structure that may include an implanted or in situ (e.g., epitaxially grown) impurity that allows the material to sometimes be a conductor and sometimes be an insulator, based on electron and hole carrier concentration. As used herein, "implantation processes" can take any appropriate form (whether now known or developed in the future) and can be, for example, ion implantation, etc. Epitaxial growth occurs in a heated (and sometimes pressurized) environment that is rich with a gas of the material that is to be grown.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of $SiO_2$ and $Si_3N_4$, and metal oxides like tantalum oxide. The thickness of dielectrics herein may vary contingent upon the required device performance.

FIGS. 2A-2D are conceptual schematic diagrams of another manufacturing stage of the integrated circuit structure corresponding to the views shown in FIG. 1A-1D, respectively. Conventional processing techniques (e.g., lithographic patterning and etch techniques, sidewall image transfer (SIT) techniques, etc.) can be performed in order to pattern the multi-layer structure 110 into fins or sheets 100, 102 such that the resulting semiconductor sheets extend vertically upward from a lower portion of the substrate 120, as shown in FIG. 2C.

For purposes of this disclosure, a fin refers to a thin, long, six-sided shape (that is somewhat rectangular) that extends from, or has a bottom surface that is part of, a substrate; with sides that are longer than they are wide, a top and bottom that have somewhat similar lengths as the sides (but that have widths that are much narrower) and ends that are approximately as tall from the substrate as the width of the sides, but that are only approximately as wide as the top and/or bottom. Rounding and uneven shaping can occur (especially at the corners and top) in such sheet structures, and often such structures have a rounded, tapered shape; however, such structures are highly distinguishable from planar devices (even though both types of devices are highly useful).

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off). A material removal process is then performed (e.g., wet etching, anisotropic etching (orientation dependent etching), plasma etching (reactive ion etching (RIE), etc.)) to remove the unprotected portions of the material below the resist to be patterned. The resist is subsequently removed to leave the underlying material patterned according to the light exposure pattern (or a negative image thereof).

FIGS. 3A-3D show the structure after formation of a dummy oxide liner 132, formation of sacrificial gates 134, a gate hardmask 116, and sidewall spacers 136, patterning of the sheets 100, 102, formation of inner spacers 126, formation of epitaxially formed source/drain structures 130, and formation of inter-layer dielectric (ILD) 138.

More specifically, sacrificial gates 134 with hardmask 116 and sidewall spacers 136 can be formed to intersect the sheets 100, 102. For example, a thin conformal dummy oxide liner 132 can be deposited over the partially completed structure. A blanket sacrificial gate layer 134 can then be deposited onto the conformal dummy oxide layer 132. This blanket sacrificial gate layer 134 can be, for example, a polysilicon layer, an amorphous silicon layer or any other suitable sacrificial gate material that is selectively removable from the semiconductor materials of the sheets 100, 102. A gate hardmask 116 (e.g., silicon dioxide, silicon nitride, etc.) can be formed on the sacrificial gate layer 134 to form a sacrificial gate stack, and the sacrificial gate stack can then be lithographically patterned and etched to form the sacrificial gates 134 (with gate hardmasks 116).

Sidewall spacers (identified using identification number 136) can be formed on the patterned sacrificial gates 134, and can similarly be formed of silicon dioxide, silicon nitride, SiBCN, SiOCN, SiOC, etc. For purposes herein, "sidewall spacers" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as sidewall spacers.

Those skilled in the art will recognize that sacrificial gates 134 with gate hardmasks 116 and gate sidewall spacers 136, as described above, will typically be patterned such that they are spaced evenly across the length of each sheet 100, 102. Thus, as illustrated, each sheet 100, 102 will extend laterally from a sacrificial gate 134 to another sacrificial gate 134. As discussed in greater detail below, adjacent sacrificial gates 134 are used to configure epitaxial source/drain formation.

The exposed second portions of the sheets 100, 102 not protected by the sacrificial gates and sidewall spacers can then be selectively removed using, for example, an anisotropic etch process, wherein the etch chemistries used are selective for the materials of the sheets over the adjacent materials; and this effectively creates somewhat rectangular structures that are sometimes referred to herein as "stacks" or nanosheets for simplicity of description, as shown in FIG. 3A. Note that the stacks use the same numbering as the sheets (100, 102) because they are portions of the sheets 100, 102, and for numbering consistency throughout the drawings. This process of removing portions of the sheets 100, 102, creates source/drain openings that are located between the sacrificial gates 134 and laterally adjacent to the stacks 100, 102 (the remaining portions of the sheets 100, 102). Thus, the remaining portions of each sheet 100, 102 are positioned laterally between a pair of source/drain openings.

With such source/drain openings, vertical surfaces of the stacks 100, 102 are exposed in the source/drain openings. The exposed vertical surfaces of the second semiconductor material 128 (not the first semiconductor material 124) can be laterally etched to form shallow cavities that undercut end portions of the layer(s) of the first semiconductor material 124. That is, an isotropic etch process that is selective for the second semiconductor material 128 over the first semiconductor material 124 can be performed to etch back the exposed vertical surfaces of the second semiconductor material 128 only, thereby creating shallow cavities in the sidewalls of the stacks 100, 102. Since the etch process is selective for the second semiconductor material 128 over the first semiconductor material 124, the first semiconductor material 124 remains essentially intact. Theses shallow cavities are then filled with an isolation material to form inner spacers 126. Specifically, to form such isolation elements or inner spacers 126 in the cavities, an isolation layer is conformally deposited over the partially completed structure, filling the cavities and covering the adjacent areas. The isolation layer can be made of one or more layers of dielectric materials. For example, the isolation layer can be made of the first dielectric material (e.g., silicon nitride), the second dielectric material (e.g., silicon dioxide) and/or any other suitable dielectric material. Then, a selective isotropic etch process is performed in order to remove any portion of the isolation layer that is outside the cavities. Furthermore, this selective isotropic etch process can be stopped prior to removal of the isolation layer from the cavities such that inner spacers 126 remain within the cavities (see FIG. 3B).

Epitaxial material can then be deposited into, or grown on or from, the exposed portions of the first semiconductor material 124 in the source/drain openings in order to form source/drain structures 130 that are connected to the structures of the first semiconductor material 124. The epitaxial growth of the material for the source/drain structures 130 is configured along the length of each source/drain region by the sacrificial gate 134/gate sidewall spacer 136.

After the source/drain structures 130 are formed, an inter-layer dielectric (ILD) material (e.g., silicon dioxide) 138 can then be deposited over the partially completed structure and a polishing process (e.g., a chemical mechanical polishing (CMP) process) can be performed down to the gate hardmasks 116 on the sacrificial gates 134.

As shown in FIGS. 4A-4D, these methods then photolithographically pattern a mask 140 to have a mask opening aligned over the gate region that is between the N type and P Type nanosheets. Then, as shown in FIGS. 5A-5D, this processing performs any appropriate material removal process (e.g., etching, etc.) through the mask 140 to form openings 142 in the sacrificial gates 134 between the stacks 100, 102. More specifically, the openings 142 are formed extend completely through the sacrificial gates 134 down to the isolation layer 122. Further, the opening 142 can expose portions of the dummy oxide liner 132 (which protect the stacks 100, 102).

As shown in FIGS. 6A-6D, a lower spacer 144 can be deposited in the bottom of the opening 142. The "bottom" of the opening 142 is the portion (bottom ⅓, ½, ⅔, etc.) of the opening 142 that is adjacent to the isolation layer 122. In some structures, the lower spacer 144 can be an oxide, nitride, etc., that remains unaffected by later-described etching processes used to remove the first work function metal. In some processing herein, the opening 142 can be only partially filled with the lower spacer 144, and in other processing the opening 142 can be filled with the lower spacer and then the lower spacer 144 can be removed until it only remains in the lower portion of the opening 142.

In optional processing shown in FIGS. 7A-7D, the size (width) of the remaining upper portion opening 142 can be reduced, using a number of different processing techniques. The upper portion of the opening 142 is the portion (top ⅓, ½, ⅔, etc.) of the opening 142 that is distal to the isolation layer 122. For example, the width of the opening 142 can be reduced by epitaxially growing additional amounts of the sacrificial gate 134 material within the opening 142. Any excess growth material can be subsequently removed.

Whether the opening 142 is reduced in size or not, in subsequent processing shown in FIGS. 8A-8D, an upper spacer 146 is formed in the upper portion of the opening 142. In some structures, the upper spacer 146 can be an oxide, nitride, etc., that can be selectively removed (e.g., selectively etched) relative to the lower spacer 144. This allows later processing to remove the upper spacer 146 without affecting the lower spacer 144.

Next, as shown in FIGS. 9A-9D, the sacrificial gates 134 (and their gate hardmasks 116), the dummy oxide liner 132, and the second semiconductor material 128 are selectively removed. In one example of such processing, a selective etch can be performed in order to selectively etch away the material of the sacrificial gate layer 134 and gate hardmask 116 over the stacks 100, 102. As mentioned above, formation of the sacrificial gates 134 typically includes deposition of a thin conformal dummy oxide liner 132 prior to deposition and patterning of the sacrificial gate material. This thin conformal dummy oxide liner 132 protects the semiconductor material of the stacks 100, 102 during removal of the sacrificial gates 134 and gate hardmasks 116. Following removal of the sacrificial gates 134 and gate hardmasks 116, this dummy oxide liner 132 can also be removed from the gate openings (e.g., by dilute hydrofluoric acid (DHF), etc.).

Once the sacrificial gates 134, gate hardmasks 116, and dummy oxide liner 132 are removed, the second semiconductor material 128 can be selectively etched away (without affecting the first semiconductor material 124), thereby creating discrete elongated nanoashapes from the remaining first semiconductor material 124. For example, if the first semiconductor material 124 is silicon and the second semiconductor material 128 is silicon germanium, the silicon germanium 128 can be selectively etched relative to the silicon 124 and adjacent dielectric materials using any of the following exemplary processes: a thermal etch process (e.g., using gaseous hydrochloric acid (HCl)), a dry plasma etch process, or a wet etch process with process specifications designed to ensure the selective etch of silicon germanium over silicon and various dielectric materials. Alternatively, any other suitable isotropic selective etch process that selectively etches without affecting silicon germanium 128 could be used. As a result, at least one discrete elongated NW of the first semiconductor material 124 will extend laterally between the sources/drain regions 130, thereby forming channel region.

As shown in FIGS. 10A-10D, such methods also form a gate dielectric 118 and first work function metal 150 by first forming an oxide 118, and then depositing the conformal material around and between such channel structures 124. In one example, a high-k material (e.g., hafnium oxide (HfO2), hafnium zirconium oxide (HfZrO2, zirconium dioxide (ZrO2), hafnium silicon oxynitride (HfSiON), hafnium aluminum oxide compounds (HfAlOx), etc.) is first deposited as a gate oxide 118, if the stack 100 is to become a p-type transistor, it is followed by deposition of the first work function metal 150 suitable for a p-type transistor. For example, the work function metal layer can be a conformal metal or metal alloy material selected to achieve an optimal gate conductor work function, given the conductivity type of the transistors and, for example, can be TiN. After the gate dielectric 118 and WFM 150 have been deposited, a sacrificial layer (such as OPL—not shown) can fill in the gate cavities, followed by partial recess. After that, exposed WFM and gate dielectric 118 on the top portion can be removed, followed by removing the sacrificial layer. In the end, the gate dielectric 118 and WFM is recessed.

Also, in FIGS. 10A-10D, the work function metal layer 150 can optionally be chamfered. The chamfering process can include: depositing a protective fill material onto the work function metal layer 150; recessing the protective fill material; etching away the exposed work function metal material from above the protective fill material such that a maximum height; and removing the protective fill material.

Next, as shown in FIGS. 11A-11D, a mask 160 is patterned to protect first stacks 100 to leave second stacks 102 exposed (e.g., a litho stack, that would be understood by those ordinarily skilled in the art to potentially include an optical polymerization layer (OPL) with an overlying titanium oxide layer as an anti-reflective coating (ARC) layer, followed by a photo resist that can be coated, which can be patterned by lithography, followed by an etching process, where the photo resist and ARC layer may be gone after the etching process)). Then, as shown in FIGS. 12A-12D, these methods remove the first work function metal 150 from the second stacks 102 (without affecting the gate oxide 118) while the first stacks 100 are protected by the mask 160 and the spacers 144, 146. For example, a wet cleaning process or etching process can be used. Note that if the spacers 144, 146 were not in place there is a strong possibility that some of the first work function metal 150 would be removed from the first stacks 100 because of the small amount of room between the stacks 100, 102. In other words, the wet etching that is effective at removing the first work function metal 150 from between the tightly spaced first semiconductor structures 124 of the second stack 102, is also effective at working beneath the mask 160 and undesirably removing the first work function metal 150 from the first stack. However, the materials of the spacers 144, 146 is selected to not be affected by such wet etching processes that are used to remove the first work function metal 150. Therefore, with the spacers 144, 146 present, the first work function metal 150 can be fully removed from the second stack 102, without affecting the first work function metal within the first stack 100.

The mask 160 is removed as shown in FIGS. 13A-13D. Subsequently, as shown in FIGS. 14A-14D, the methods herein form a second work function metal 152 over the first work function metal 150, and around and between the channel structures 124 of the second stacks 102. The second work function metal 152 is different from the first work function metal 150 because the first work function metal 150 is selected to work best with the electrical requirements of a p-type transistor, while the second work function metal is selected to work best with an n-type transistor (such as TiAl, TiC, TiAlC, etc.). Note that both the first work function metal 150 and second work function metal 152 are formed over the first stack 100. After the second WFM 152 has been deposited, similarly, a WFM chamfering process (described above) can be applied to recess the second WFM 152 from the top.

As is understood by those ordinarily skilled in the art, a positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region.

Figure 15A:
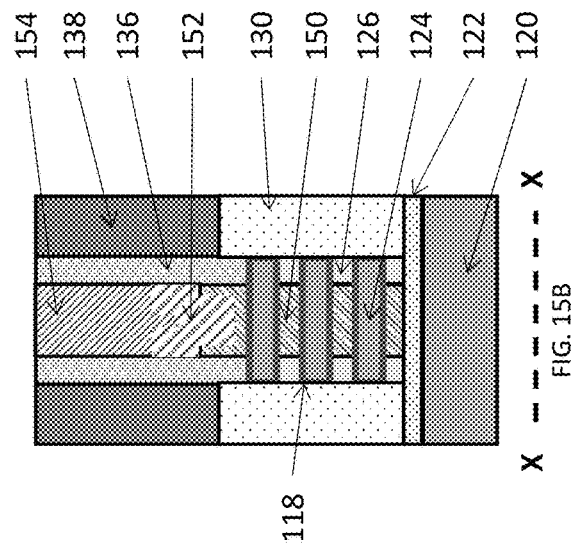
FIGS. 15A-15D are conceptual schematic diagrams of manufacturing stages of integrated circuit structures corresponding the views shown in FIG. 1A-1D, respectively.
Figure 15B:
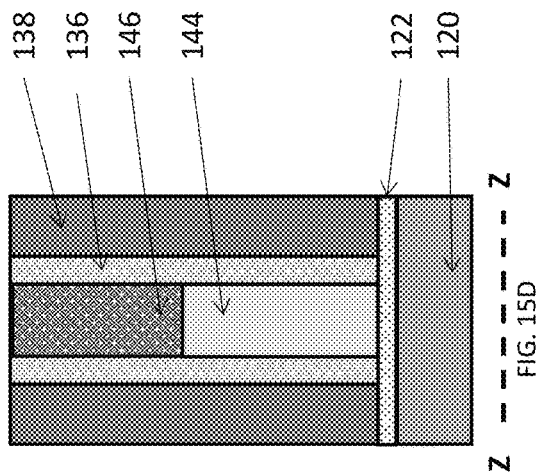
Figure 15C:
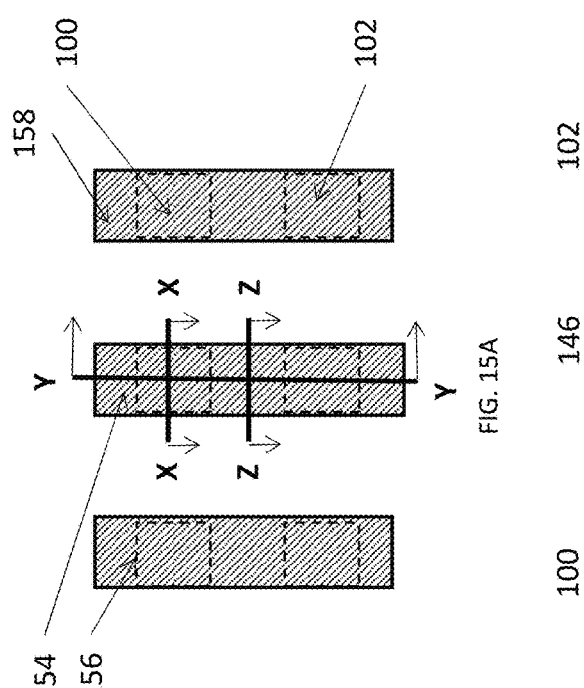
Figure 15D:
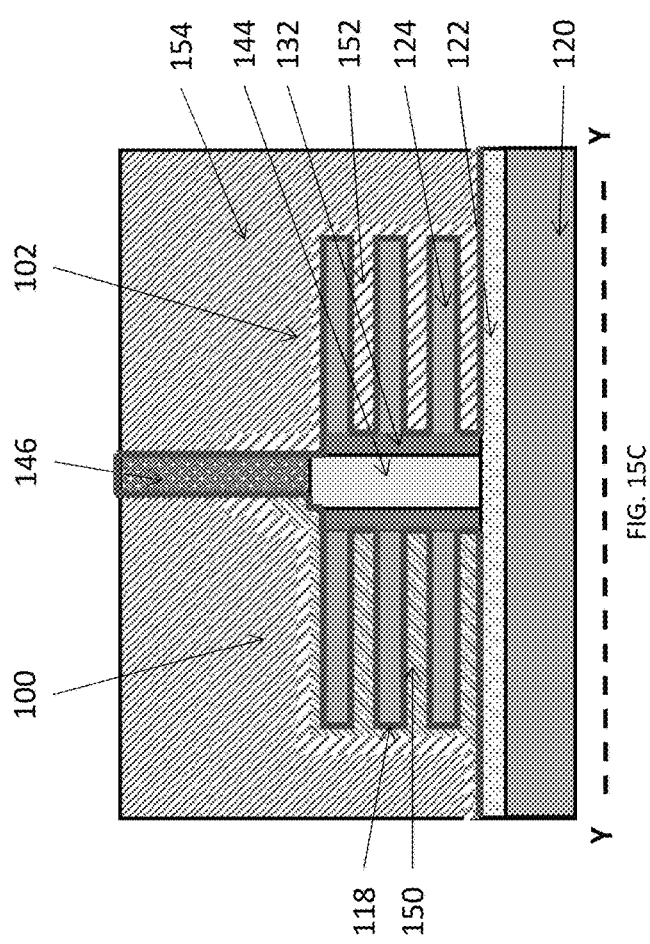
Figure 20B:
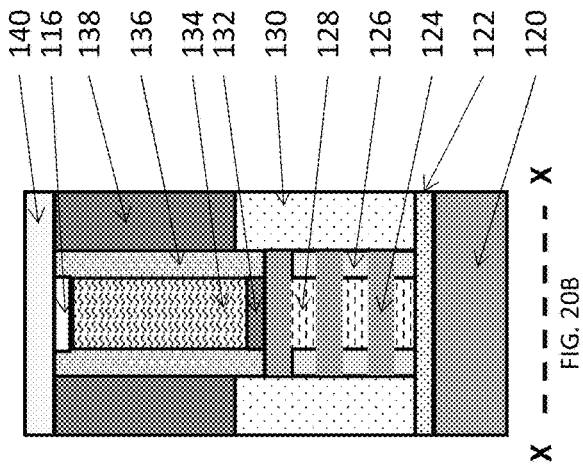
FIGS. 20A-20D are conceptual schematic diagrams of manufacturing stages of integrated circuit structures corresponding the views shown in FIG. 1A-1D, respectively.
Figure 20D:
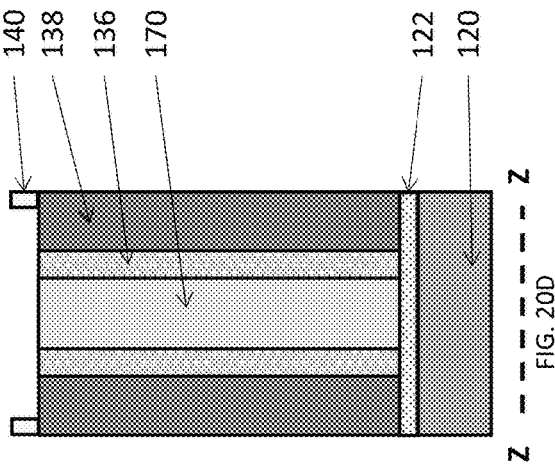
Figure 20A:
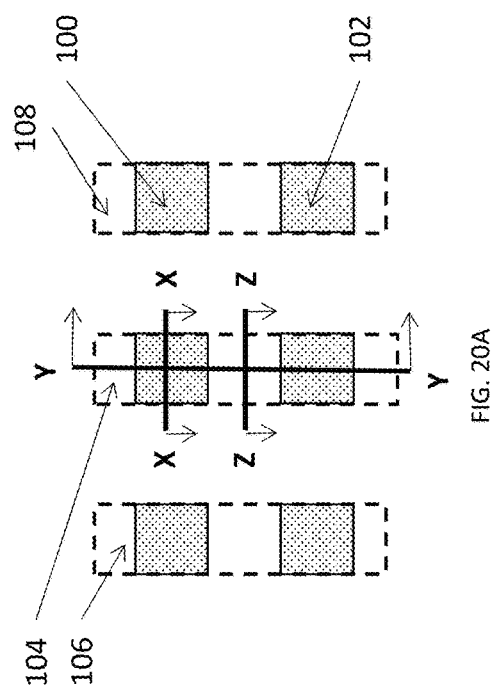
Figure 20C:
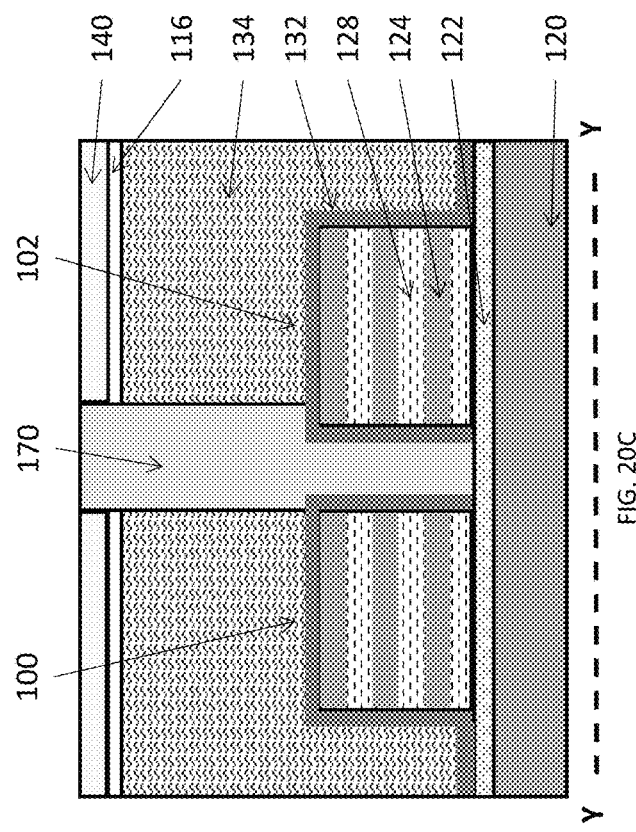

As shown in FIGS. 15A-15D, a gate material 154 is formed over the first work function metal 150 and the second work function metal 152. Such metal gates can include for example tungsten, Ru, Co, any alloys of such metals, and may be deposited using physical vapor deposition, chemical vapor deposition, atomic layer deposition (ALD), or any other technique known in the art. FIG. 15A shows three such parallel metal gates 154, 156, 158, with the underlying stacks 100, 102 being shown using dashed-line rectangles.

In some methods herein, the gate material is formed laterally adjacent to the spacers 144, 146 with the spacers 144, 146 in place, as shown in FIGS. 15A-15D. However, in other alternatives, as shown for example in FIGS. 16A-16D, the upper spacers 146 can be removed selectively to the metal gate 154 and the lower spacers 144, leaving an opening 162. Then, as shown in FIGS. 17A-17D, additional metal gate material 164 can fill in opening 162. After such processing dielectric gate caps 166 can be formed on the top surfaces of the gates 154. For example, the gate material 154 can be recessed (i.e., etched back) and a dielectric cap layer 166 (e.g., a silicon nitride cap layer) can be deposited over the partially completed structure. A polishing process (e.g., a CMP process) can be performed so as to remove any of the dielectric cap material 166 from above the top surface.

Additionally, using any conventional processing, contacts (also referred to as metal plugs) to the source/drain regions 130 can be formed. Specifically, contact openings can be lithographically patterned and etched such that they extend essentially vertically through a second layer of ILD material to the source/drain regions 130. A metallization process can then be performed in order to fill each contact opening with a metal conductor, thereby forming contacts. The metal conductor can include, for example, optional adhesion and/or diffusion barrier layers and one or more layers of metal and/or metal alloy materials (e.g., tungsten, cobalt, nickel, aluminum, copper, or any other suitable conductor material). It should be noted that, optionally, the contact openings can be wider than the source/drain regions 130. In one example, the contacts formed within the contact openings can wrap around the top and side surfaces of the source/drain regions 130 for reduced resistance. Conventional middle of the line (MOL) and back end of the line (BEOL) processing can then be performed in order to complete the IC structure.

As shown in FIGS. 17A-17C, this processing produces various structures, such as ones that include a first transistor 101 and a second transistor 103 on a substrate 120. The first transistor 103 includes (among other components) first source/drain structures 130 extending in a first direction (e.g., vertically) from the substrate 120, first planar channel structures 124 (in stack 100 shown in FIG. 16C) extending in a second direction (e.g., horizontally) between the first source/drain structures 130 (FIG. 17B), and first gate structures 150 (e.g., first work function metal) between and wrapped around each of the first planar channel structures 124 (FIG. 17C). Here, the "first" direction is perpendicular to the "second" direction.

Similarly, the second transistor 103 includes (among other components) second source/drain structures 130 extending in the first direction (e.g., vertically) from the substrate 120, second planar channel structures 124 (in stack 102 shown in FIG. 16C) extending in the second direction (e.g., horizontally) between the second source/drain structures 130, and second gate structures 152 (e.g., second work function metal) between and wrapped around each of the second planar channel structures 124 (FIG. 17C).

Further, FIG. 17C shows that a spacer 144 is between the first planar channel structures (stack 100) and the second transistor (stack 102). Dummy oxide liners 132 extend in the first direction from the substrate 120 on opposite sides of the spacer 144, and such dummy oxide liners 132 separate the first planar channel structures (124 in the first stack 100) and the second planar channel structures (124 in the first stack 102) from the spacer 144. Thus, the dummy oxide liners 132 contact the planar channel structures 124, and the work function metals 150, 152; and the dummy oxide liners 132 electrically separate such items from the spacers 144 (which the dummy oxide liners 132 also contact).

The above exemplary methods are shown in flowchart form in FIG. 18, where in item 202 these methods alternately grow layers of a first material and channel structures into a multi-layer structure. The multi-layer structure is then patterned into sheets in item 204. In item 208, such methods form sacrificial gates intersecting the sheets and pattern the sheets using the sacrificial gates to create stacks of alternating layers of the first material and the channel structures separated by source/drain openings. In item 210, such processing epitaxially grows the source/drain regions.

Also, these methods form openings in the sacrificial gates between the stacks in item 212. As shown in item 214, this processing forms first spacers in the lower portion of the openings between the stacks. In item 216 this processing optionally narrows the openings. Then, in item 218, this processing can form second spacers in the (potentially narrowed) upper portion of the openings.

The sacrificial gates are removed (to leave the upper and lower spacers in place) and the first material is removed from between the channel structures to release the sheets in item 220. Such methods then form a first work function metal around and between the channel structures in item 222. Next, in item 224, first stacks (of the stacks) are protected with a mask to leave second stacks (of the stacks) exposed, and such processing removes the first work function metal from the second stacks (while the first stacks are protected by the mask and the spacers). Subsequently, in item 226, the methods herein form a second work function metal around and between the channel structures of the second stacks. In item 228, a gate material is formed over the first work function metal and the second work function metal. The upper spacers are removed in item 230, and additional gate material is added back in their place in item 232. Caps are formed over the gate material in item 234.

As noted above, FIG. 17C shows that the first transistor 101 and the second transistor 103 extend a first distance from the substrate 120, and the spacer 144 can extend approximately the same first distance from the substrate; however, as shown in later Figures the spacer can extend more than that distance from the substrate. More specifically, in the alternative processing described below, the same processing described above is performed up to the processing shown in FIGS. 5A-5D (however a redundant illustration and discussion of such processing is not repeated here, for brevity) and FIGS. 19A-19D repeat FIGS. 5A-5D to begin one alternative processing operation shown in FIGS. 19A-24. With the partially completed structure shown in FIGS. 19A-19D, this alternative processing completely fills the opening with the same spacer material (e.g., can be an oxide, nitride, etc.) described above, which is identified using numeral 170 in this processing, as shown in FIGS. 20A-20D. As noted previously, excess spacer 170 above the opening 142 can be removed.

Many of the processing steps discussed above are performed (however a redundant illustration and discussion of such processing is not repeated here, for brevity, and only differences are presented in this section of the disclosure) to form the first work function metal 150 and the mask 160, as shown in FIGS. 21A-21D. Further, FIGS. 21A-21D show the previously-explained removal of the first work function metal 150 from the second stack 102, and show how the spacer 170 protects the first stack 100 during such processing. Similarly, FIGS. 22A-22D show the previously-explained processing through formation of the gate material 154 and cap 166. As can be seen in FIGS. 22A-22D, this alternative processing results in portions of the spacer 170 and dummy oxide liner 132 extending over a portion of the stack 102 in the second direction. FIGS. 23A-23D illustrate the structure after additional processing including steps where the spacer 170 is partially recessed, then additional gate metal 154 is formed to fill in the recess, and before forming a cap 166, the gate metal 154 can be recessed.

Figure 24:
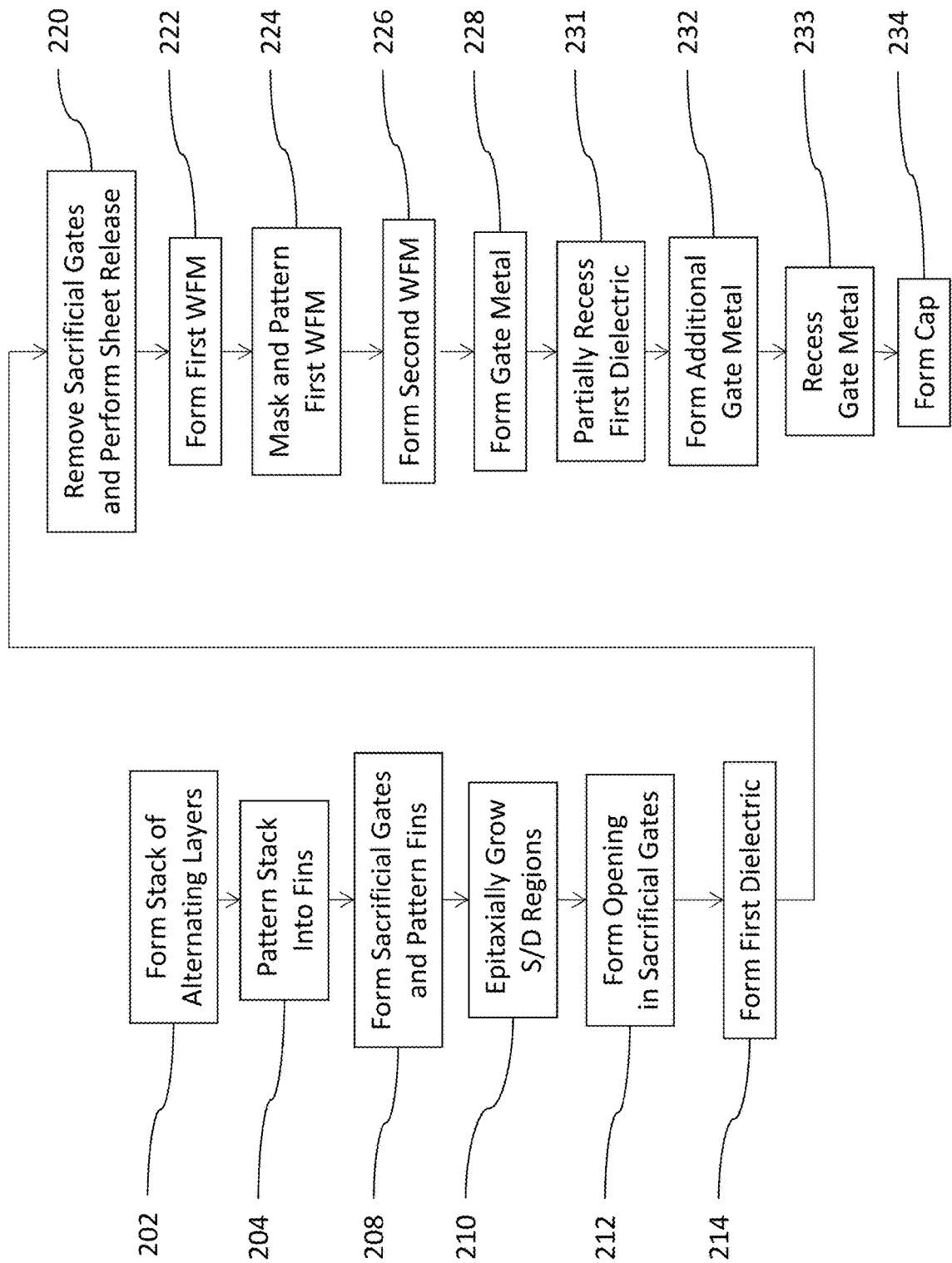
FIG. 24 is a flow diagram illustrating embodiments herein.
Figure 27A:
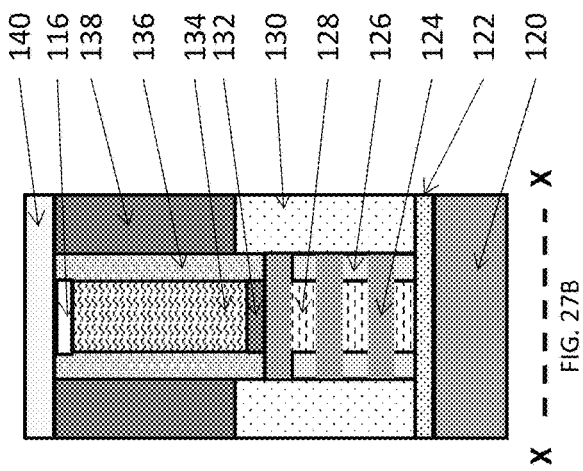
FIGS. 27A-27D are conceptual schematic diagrams of manufacturing stages of integrated circuit structures corresponding the views shown in FIG. 1A-1D, respectively.
Figure 27B:
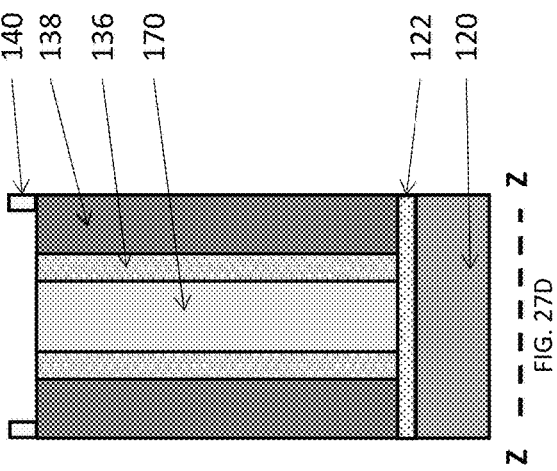
Figure 27C:
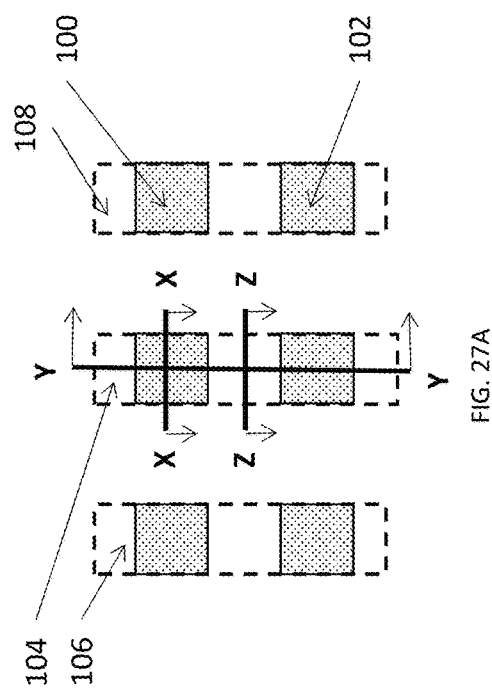
Figure 27D:
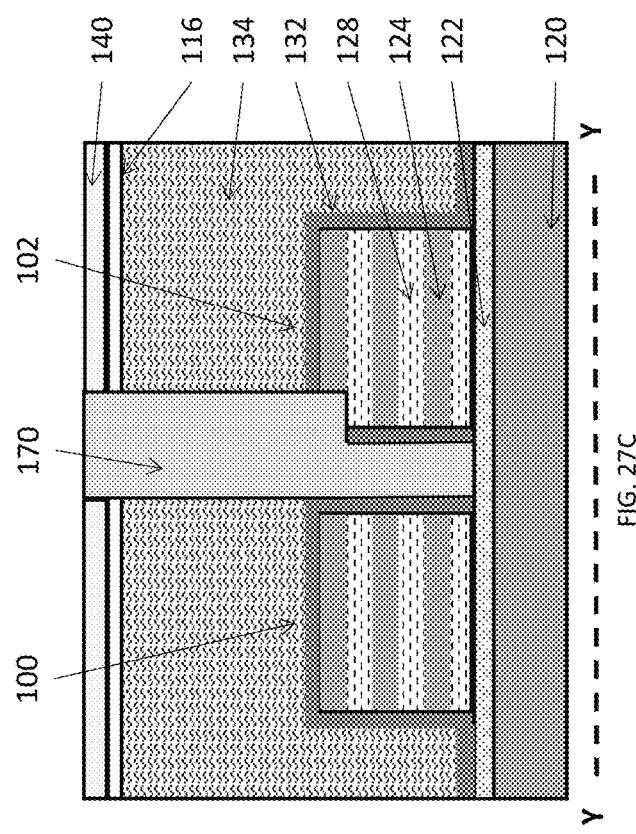
Figure 29A:
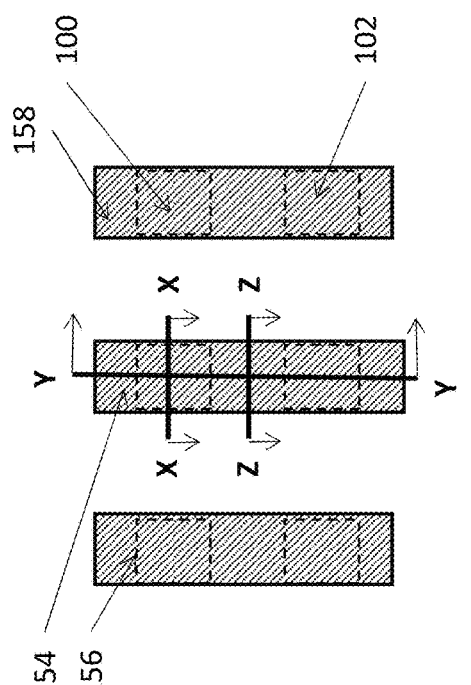
FIGS. 29A-29B are conceptual schematic diagrams of manufacturing stages of integrated circuit structures corresponding the views shown in FIG. 1A-1D, respectively.
Figure 29B:
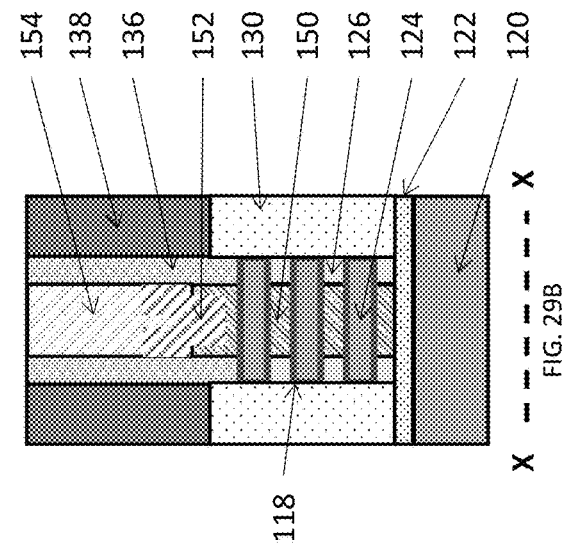
Figure 29D:
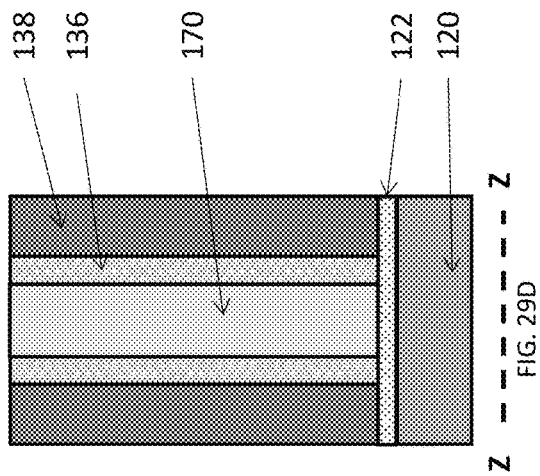
Figure 29C:
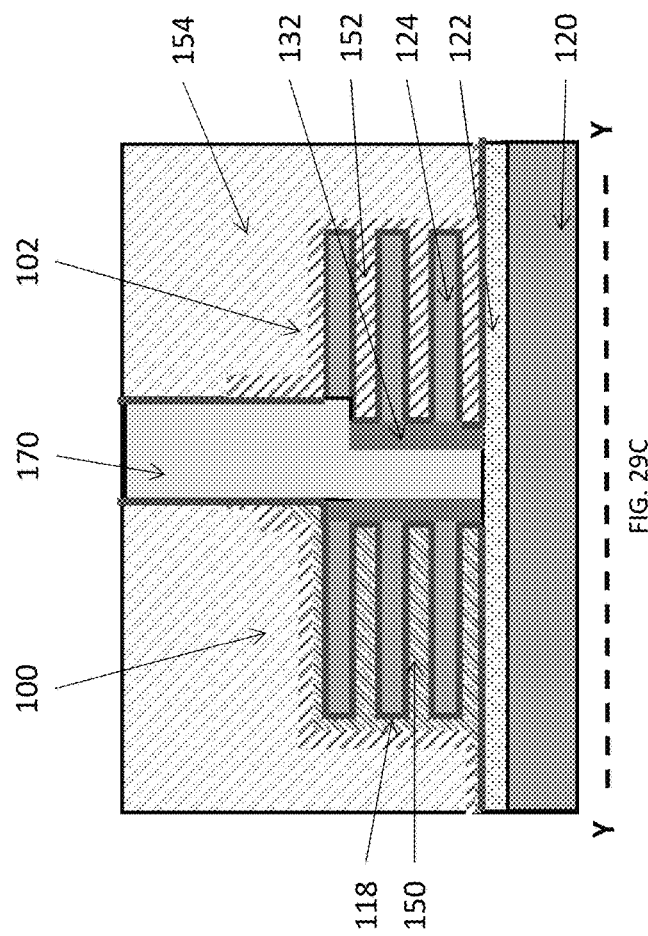

FIG. 24 is a flowchart that is similar to the flowchart shown in FIG. 18 that shows the processing performed in this alternative processing arrangement to result in the structure shown in FIGS. 22A-22D (and, again, a redundant illustration and discussion of such processing is not repeated here, for brevity). The previously-explained processing discussed above is performed in items 202-214, 220-228, and 234 in FIG. 24 (and such redundant discussion is not repeated here); however, processing discussed above in steps 216-218 and 230 are not performed. Instead, the first dielectric (first spacer) formed in item 214 in FIG. 24 completely fills the opening formed in item 212, rather than only partially filling the opening as described previously. Also, in this alternative processing, in item 231 the first dielectric is partially recessed, then the additional gate metal is formed to fill in the recess in item 232, and before forming the cap in item 234, the gate metal can be recessed in item 233.

Another alternative processing flow is shown in FIGS. 25A-31. Again, FIGS. 25A-25D repeat FIGS. 5A-5D to begin this alternative processing shown in FIGS. 25A-31 (again, a redundant illustration and discussion of such processing is not repeated here, for brevity, and only differences are presented). With the partially completed structure shown in FIGS. 25A-25D, this alternative processing expands the depth of the opening 142 by performing an additional and different material removal process (etching) that is selective to remove a portion (e.g., a corner) of the dummy oxide liner 132 and a portion (e.g., an end) of one of the second planar channel structures 124 of the second stack 102, to form an expanded opening 142A, as shown in FIGS. 26A-26D. Following this, the processing flow completely fills the opening 142A with the spacer material 170, as shown in FIGS. 27A-27D.

As previously-explained above, FIGS. 28A-28D show the removal of the first work function metal 150 from the second stack 102, and show how the spacer 170 protects the first stack 100 during such processing, as noted above. Similarly, FIGS. 29A-29D show the previously-explained processing through formation of the gate material 154 using steps described above. As can be seen in FIGS. 29A-29D, in this alternative processing, portions of the spacer 170 and dummy oxide liner 132 extend into a portion of the stack 102 in the second direction. Using similar processing discussed above, FIGS. 30A-30D illustrate the structure after additional processing including steps where the spacer 170 is partially recessed, then additional gate metal 154 is formed to fill in the recess, and before forming a cap 166, the gate metal 154 can be recessed.

Figure 31:
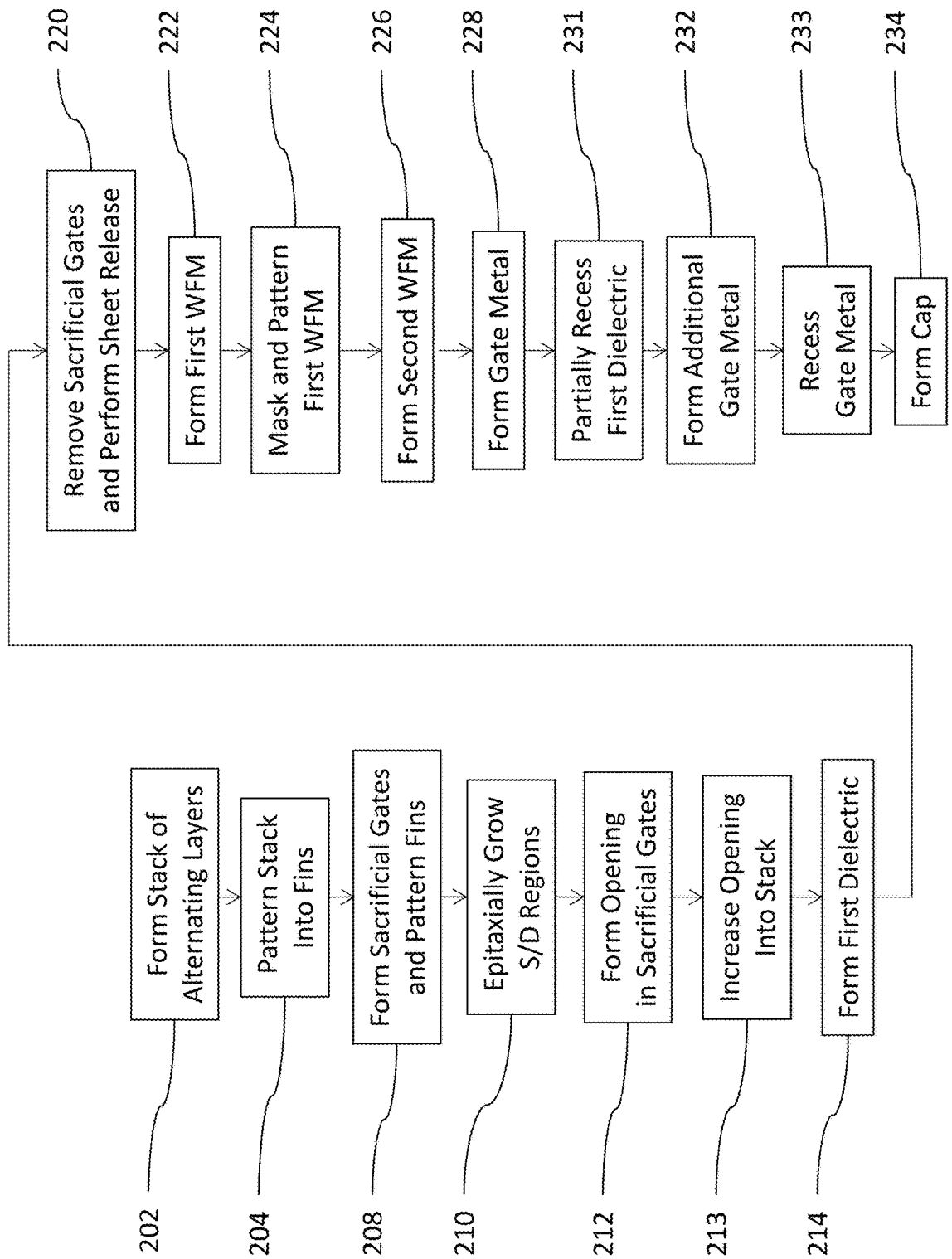
FIG. 31 is a flow diagram illustrating embodiments herein.
Figure 32B:
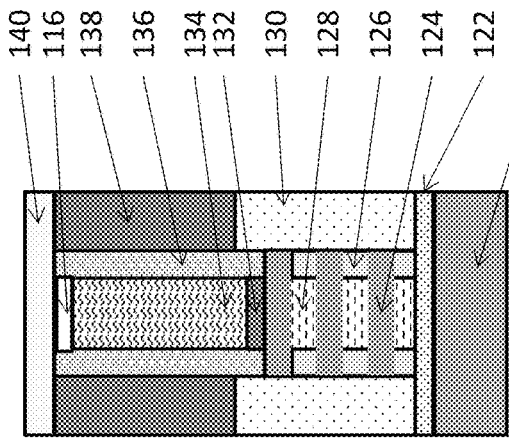
FIGS. 32A-32D are conceptual schematic diagrams of manufacturing stages of integrated circuit structures corresponding the views shown in FIG. 1A-1D, respectively.
Figure 32D:
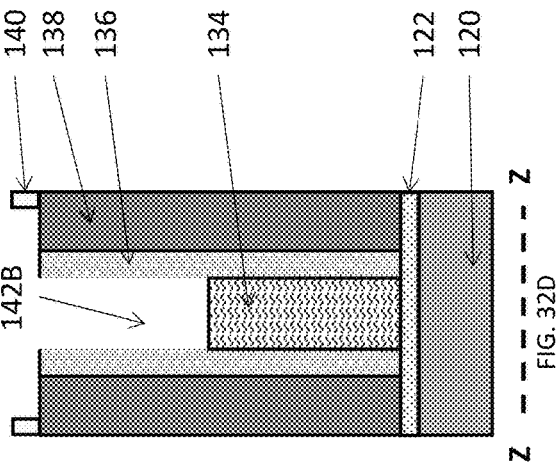
Figure 32A:
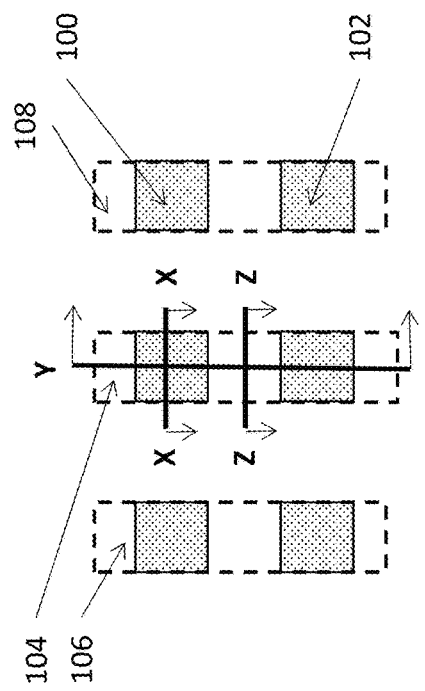
Figure 32C:
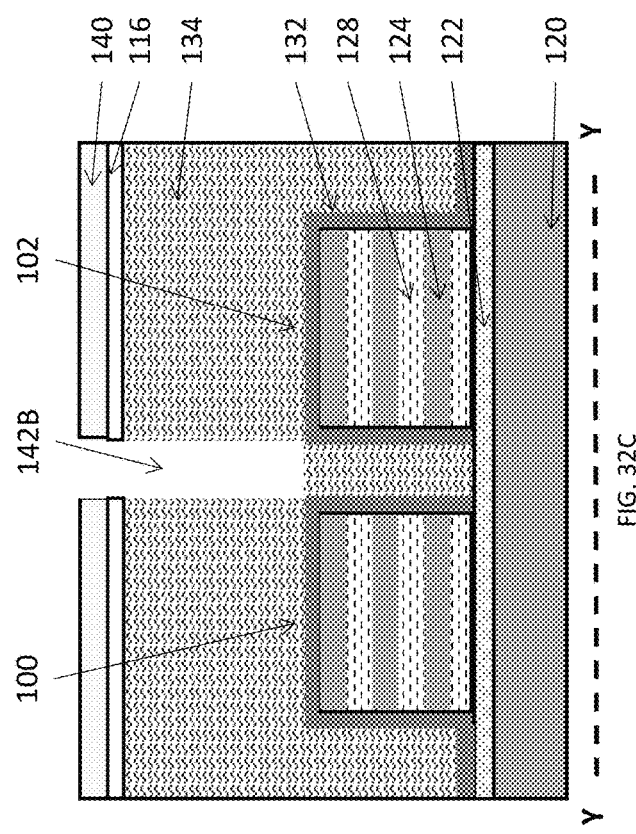
Figure 36B:
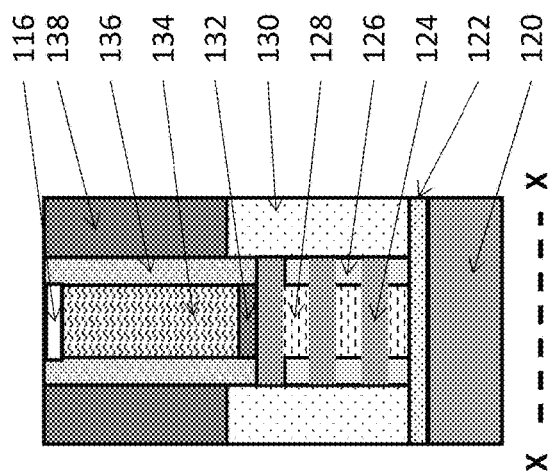
FIGS. 36A-36D are conceptual schematic diagrams of manufacturing stages of integrated circuit structures corresponding the views shown in FIG. 1A-1D, respectively.
Figure 36D:
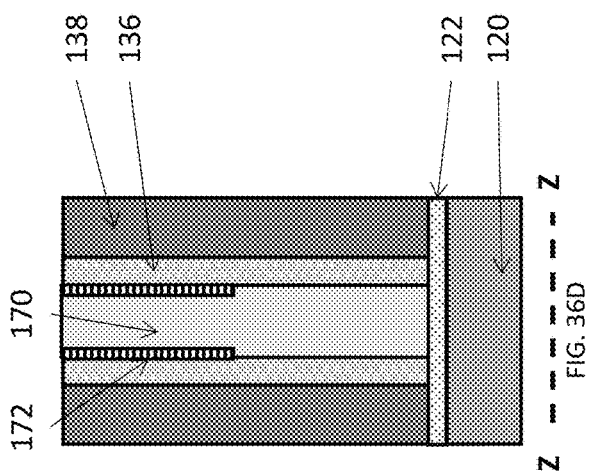
Figure 36A:
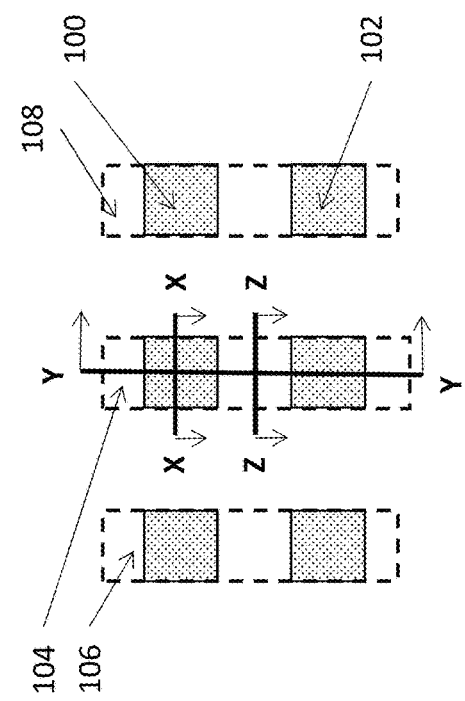
Figure 36C:
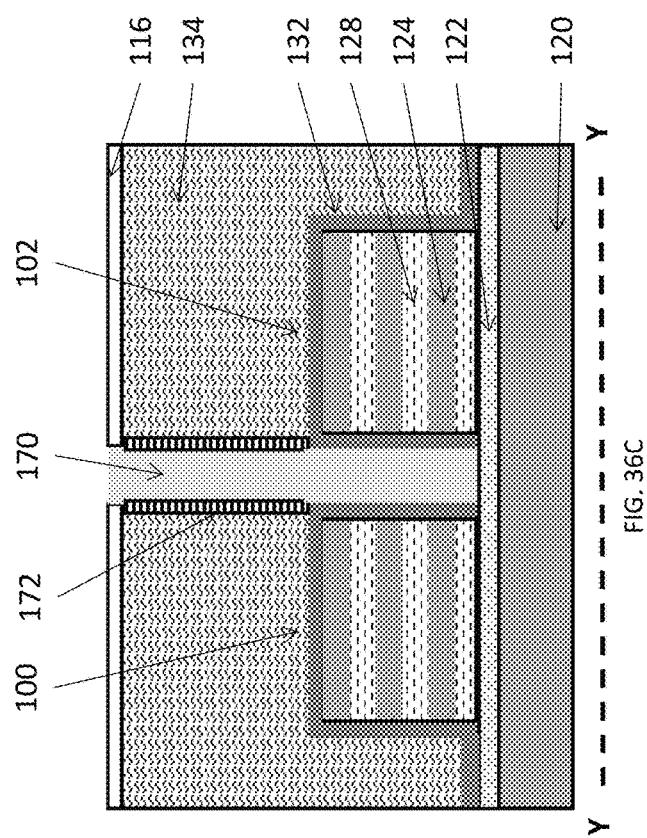

The flowchart in FIG. 31 shows this alternative processing. The flowchart in FIG. 31 is the same as the flowchart shown in FIG. 24 (a redundant illustration and discussion of such processing is not repeated here, for brevity) except for the addition of item 213. More specifically, in item 213, this processing expands the depth of the opening formed in item 212 by performing an additional and different material removal process (etching) that is selective to remove a portion of the spacer and a portion of one of the second planar channel structures of the second stack, to form an expanded opening.

A further alternative processing flow is shown in FIGS. 32A-40. Again, FIGS. 32A-32D repeat FIGS. 5A-5D to begin the alternative processing shown in FIGS. 32A-40 (again, a redundant illustration and discussion of such processing is not repeated here, for brevity). With the partially completed structure shown in FIGS. 32A-32D, this alternative processing forms a slightly more narrow and less deep opening, which is labeled 142B to distinguish such opening from the previous openings 142 and 142A. For example, the processing only etches the opening 142B down to a depth approximately equal to the height of the stacks 100, 102 from the substrate 120.

Next, as shown in FIGS. 33A-33D, sidewall spacers 172 are formed along the sidewalls of the opening 142B. Such spacers 172 can be formed through processing such as oxidization or nitridization of the sacrificial gate material 134, or deposition of a conformal material (e.g., nitride, oxide, etc.) followed by selective anisotropic etching to leave the material 172 on the sidewalls of the opening 142B. The material of the sidewall spacers 172 is chosen to be selectively removable relative to the sacrificial gate material 134.

Following this, the opening 142B is extended to form opening 142C using selective material removal that does not affect the sidewall spacers 172, as shown in FIGS. 34A-34D. As shown, the opening 142B is extended to reach the isolation layer 122 between the stacks 100, 102. Further, as can be seen from FIGS. 34A-34D, the sidewall spacers 172 divides the opening 142C into an upper portion (having the sidewall spacers 172) and a lower portion between the sidewall spacers 172 and the isolation layer 122. Further, the depth of the first opening 142B controls the length of the sidewall spacers 172, and controls the relative sizes of the upper and lower portions of the opening 142C; and this allows the upper and lower portions of the opening 142C to be any useful ratio (⅓, ½, ⅔, etc.).

During the processing shown in FIGS. 34A-34D, because the opening 142C is further narrowed by the spacers 172, some of the sacrificial gate material 134 can remain in the lower portion of the opening 142C. In view of this, additional selective isotropic etching can be performed to remove any sacrificial gate material 134 that remains in the lower portion of the opening 142C, as shown in FIGS. 35A-35D.

Using methods described above, in FIGS. 36A-36D, this alternative processing completely fills the opening 142C with the spacer material 170. Using the same steps discussed above, FIGS. 37A-37D show the removal of the first work function metal 150 from the second stack 102 and show how the spacer 170 and sidewall spacers 172 protect the first stack 100 during such processing. Similarly, FIGS. 38A-38D show the previously-explained processing through formation of the gate material 154. Using similar processing discussed above, FIGS. 39A-39D illustrate the structure after additional processing including steps where the spacer 170 is partially recessed, then additional gate metal 154 is formed to fill in the recess, and before forming a cap 166, the gate metal 154 can be recessed.

Figure 40:
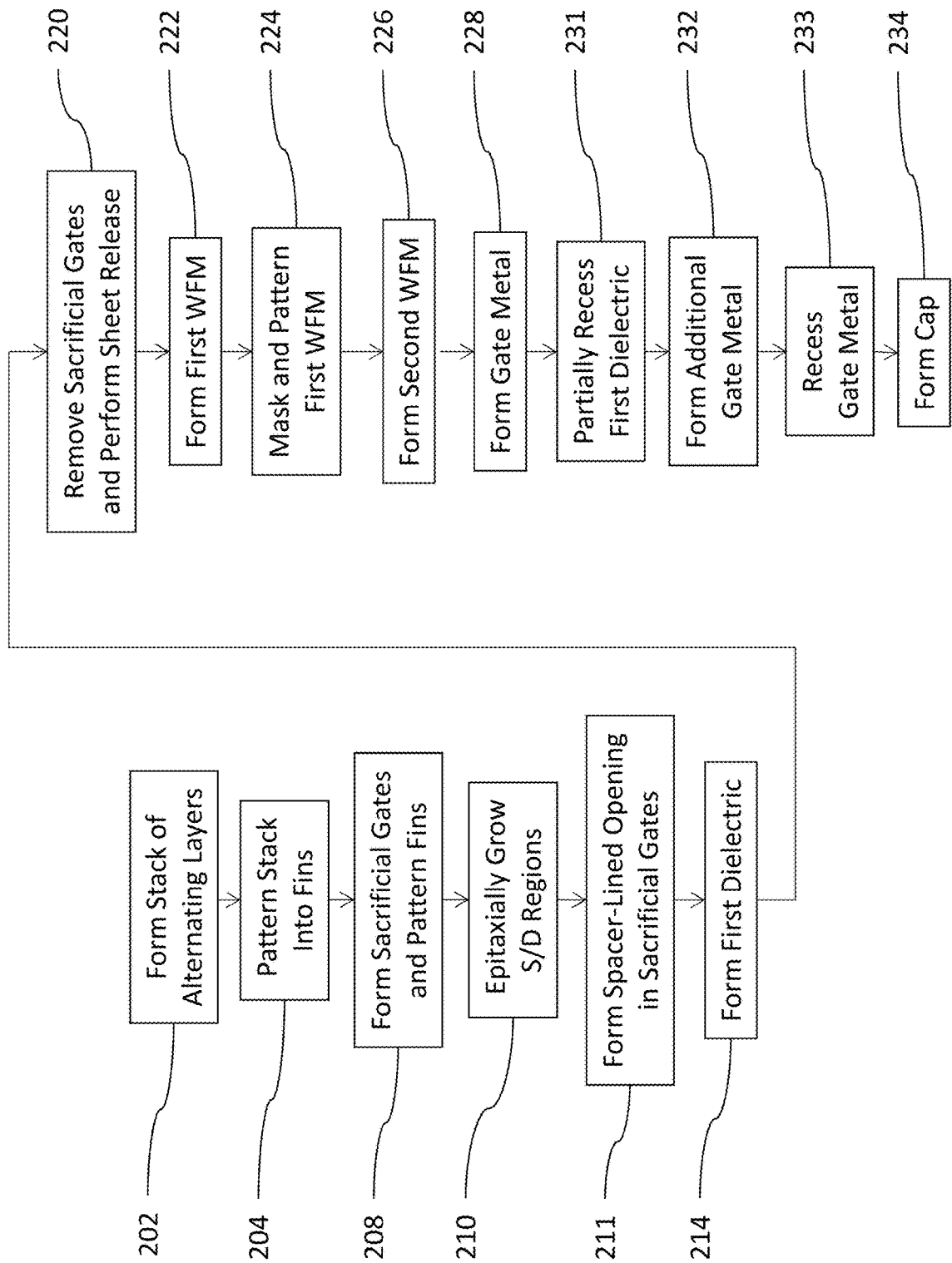
FIG. 40 is a flow diagram illustrating embodiments herein.

The flowchart in FIG. 40 shows this alternative processing. The flowchart in FIG. 40 is the same as the flowchart shown in FIG. 24 (a redundant illustration and discussion of such processing is not repeated here, for brevity) except for the removal of item 212 and the addition of item 211, where the opening that is formed in the sacrificial gate structure is a spacer-lined opening.

Thus, some methods herein form the openings over a portion of second stacks 102 such that the spacers 170 are formed over a portion of the second stacks 102 (FIG. 23C). These methods can alternatively form the openings into a portion of second stacks 102, such that the spacers 170 are formed to extend into a portion of the second stacks 102 (FIG. 30C). Thus, as shown for example in FIG. 30C, methods herein can form the openings into a portion of at least one of the channel structures 124 such that the spacers 170 are formed to extend into at least one of the channel structures 124. Also, as shown in FIG. 39C, the sidewall spacers 172 can be positioned on portions of the spacers 170 that extend further from the isolation layer 122 than do the stacks 100, 102.

As is understood by those ordinarily skilled in the art, there are various types of transistors, which have slight differences in how they are used in a circuit. For example, a bipolar transistor has terminals labeled base, collector, and emitter. A small current at the base terminal (that is, flowing between the base and the emitter) can control, or switch, a much larger current between the collector and emitter terminals. Another example is a field-effect transistor, which has terminals labeled gate, source, and drain. A voltage at the gate can control a current between source and drain. Within such transistors, a semiconductor (channel region) is positioned between the conductive source region and the similarly conductive drain (or conductive source/emitter regions), and when the semiconductor is in a conductive state, the semiconductor allows electrical current to flow between the source and drain, or collector and emitter. The gate is a conductive element that is electrically separated from the semiconductor by a "gate oxide" (which is an insulator); and current/voltage within the gate changes makes the channel region conductive, allowing electrical current to flow between the source and drain. Similarly, current flowing between the base and the emitter makes the semiconductor conductive, allowing current to flow between the collector and emitter.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The description of the present embodiments has been presented for purposes of illustration and description but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. A method comprising:
   patterning a multi-layer structure of alternating layers of a first material and a second material into first and second nanosheet stacks;
   forming a sacrificial gate on the first and second nanosheet stacks;
   forming an opening in the sacrificial gate;
   forming a spacer between the first nanosheet stack and the second nanosheet stack;
   removing the first material from between the layers of the second material of the first and second nanosheet stacks;
   forming a first work function metal surrounding the layers of the second material;
   covering the first work function metal surrounding the first nanosheet stack with a mask;
   removing the first work function metal from the second nanosheet stack while protecting the first work function metal surrounding the first nanosheet stack by the mask, and the spacer;
   forming a second work function metal surrounding the layers of the second material of the second nanosheet stack and on remaining portions of the first work function metal; and
   forming a gate material over the second work function metal,
   wherein the forming the spacer comprises:
      forming a first spacer in a lower portion of the opening; and
      forming a second spacer in an upper portion of the opening,
   wherein forming the spacer results in the second spacer extending into a portion of the second nanosheet stack.

2. The method according to claim 1,
   wherein the second spacer is removed before forming the gate material.

3. The method according to claim 1,
   wherein the forming the spacer comprises
      narrowing the upper portion of the opening before forming the second spacer in the upper portion of the opening, and
   wherein the spacer comprises the first spacer and the second spacer on top of the first spacer.

4. The method according to claim 1,
   wherein the forming the spacer comprises forming the second spacer over a portion of the second nanosheet stack.

5. The method according to claim 1, wherein the first spacer and the second spacer are the same material.

6. The method according to claim 1, wherein the removing the first work function metal from the second nanosheet stack comprises applying one of a wet etching process and a dry etching process.

7. A method comprising:
   patterning a multi-layer structure of alternating layers of a first material and a second material into first and second nanosheet stacks;
   forming a sacrificial gate on the first and second nanosheet stacks;
   forming an opening in the sacrificial gate;
   forming a spacer between the first nanosheet stack and the second nanosheet stack;
   removing the first material from between the layers of the second material of the first and second nanosheet stacks;
   forming a first work function metal surrounding the layers of the second material;
   covering the first work function metal surrounding the first nanosheet stack with a mask;
   removing the first work function metal from the second nanosheet stack while protecting the first work function metal surrounding the first nanosheet stack by the mask, and the spacer;
   forming a second work function metal surrounding the layers of the second material of the second nanosheet stack and on remaining portions of the first work function metal; and
   forming a gate material over the second work function metal,
   wherein the forming the spacer comprises forming the spacer at least one of: over the second nanosheet stack such that the spacer is present over a topmost surface of the second nanosheet stack after the formation of the spacer; and into the second nanosheet stack,
wherein the forming the spacer comprises:
forming a first spacer in a lower portion of the opening; and
forming a second spacer in an upper portion of the opening,
wherein the forming the spacer forms the second spacer to extend into the second material of the second nanosheet stack.

8. The method according to claim 7, wherein the second spacer is removed before forming the gate material.

9. The method according to claim 7, wherein the forming the spacer comprises narrowing the upper portion of the opening before forming the second spacer in the upper portion of the opening, and
wherein the spacer comprises the first spacer and the second spacer on top of the first spacer.

10. The method according to claim 7, wherein the forming the spacer comprises forming the second spacer over a portion of the second nanosheet stack.

11. The method according to claim 7, wherein the first spacer and the second spacer are the same material.

12. The method according to claim 7, wherein the removing the first work function metal from the second nanosheet stack comprises applying one of a wet etching process and a dry etching process.

13. A method of forming a device, comprising:
forming a first transistor on a substrate, wherein the first transistor is formed to comprise first source/drain structures on the substrate, first nanosheet channel structures formed to extend between the first source/drain structures, and first gate structures formed to surround each of the first nanosheet channel structures, wherein the first gate structures are formed to comprise a first work function metal;

forming a second transistor on the substrate adjacent the first transistor, wherein the second transistor is formed to comprise second source/drain structures on the substrate, second nanosheet channel structures formed to extend between the second source/drain structures, and second gate structures formed to surround the second nanosheet channel structures, wherein the second gate structures are formed to comprise a second work function metal different from the first work function metal; and forming a spacer of dielectric material between the first nanosheet channel structures and the second nanosheet channel structures, wherein the forming the spacer comprises forming the spacer to be positioned into a portion of at least one of the second nanosheet channel structures of the second transistor.

14. The method in claim 13, wherein the spacer is formed to be one of taller and the same height as the first nanosheet channel structures and the second nanosheet channel structures.

15. The method in claim 13, wherein the spacer and a plurality of liners comprise different materials.

* * * * *